(12) United States Patent
Hidaka

(10) Patent No.: US 7,633,827 B2
(45) Date of Patent: **\*Dec. 15, 2009**

(54) SEMICONDUCTOR MEMORY DEVICE, OPERATIONAL PROCESSING DEVICE AND STORAGE SYSTEM

(75) Inventor: Hideto Hidaka, Tokyo (JP)

(73) Assignee: Renesas Technology Corp., Chiyoda-Ku, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/125,733

(22) Filed: May 22, 2008

(65) Prior Publication Data

US 2008/0225622 A1 Sep. 18, 2008

Related U.S. Application Data

(63) Continuation of application No. 11/546,950, filed on Oct. 13, 2006, now Pat. No. 7,394,717.

(30) Foreign Application Priority Data

Oct. 13, 2005 (JP) ............................. 2005-299170

(51) Int. Cl.
 *G11C 11/00* (2006.01)
(52) U.S. Cl. ............................. 365/230.03; 365/230.06
(58) Field of Classification Search ............ 365/230.03, 365/230.06
See application file for complete search history.

(56) References Cited

U.S. PATENT DOCUMENTS

| 4,975,872 | A | * | 12/1990 | Zaiki ........................ 365/49.1 |
| 5,701,270 | A | * | 12/1997 | Mohan .................. 365/230.03 |
| 5,777,928 | A | * | 7/1998 | Vidwans et al. ........ 365/189.05 |
| 5,831,927 | A | * | 11/1998 | Casper et al. .......... 365/230.06 |
| 5,848,019 | A | * | 12/1998 | Matthews et al. ...... 365/230.06 |
| 7,068,563 | B2 | * | 6/2006 | Gratrex et al. ......... 365/230.06 |
| 7,173,874 | B2 | * | 2/2007 | Gratrex et al. ......... 365/230.05 |
| 7,283,418 | B2 | | 10/2007 | Cullum et al. |
| 2001/0009521 | A1 | | 7/2001 | Hidaka |
| 2003/0090937 | A1 | | 5/2003 | Chen |

FOREIGN PATENT DOCUMENTS

| JP | 2002-025246 A | 1/2002 |
| JP | 2003-104137 A | 4/2003 |

OTHER PUBLICATIONS

Office Action dated Nov. 2, 2007 issued by the U.S. Patent Office in parent U.S. Appl. No. 11/546,950.

* cited by examiner

*Primary Examiner*—Michael T Tran
(74) *Attorney, Agent, or Firm*—Buchanan Ingersoll & Rooney PC

(57) ABSTRACT

A thin film magnetic memory includes a size-variable Read Only Memory (ROM) region and a size-variable Random Access Memory (RAM) coupled to different ports for parallel access to the ports, respectively. A memory system allowing fast and efficient data transfer can be achieved.

2 Claims, 27 Drawing Sheets

FIG.23
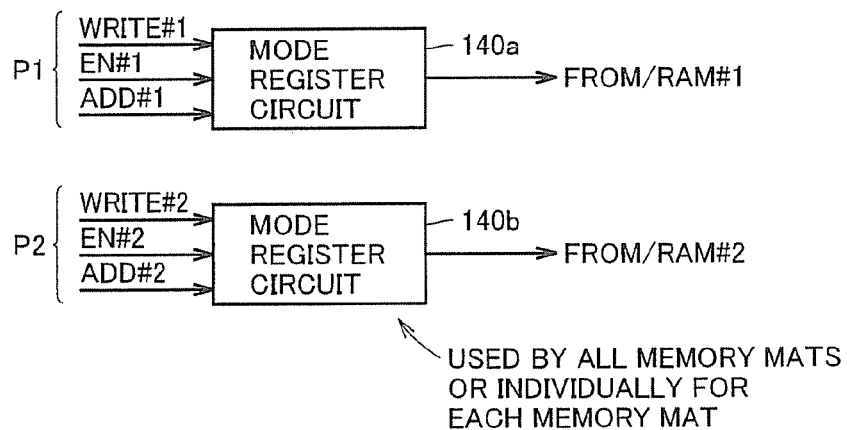
USED BY ALL MEMORY MATS OR INDIVIDUALLY FOR EACH MEMORY MAT
FIG.24
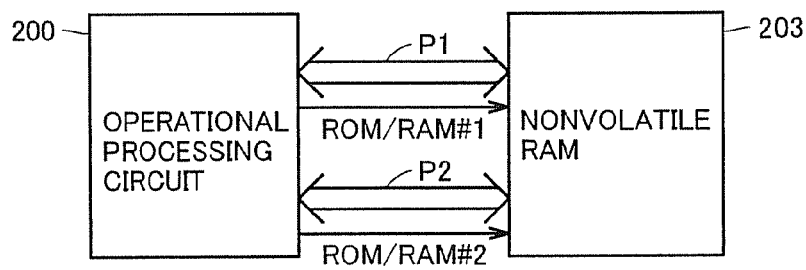
FIG.25
| CYCLE | #1 | #2 | #3 | #4 | #5 | #6 |
|---|---|---|---|---|---|---|
| PORT P1 | ROM (READ) | ROM (READ) | ROM (READ) | NOP | RAM (READ/WRITE) | NOP |
| PORT P2 | RAM (READ/WRITE) | NOP | ROM (READ) | RAM (READ/WRITE) | RAM (READ/WRITE) | NOP |
FIG.26
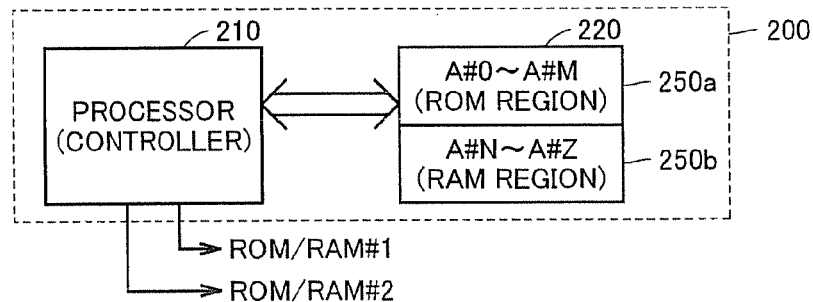

FIG.35
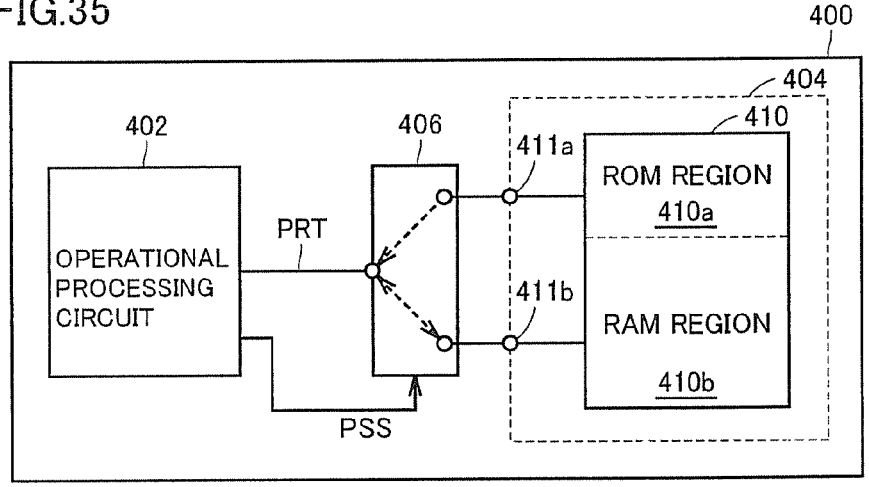
FIG.36
| CYCLE | #1 | #2 | #3 | #4 | #5 | #6 |
|---|---|---|---|---|---|---|
| PORT | ROM (READ) | RAM (READ/WRITE) | ROM (READ) | NOP | RAM (READ/WRITE) | RAM (READ/WRITE) |
FIG.37
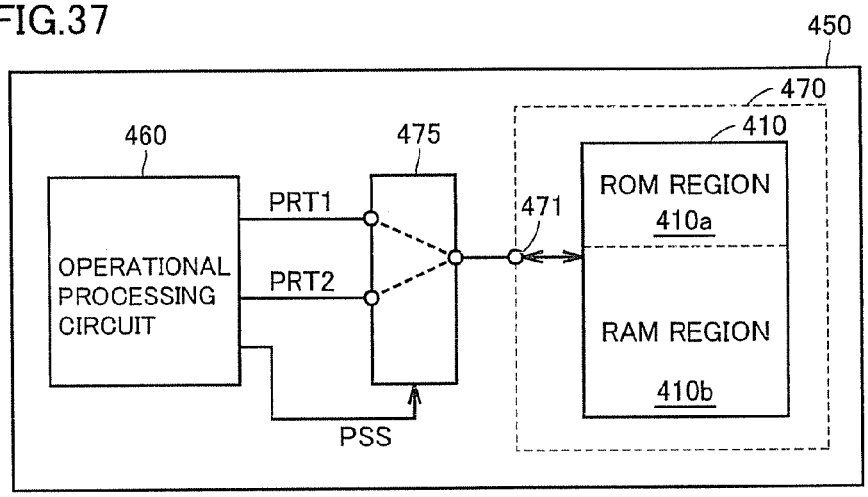

FIG.38
| CYCLE | #1 | #2 | #3 | #4 | #5 | #6 |
|---|---|---|---|---|---|---|
| PRT1 | ROM (READ) | ROM (READ) | ROM (READ) | NOP | RAM (READ/WRITE) | NOP |
| PRT2 | RAM (READ/WRITE) | NOP | ROM (READ) | RAM (READ/WRITE) | RAM (READ/WRITE) | NOP |
| MEMORY PORT 471 | ROM : RAM | ROM : NOP | ROM : ROM | NOP : RAM | RAM : RAM | NOP : NOP |
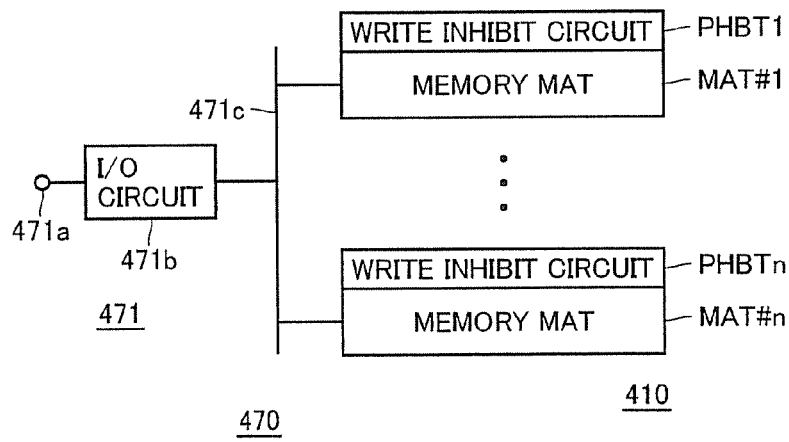
FIG.39
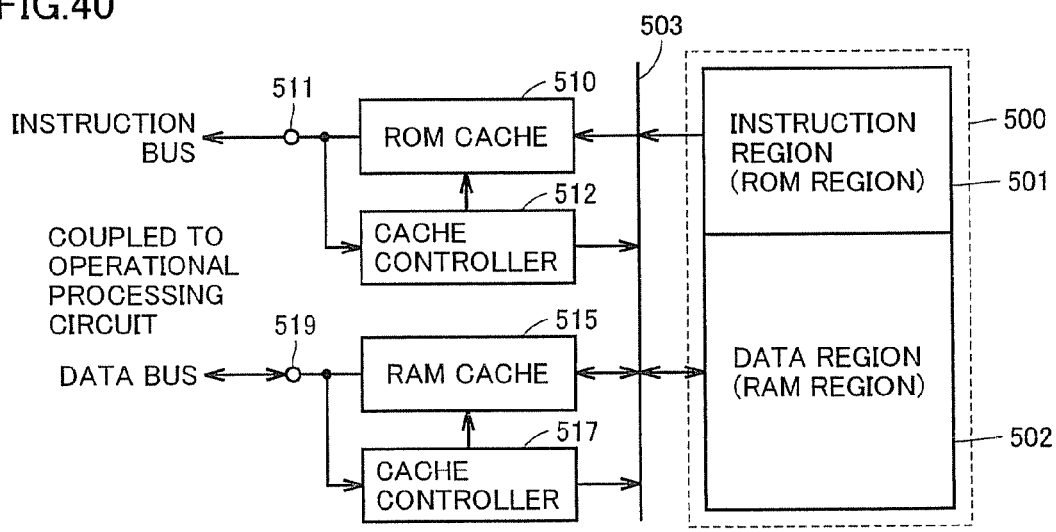
FIG.40

SEMICONDUCTOR MEMORY DEVICE, OPERATIONAL PROCESSING DEVICE AND STORAGE SYSTEM

CROSS-REFERENCE TO RELATED APPLICATIONS

This application is a continuation of application Ser. No. 11/546,950, filed Oct. 13, 2006, now U.S. Pat. No. 7,394,717, which claims the priority of Japanese Patent Application No. 2005-299170 (P), filed on Oct. 13, 2005, in the Japanese Patent Office, the disclosures of which are incorporated herein in their entireties by reference.

BACKGROUND OF THE INVENTION

1. Field of the Invention

The present invention relates to a semiconductor memory device, an operational device and a memory system, and particularly to a memory device and memory system that can implement a processing system capable of fast operation. More particularly, the invention relates to a memory device, a processing system and a memory system using a Magnetic Random Access Memory (MRAM) in which an element such as a TMR (Tunneling MagnetoResistance) element or a MTJ (Magnetic Tunneling Junction) element utilizing a magnetoresistance effect, are employed for a memory element.

2. Description of the Background Art

In a processing system using a processor such as a microprocessor or a microcontroller, a ROM (Read Only Memory) and a RAM (Random Access Memory) are employed as external memory devices. The ROM is used for storing fixed information such as control data and processing/control programs. The RAM is used as a working area of the processor or the like, and is used for temporarily storing an application program and application data as well as processed data and preprocessed data.

By storing the fixed information in ROM, basic software that may impede a normal operation of the system if destroyed, such as a boot program for starting up a system, BIOS (Basic I/O System) that controls coupling between OS (operating system) as well as an application program and peripheral devices, and basic control data such as identification information are stored.

For the RAM, the storage capacity is set according to an application of processing, for storing a relatively large quantity of information. By utilizing accessibility of the RAM that is faster than that of a disk unit and others, fast data transfer is performed.

For the ROM and RAM, memories of different types may be used. For example, when a mask ROM or a nonvolatile semiconductor memory device (flash memory) that can allow electrical programming and flash erasure is used for the ROM, if storage capacities of such memories is optimized, depending on individual purposes, in system designing, it is required to design memory device systems for each different processing application, resulting in an increased cost in the design, development, production and distribution.

For overcoming the problem of the above system architecture, FeRAM (Ferromagnetic RAM) or a magnetic semiconductor memory (MRAM: Magnetic Random Access Memory) can be used as an external memory device, as disclosed in Reference 1 (Japanese Patent Laying-Open No. 2003-104137) and Reference 2 (Japanese Patent Laying-Open No. 2002-025246).

In the construction disclosed in Reference 1, a plurality of MRAM chips are arranged in parallel, storage regions of these MRAM chips are divided into a RAM region and a ROM region, and writing to the ROM region is inhibited.

Reference 1 uses the MRAM for the ROM or RAM, to set the storage capacities (address spaces) of the RAM and ROM regions flexibly according to the application, and intends to simplify a memory architecture and a memory control circuit to reduce a cost and a assembling space.

According to the construction disclosed in Reference 2, the multi-bank FeRAM or MRAM is used, and each bank is allocated to the ROM or RAM region. A write inhibit bit is set in the bank used as the ROM region for inhibiting the write access to this bank.

Reference 2 likewise intends to achieve a simple memory system allowing fast access by using the FeRAM or MRAM for the ROM and RAM.

In the constructions disclosed in References 1 and 2, FeRAM or MRAM is used for ROM or RAM. As compared with the flash memory, FeRAM and MRAM have such features that writing requires a short time, a data holding time is long and the number of rewriting is greatly large.

In References 1 and 2, however, data and program instructions are externally transferred with an outside of the memory device via a common data bus. Thus, information ("information" is used for referring to both data and a program instruction) stored in the ROM and RAM regions is transferred via the common bus or via a common input/output circuit.

Accordingly, an operational processing unit accessing this memory device cannot access in parallel the ROM and RAM regions, and instruction fetch cannot be performed in the same cycle as processing data transfer. This instruction fetch can be performed only after completion of the data access, so that a wait cycle occurs in an external operational processing unit, and an instruction execution speed lowers.

References 1 and 2 intend to simplify the construction of the memory system by replacing the ROM and RAM different in types and operation speeds with FeRAM or MRAM of one type, but no consideration is given to a construction for reducing a wait cycle of the external operational processing unit to improve processing efficiency of an entire processing system.

SUMMARY OF THE INVENTION

An object of the invention is to provide a semiconductor memory device that can achieve fast and efficient operational processing as well as an operational processing device and a memory system using such semiconductor memory device.

A semiconductor memory device according to the invention includes a plurality of memory regions each including a plurality of memory cells each nonvolatilely storing information, and storing information of different attributes, respectively; a plurality of buses arranged separately from each other and corresponding to the plurality of memory regions, and a plurality of port connection control circuits arranged for the plurality of memory regions, each for selectively coupling a corresponding memory region to the plurality of buses.

A memory system according to the invention includes first and second memories for storing information of different attributes, respectively; a third memory of a variable storage capacity including first and second memory regions arranged corresponding to the first and second memories, respectively; and a transfer control circuit for controlling information transfer between the first and second memories and the first and second memory regions. The first and second memory regions cache the information of the first and second memories, respectively.

A first operational processing device according to the invention includes the semiconductor memory device according to the invention; and an operational processing unit arranged outside the semiconductor memory device according to the invention, and transferring information to and from the plurality of buses.

A second operational processing device according to the invention includes the semiconductor memory device according to the invention; and an operational processing circuit using storage information of the memory system to execute processing.

In the semiconductor memory device according to the invention, the plurality of memory regions store the information of different attributes, respectively, and the information is transferred via the buses that are selectively coupled. Therefore, the external operational processing device can access in parallel the information of different attributes such as processing data and an operational processing instruction, and can process in parallel the information of different attributes. Therefore, the processing efficiency of the external processing device can be improved.

The buses may be fixedly coupled to different ports, and the connection between the memory regions and the buses may be established according to port designating information, whereby the information of the same attribute can be transferred in parallel from each respective port, and the processing efficiency of the operational processing system can be improved.

In the memory system according to the invention, the first and second memory regions of variable sizes (variable storage capacities) are used as caches for the first and second memories, respectively, and the fast memory system can be implemented even when the first and second memories are low-speed memories.

The first and second memory regions have variable sizes, and can have their capacities optimized according to the capacities of the first and second memories. Therefore, it is possible to provide a cache system that can use the same construction for various purposes, so that the design efficiency of the system can be improved, and the manufacturing cost thereof can be reduced.

In the first operational processing unit according to the invention, the information is transferred between the plurality of data buses and an external operational processing unit, and the information of different attributes can be transferred by accessing in parallel through the different buses, so that the instruction wait cycles can be reduced, and the operational processing system capable of fast processing can be implemented.

In the second operational processing unit of the invention, the processing is executed, using the stored information in the first and second memory regions of the memory system, and the operational processing unit capable of fast processing can be implemented.

The capacities of the first and second memory regions can be readily changed according to the applications, and the operational processing unit that can flexibly accommodate for different purposes can be implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 23 shows an example of a construction of a port attribute setting signal generating portion in a second modification of the fourth embodiment of the invention.

FIG. 24 schematically shows a construction of a port attribute designating signal generating portion in a fifth embodiment of the invention.

FIG. 25 represents an example of a data access sequence of the construction shown in FIG. 24.

FIG. 26 shows a construction of a port attribute designating signal generating portion of a modification of the fifth embodiment of the invention.

FIG. 35 schematically shows a construction of a main portion of an operational processing unit according to an eighth embodiment of the invention.

FIG. 36 represents an example of an operation sequence of the operational processing unit shown in FIG. 35.

FIG. 37 schematically shows a construction of an operational processing unit according to a ninth embodiment of the invention.

FIG. 38 represents an example of an operation sequence of the operational processing device shown in FIG. 37.

FIG. 39 schematically shows a construction of a modification of the ninth embodiment of the invention.

FIG. 40 schematically shows a construction of a memory system according to a tenth embodiment of the invention.

DESCRIPTION OF THE PREFERRED EMBODIMENTS

First Embodiment

Figure 1:
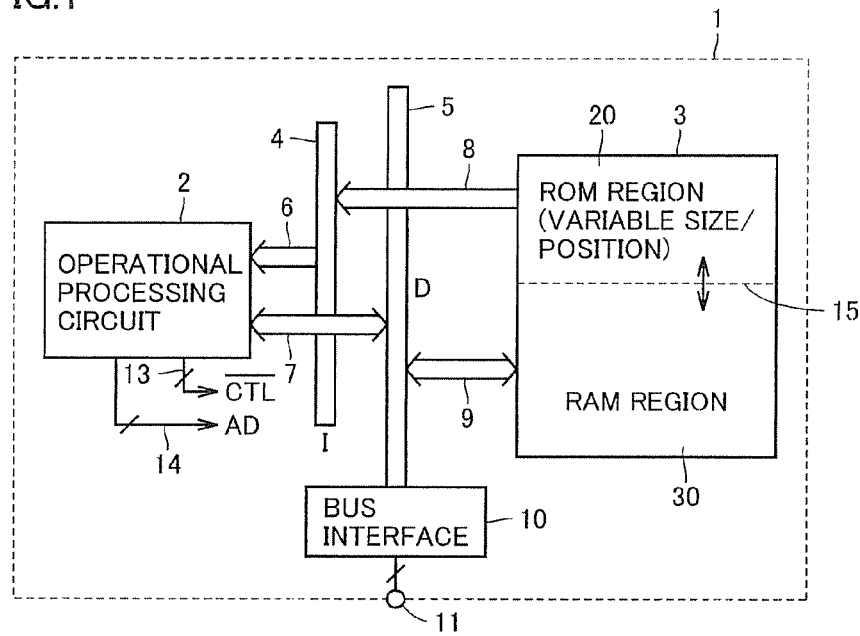
FIG. 1 schematically shows a whole construction of a semiconductor integrated circuit device according to a first embodiment of the invention.

FIG. 1 schematically shows a whole construction of an operational processing system according to a first embodiment of the invention.

In FIG. 1, an operational processing system 1 according to the first embodiment of the invention includes an operational processing circuit 2 for executing operational processing/control processing according to received programs, and a semiconductor memory device 3 for storing program instructions and processing data for operational processing circuit 2.

Semiconductor memory device 3 is formed of a nonvolatile RAM such as an MRAM, and includes an ROM region 20 having storage information inhibited from being rewritten, and an RAM region 30 having stored information permitted to be rewritten. A boundary region (boundary address) 15 between ROM and RAM regions 20 and 30 is variable. The size and the position in the address space of ROM region 20 can be changed in the address space of nonvolatile RAM 3, and the physical position and storage capacity thereof can also be changed in nonvolatile RAM 3.

ROM region 20 stores fixed information such as programs instructions designating a processing to be executed in operational processing circuit 2, boot programs used for boot-up of the system and initialization when initializing semiconductor integrated circuit device 1, BIOS instructions and control data. RAM region 30 stores information of which rewriting is allowed, and stores, e.g., processing data, application programs and data that is being processed by operational processing circuit 2.

Nonvolatile RAM 3 is an FeRAM or MRAM, has a data holding time of 10 years or more, 1015 or more data rewritable times and a data write/read time of 10 ns. FeRAM and MRAM store the data according to the polarization direction of a ferroelectric and magnetization direction of a ferromagnetic layer, respectively, and can nonvolatilely store information. Accordingly, this nonvolatile RAM has both the advantageous features of the nonvolatile ROM such as a mask ROM nonvolatilely storing the data and the advantageous features of the SRAM (Static Random Access Memory) that allows fast random access but requires supply of a power for data retention.

Nonvolatile RAM 3 is used and the internal memory region thereof is divided into ROM and RAM regions 20 and 30 for storing information items of different attributes (i.e., an information item of which rewriting is to be rejected, and information of which rewriting is allowed), respectively. Thus, the processing system can be configured by using only one type of memory, and the manufacturing cost can be reduced. The address positions and the storage capacities of ROM and RAM regions 20 and 30 can be appropriately set according to intended uses or purposes so that the construction of the memory system can be simple, and the design and manufacturing costs can be made low.

Operational processing system 1 further includes an instruction bus 4 for transferring an instruction I, a data bus 5 for transferring data D and a bus interface 10 for interfacing between data bus 5 and an external peripheral device of integrated circuit device 1. This bus interface 10 is coupled to an external I/O terminal 11.

Nonvolatile RAM 3 transfers the storage information to instruction bus 4 via an ROM port 8, and bidirectionally transfers information with data bus 5 via an RAM port 9.

Operational processing circuit 2 includes an instruction port 6 coupled to instruction bus 4, and a data port 7 coupled to data bus 5. Operational processing circuit 2 is coupled to a control bus 13 and an address bus 14 that transmit a control signal CTL and an address signal AD with nonvolatile RAM 3, respectively. Although these control bus 13 and address bus 14 are coupled to nonvolatile RAM, FIG. 1 does not show their connection paths for the sake of simplicity. A set of these control and address buses 13 and 14 is provided for each of ROM and RAM ports 8 and 9.

In the following description, the "port" includes input/output function block having a function of transferring the information with a peripheral device, and also includes transfer paths of the information. Therefore, bus interface 10 can have a plurality of ports that can be coupled to different peripheral devices via external I/O terminals 11.

Nonvolatile RAM 3 is formed of a module having a plurality of MRAM chips, for example, and the MRAM chips or arrays of the module are allocated to ROM and RAM regions 20 and 30. When nonvolatile RAM 3 is formed on a single semiconductor chip, the memory array in nonvolatile RAM 3 is selectively divided into ROM and RAM regions 20 and 30. Within a range of the storage capacity of nonvolatile RAM 3, the capacities of ROM and RAM regions 20 and 30 can be changed for achieving combinations of various capacities, and nonvolatile RAM 3 can be configured for various applications. Accordingly, it is not necessary to arrange a ROM and a RAM each having a fixed storage capacity depending on an application, and a nonvolatile RAM of one type can be used for various applications, resulting in an improved productivity, facilitated product management and a reduced distribution cost.

ROM region 20 is coupled to instruction bus 4 via ROM port 8, and RAM region 30 is coupled to data bus 5 via RAM port 9. Thereby, operational processing circuit 2 can access, in parallel, ROM and RAM regions 20 and 30 via instruction port 6 and data port 7, respectively, and can perform the data transfer without waiting for instruction fetch so that the wait cycles of operational processing circuit 2 can be reduced, and the processing efficiency can be improved.

Operational processing circuit 2 and nonvolatile RAM 3 may be arranged in the semiconductor integrated circuit device, to be formed on the same chip. Alternatively, operational processing circuit 2 and nonvolatile RAM 3 may be discrete devices arranged on the same board. It is merely required that, according to the construction of operational processing system 1, the address region of nonvolatile RAM 3 is divided into ROM and RAM regions 20 and 30 each having a variable capacity.

Figure 2:
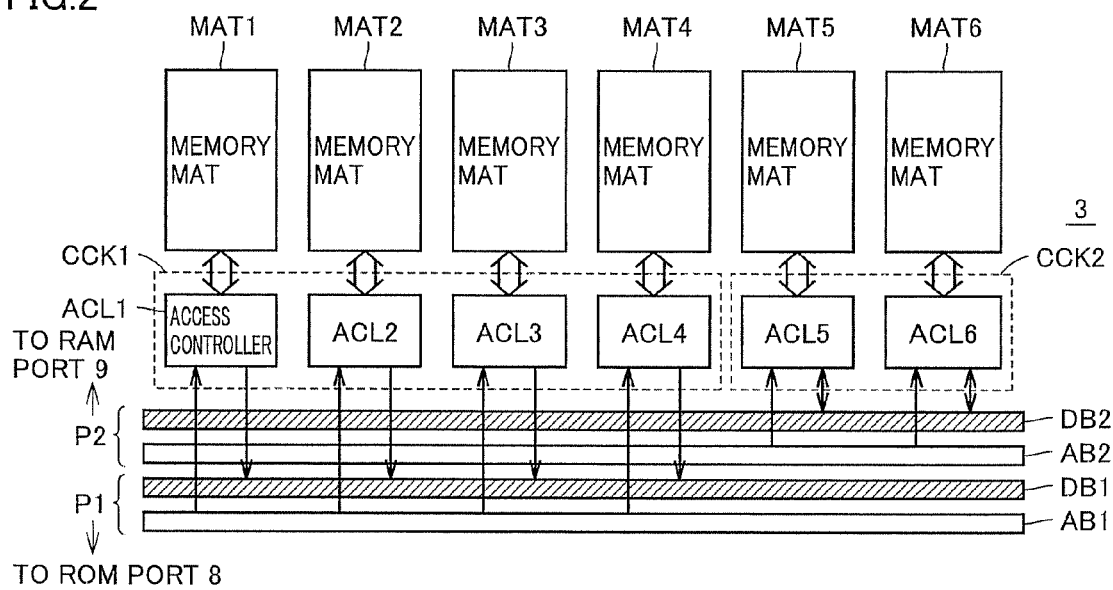
FIG. 2 schematically shows a construction of a nonvolatile RAM shown in FIG. 1.

FIG. 2 schematically shows an example of a construction of the nonvolatile RAM shown in FIG. 1. Referring to FIG. 2, nonvolatile RAM 3 includes memory mats MAT1-MAT6 each including a plurality of nonvolatile memory cells, address buses AB1 and AB2 shared among memory mats MAT1-MAT6, and data buses DB1 and DB2 shared among memory mats MAT1-MAT6.

Data bus DB1 and address bus AB1 form a part of a port P1, which is coupled to ROM port 8. Address bus AB2 and data bus DB2 form a part of a port P2, which is coupled to RAM port 9. Therefore, read information (instruction) is transferred to data bus DB1, and read data and write data are both transferred via data bus DB2. Ports 1 and 2 include input/output (buffer) circuits, which are not shown in FIG. 2 for the sake of simplicity.

Corresponding to memory mats MAT1-MAT6, there are arranged access controllers ACL1-ACL6 that set connection to the buses of the corresponding memory mats, and control the read/write, respectively. In the arrangement shown in FIG. 2, access controllers ACL1-ACL4 couple corresponding memory mats MAT1-MAT4 to address bus AB1 and data bus DB1, and access controllers ACL5 and ACL6 couple corresponding memory mats MAT5 and MAT6 to data bus DB2. Therefore, memory mats MAT1-MAT4 are used as the ROM region, and memory mats MAT5 and MT6 are used as the RAM region. Access controller ACL1-ACL4 form a sub-array connection control circuit CCK1, and access controllers ACL5 and ACL6 form a sub-array connection control circuit CCK2. By selecting the connection paths of these memory mats MAT1-MAT6, the storage capacities of the ROM and RAM regions can be changed, and thereby the constructions of the sub-array connection control circuits are changed.

When nonvolatile RAM 3 has a memory module construction, memory mats MAT1-MAT6 are formed of discrete chips, respectively, and memory mat MATi and corresponding access controller ACLi correspond to a discrete element formed of one semiconductor chip. When nonvolatile RAM 3 corresponds to a discrete device formed of one semiconductor chip (i.e., when the operational processing system is a semiconductor integrated circuit device), memory mats MAT1-MAT6 are formed of memory arrays, array blocks in one memory array or banks. In the following description, the term of "memory mat" represents a memory region occupying a certain space in the address space (memory space). Accordingly, the memory mat may be implemented by any one of a single discrete device, a memory bank in a discrete device and a divided array block (sub array) in one memory array.

Figure 3:
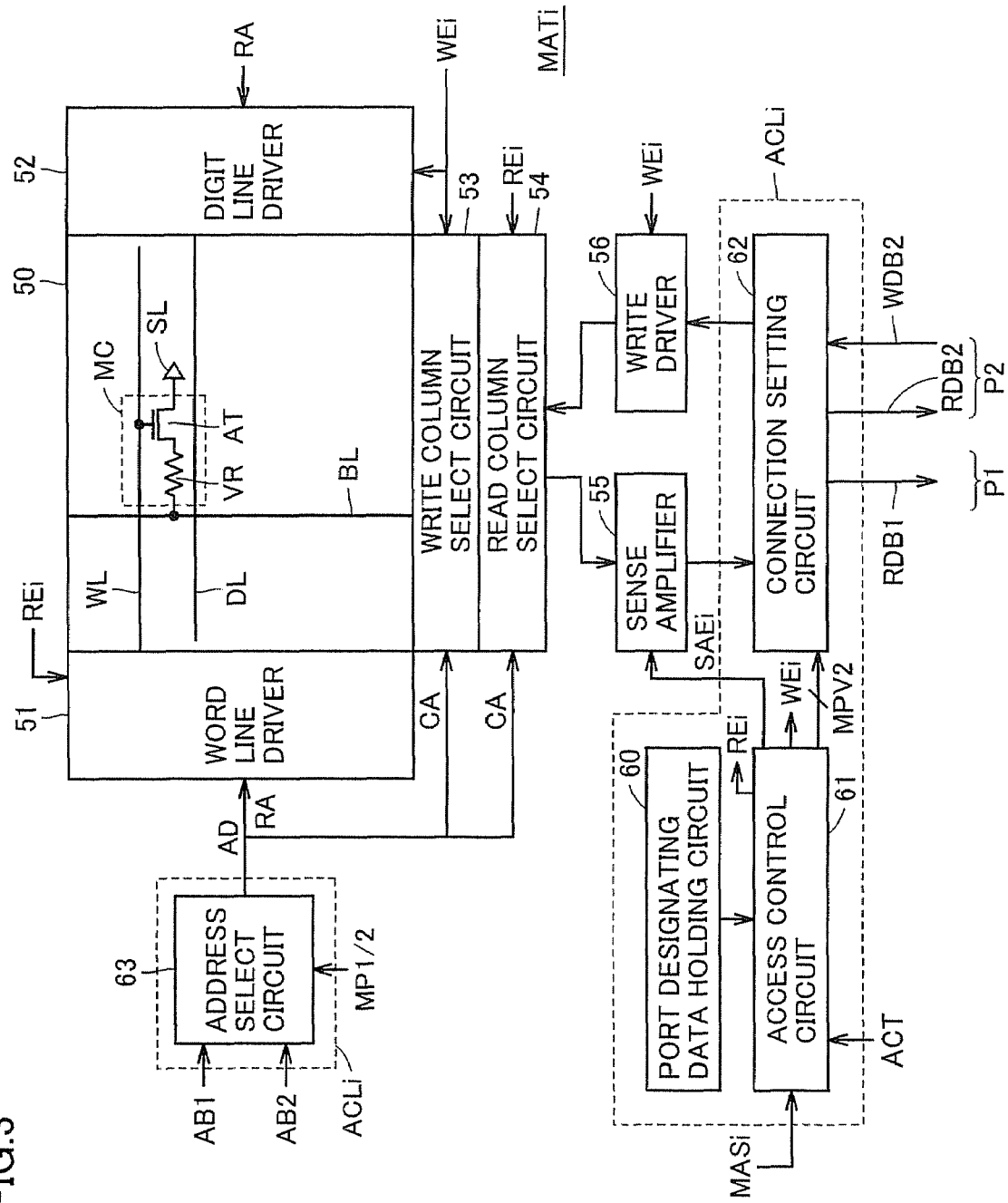
FIG. 3 schematically shows constructions of a memory mat and an access controller shown in FIG. 2.

FIG. 3 schematically shows a construction of the memory mat and the corresponding access controller shown in FIG. 2. In the example shown in FIG. 3, memory mat MATi and access controller ACLi are arranged on one semiconductor chip, and memory mat MATi is formed of one bank.

Referring to FIG. 3, memory mat MATi includes a memory cell array 50 having memory cells MC arranged in rows and columns. Each memory cell MC includes a variable resistance element VR formed of, e.g., a Tunneling MagnetoResistance element (TMR element), and an access transistor AT that selectively couples variable resistance element VR to a source line SL according to a signal on a word line WL. Variable resistance element VR may be formed of a ferroelectric capacitor.

In memory cell array 50, digit lines DL are arranged parallel to word lines WL and corresponding to the memory cell rows, respectively. Bit lines BL are arranged corresponding to columns of memory cells MC, respectively. Bit line BL is connected to variable resistance elements VR of memory cells MC in a corresponding column. Digit line DL is electrically isolated from variable resistance element VR. Variable resistance element VR has a construction in which a fixed layer having a fixed magnetization direction and a free layer having a magnetization direction depending on storage data are layered with a tunneling barrier layer laid in between. A magnetic field induced by a current flowing through the digit line and a magnetic field induced by a current flowing through bit line BL form a combined magnetic field, which sets the magnetization direction of the free layer of variable resistance element VR to one of the directions parallel and antiparallel to the magnetization direction of the fixed layer. By the magneto-resistance effect of the TMR element forming variable resistance element VR, the variable resistance element is set to either the high-resistance state or the low-resistance state, and the data is stored according to the magnitude (large and small) of the resistance value.

Memory mat MATi further includes a word line driver 51 that drives word line WL corresponding to an addressed row to the selected state in a data read operation according to a row address signal RA included in address signal AD and a read instructing signal REi, a digit line driver 52 that supplies a current through digit line DL corresponding to the addressed row in a data write operation according to row address signal RA and a write instructing signal WEi, a write column select circuit 53 that selects bit line BL corresponding to an addressed column in the data write operation according to write instructing signal WEi and a column address signal CA, a read column select circuit 54 that selects bit line BL in the addressed column in the data read operation according to read instructing signal REi and column address signal CA, a sense amplifier 55 that is enabled according to a sense amplifier activating signal SAEi to sense the current flowing through the bit line selected by read column select circuit 54 and to read internally the data of the selected memory cell, and a write driver 56 that is enabled according to write instructing signal WEi to supplies the current through bit line BL selected by write column select circuit 53 according to the write data in the data write operation.

When memory mat MATi is selected, write instructing signal WEi is activated in the write mode and read instructing signal REi and sense amplifier activating signal SAEi are activated in the read mode.

When the variable resistance element is a magneto-resistance effect element, the write current flows bidirectionally through a bit line according to the write data in the data write operation, and a constant current is supplied to the internal read data line in the data read operation. Sense amplifier 55 senses the current flowing through a selected memory cell. Therefore, the internal data write line and the internal read line are generally provided separately and individually.

Access controller ACLi includes a port designating data holding circuit 60 that holds port designating data designating a port to be coupled to corresponding memory mat MATi, an access control circuit 61 that produces write instructing signal WEi, sense amplifier activating signal SAEi and a port connection control signal MP1/2 according to the data held in port designating data holding circuit 60, a mat select signal MASi and a memory cell select operation activating signal (access instructing signal) ACT, a connection setting circuit 62 that establishes a connection path of the internal data bus to sense amplifier 55 and write driver 56 according to port select signal MP1/2 applied from access control circuit 61, and an address bus select circuit 63 that selects one of address buses AB1 and AB2 according to port select signal MP1/2 and produces internal address AD.

Port designating data holding circuit 60 stores data designating the port, i.e., ROM port or RAM port to be connected to memory mat MATi, or designating the region, i.e., ROM region or RAM region to which memory mat MATi is allocated. When access instructing signal ACT is active, access control circuit 61 activates write instructing signal WEi or read instructing signal REi together with sense amplifier activating signal SAEi according to connection control signal MP1/2 and the externally applied operation mode instructing signal when mat select signal MASi is active.

Connection setting circuit 62 establishes the connection path of sense amplifier 55 and write driver 56 according to connection control signals MP1/2 applied from access control circuit 61. In FIG. 3, a read data bus RDB1 is arranged for port P1, and a read data bus RDB2 and a write data bus WDB2 are arranged for port P2. Port P1 does not include a write data bus, and port P1 does not transfer the write data.

Address select circuit 63 takes in the row and column address signals on one of address buses AB1 and AB2 according to connection control signals MP1/2 applied from access control circuit 61, and produces internal address signal AD (row and column address signals RA and CA).

Figure 4:
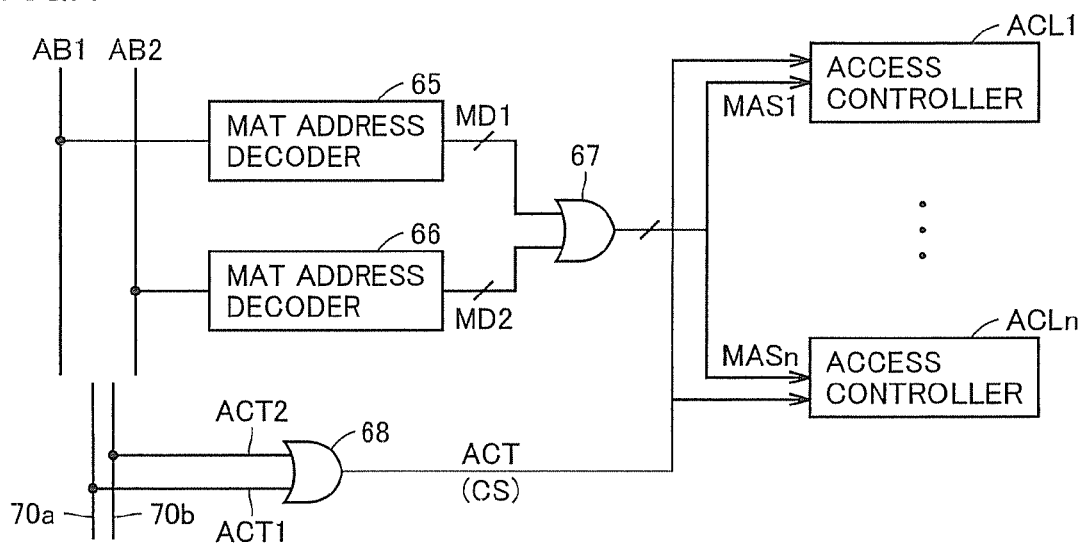
FIG. 4 shows an example of a construction of a portion for generating a memory mat select signal shown in FIG. 3.

FIG. 4 schematically shows an example of a construction of a portion for generating a memory mat select signal MASi shown in FIG. 3. In FIG. 4, the memory mat select signal generating portion includes a mat address decoder 65 that decodes the mat address signal on address bus AB1 to produce a first mat address decode signal MD1, a mat address decoder 66 that decodes the mat address signal on address bus AB2 to produce a second mat address decode signal MD2, and an OR circuit 67 that takes logical sum between mat address decode signals MD1 and MD2 from mat address decoders 65 and 66, to produces mat select signals MAS1-MASn for the respective memory mats. OR circuit 67 supplies mat select signals MAS1-MASn to access controllers ACL1-ACLn arranged corresponding to the respective memory mats, where n represents the number of memory mats.

The mat address signal designates one memory mat. In the access operation, therefore, each of the mat address signals on address buses AB1 and AB2 designates one memory mat, and thus the access is made with one memory mat designated for each port (i.e., selection of the memory cell as well as internal read or write of data/information are performed).

Each of access controllers ACL1-ACLn determines whether the corresponding memory mat is to be selected, according to access activating signal ACT (or a chip select signal CS) applied from a control bus 70 and corresponding memory mat select signal MASi (i=1–n). When the corresponding memory mat is to be selected, the access controller controls the memory cell selecting operation and the operation of writing or reading the data/information, and couples the corresponding memory mat to the bus of the corresponding port.

Control buses 70a and 70b independent of each other are arranged for ports P1 and P2, respectively. An OR circuit 68 takes logical sum between access request signals ACT1 and ACT2 that are applied from ports P1 and P2 (ROM and RAM ports) via control buses 70a and 70b, respectively, and produces main access instructing signal ACT. Main access instructing signal ACT is commonly supplied to memory mats MAT1-MATn, and sets the timing for taking in the address in the access request operation as well as the timing for activation of the internal circuits and bus connection. Main access instruction signal ACT corresponds to chip select signal CS of the semiconductor memory device formed of a single semiconductor chip alone.

Mat address decoders 65 and 66 statically perform decoding operations to produce mat decode signals MD1 and MD2 according to the mat address signal.

Even in the construction having a plurality of memory mats arranged commonly on one chip, the access path can be set for each memory mat individually.

Figure 5:
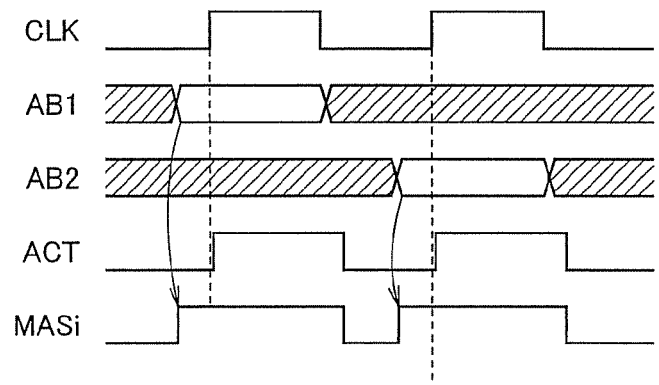
FIG. 5 is a timing chart representing an operation of the circuits shown in FIG. 4.

FIG. 5 is a timing chart representing an operation of the memory mat select signal generating portion shown in FIG. 4. Referring to FIG. 5, the operation of the mat select signal generating portion shown in FIG. 4 will now be described briefly.

Mat address decoders 65 and 66 operate statically and asynchronously with a clock signal CLK such as a system clock defining the operation cycle of the operational processing circuit. Address buses AB1 and AB2 receive the address signals from the operational processing circuit via the corresponding ports, respectively. The address signal has a set-up time with respect to the rising of clock signal CLK defining the operation cycle, and the address signals of address buses AB1 and AB2 attain the definite state at a timing faster than the rising of clock signal CLK. Therefore, address decoders 65 and 66 activate decode signals MD1 and MD2 at the timing faster than the rising of clock signal CLK.

OR circuit 67 drives memory mat select signal MASi for the selected memory mat to the active state according to decode signals MD1 and MD2.

When clock signal CLK rises, access instructing (request) signals ACT1 and/or ACT2 applied from the operational processing circuit via control buses 70a and/or 70b become active, and accordingly, main access instructing signal ACT becomes active to issue an access request to each memory mat. Among access controllers ACL1-ACLn, the access controller arranged for the memory mat to be accessed (i.e., memory mat designated by the mat select signal) operates to set the data/information transfer path of the memory mat, and the peripheral circuitry of the selected memory mat become active to perform the data access.

In the system having the construction shown in FIG. 4, therefore, a memory mat select signal MATi is in the definite state when the access instructing signal ACT is active, and the path for selecting the access requesting address to address select circuit 63 shown in FIG. 3 can be immediately established according to the activation of access instructing signal ACT.

Figure 6:
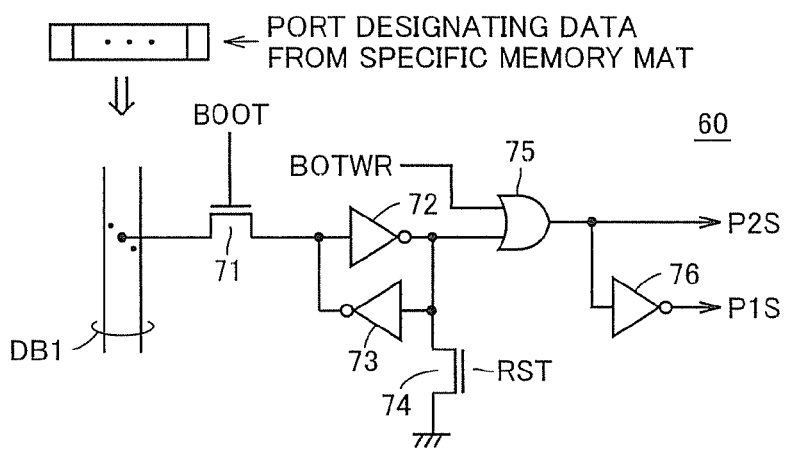
FIG. 6 shows an example of a construction of a port designating data holding circuit.

FIG. 6 shows an example of a construction of port designating data holding circuit 60 shown in FIG. 3. In FIG. 6, port designating data holding circuit 60 includes a transfer gate 71 that is coupled to a specific data line in data bus DB1, and is selectively made conductive according to an initializing operation instructing signal BOOT, an inverter 72 for inverting the data received via transfer gate 71, an inverter 73 connected in antiparallel to inverter 72, a resetting NMOS transistor 74 connected between an input of inverter 73 and a ground node, and selectively made conductive according to a reset signal RST, an OR circuit 75 for producing a port-2 select signal P2S according to the output signal of inverter 72 and an initialization program writing instructing signal BOTWR, and an inverter 76 for inverting the output signal of OR circuit 75 to produce a port-1 select signal P1S.

These port select signals P2S and P1S are used as signals for designating ports P2 and P1, respectively. Inverters 72 and 73 form a latch circuit.

Reset signal RST is a pulse signal that is produced in a one-shot pulse form at the time of power-up, and sets the output signal of inverter 72 to the L level (logical low level) when MOS transistor 74 is on.

Figure 7:
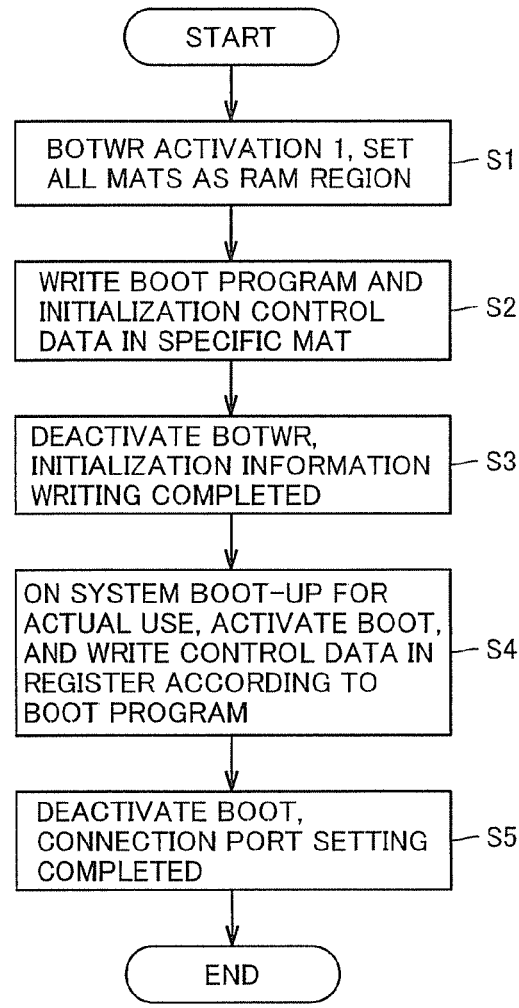
FIG. 7 is a flowchart representing an operation of the port designating data holding circuit shown in FIG. 6.

FIG. 7 is a flowchart representing the port designating data holding operation of port designating data holding circuit 60 shown in FIG. 6. Referring to FIG. 7, description will now be given on the operation of the port designating data holding circuit.

Before fixing the ROM region in this nonvolatile RAM 3, the initial information of this nonvolatile RAM 3 is stored in a specific ROM region. First, in this initial information writing operation, initial information write instructing signal BOTWR is set to the active state (H level (logical high level)), port designating signal P2S is set to the active state and all the memory mats are set to the RAM region (step S1).

Thereby, any memory mat among the memory mats in the nonvolatile RAM can be designated as the ROM region, and the program for boot-up, basic software such as BIOS, control data for initialization and others, i.e., the information required for the initializing operation and the fixed data are written in a specific memory mat (step S2). In this initial information write operation, information indicating the region (i.e., ROM or RAM region) to which each memory mat is to be allocated is also written as the initialization control data.

When the writing of initialization information is completed, initialization information write instructing signal BOTWR is set to the inactive state (L-level). After writing the initialization information, port designating data holding circuit 60 causes the latch circuit formed of inverters 72 and 73 to hold the L level set by resetting MOS transistor 74, and port select signal P1S designating port P1 (ROM port) is kept active (during power on). After the writing of initialization information is completed, therefore, all the memory mats are set to the ROM regions as the default after the power-on, and the information writing is inhibited (step S3).

After this initialization information is written, the memory device or the operational processing system is shipped. In the practice use after assembly into the system, the system is booted up. In this case, when the power is on, resetting MOS transistor 74 is turned on according to reset signal RST, and sets the output signal of inverter 72 to the L level, and all the memory mats are set to the ROM regions. Then, the operational processing circuit reads the boot program, and initializes the nonvolatile RAM. In this initializing operation, initializing operation instructing signal BOOT becomes active. Each port designating data holding circuit 60 is coupled to the corresponding data line in data bus DB1, and the data read onto data bus DB1 from the memory mat storing the initialization data (port designating data) is stored in inverters 72 and 73 as well as each memory mat (step S4). Thereby, the connection port of each memory mat is set, and the initialization for the actual use is completed.

The memory mat, which stores the boot program and the control data for the initialization, is used as the ROM region, and therefore is connected to port P1. In the memory mat storing the boot program, therefore, port designating signal P1S is normally kept active. In the other memory mats, each connection port is set to the ROM or RAM region according to the port designating signal. In the other memory mats, initializing operations such as initialization of potentials on internal nodes are merely performed, and data access is not performed so that a malfunction is prevented. The port designating data for the respective memory mats are read in parallel from one memory mat, and are transferred via the bus of port P1 so that the port designating data can be written in parallel in the respective memory mats, and the port designating data can be set in parallel for the memory mats of the number that is equal to or smaller than the bus width of bus DB1, and the connection port of each memory mat can be set at high speed.

Figure 8:
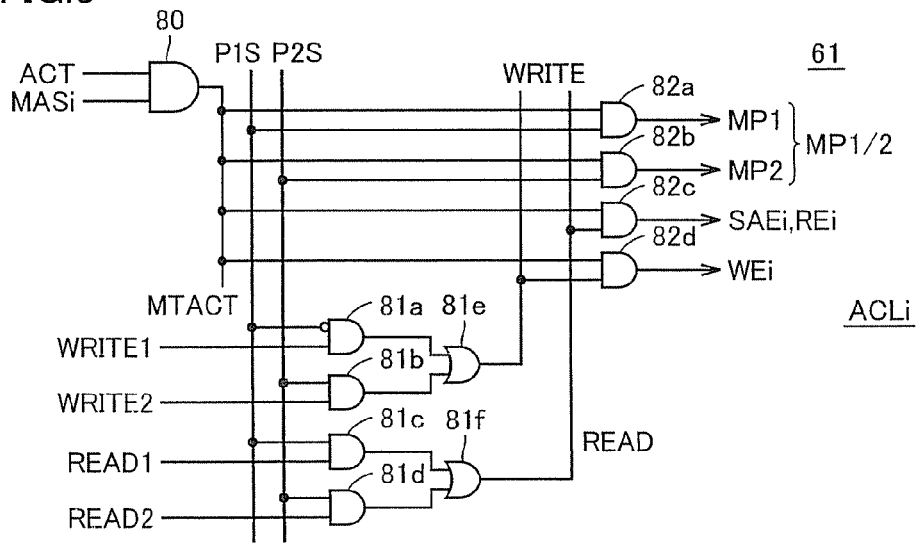
FIG. 8 shows an example of a construction of an access control circuit shown in FIG. 3.

FIG. 8 shows an example of a construction of access control circuit 61 included in access controller ACLi shown in FIG. 3. In FIG. 8, access control circuit 61 includes an AND circuit 80 that receives access instructing signal ACT and mat select signal MASi, and produces a mat activating signal MTACT, an AND circuit 82a that receives the output signal of AND circuit 80 and port designating signal P1S to produce connection control signal MP1, an AND circuit 82b that receives mat activating signal MTACT and port designating signal P2S to produce connection control signal MP2, an AND circuit 82c that receives mat activating signal MTACT and a read mode instructing signal READ to produce sense amplifier activating signal SAEi and read instructing signal REi, and an AND circuit 82d that receives mat activating signal MTACT and a write mode instructing signal WRITE to produce write instructing signal WEi. Connection control signals MP1 and MP2 correspond to connection control signals MP1/2 shown in FIG. 3.

Write mode instructing signal WRITE is produced from circuitry including a gate circuit 81a receiving a port-1 write mode instructing signal WRITE1 and port designating signal P1S, an AND circuit 81b receiving port designating signal P2S and a port-2 write mode instructing signal WRITE2, and an OR circuit 81e that receives the output signals of gate circuit 81a and AND circuit 81b.

Gate circuit 81a generates an output signal at H level when port designating signal P1S is at the L level and port-1 write mode instructing signal WRITE1 is at the H level. Therefore, when writing is instructed to port P1 and the corresponding memory mat is set to the ROM region, gate circuit 81a generates the output signal at the L level.

AND circuit 81b generates the signal at the H level when port designating signal P1S is at the H level and port-2 write mode instructing signal WRITE2 is at the H level. When at least one of the output signals of gate circuit 81a and AND circuit 81b is at the H level, OR circuit 81e sets write mode instructing signal WRITE to the H level, and the corresponding memory mat is set to the write state.

When port designating signal P1S is at the H level and the corresponding memory mat is designated as the ROM region, the output signal of gate circuit 81a is at the L level, and port-1 write mode instructing signal WRITE1 is neglected. Therefore, writing in the memory mat designated as the ROM region is reliably inhibited. In the state where port designating signal P1S is at the L level, when port-1 write mode instructing signal WRITE1 attains the H level, write mode instructing signal WRITE attains the H level. In this state, the corresponding memory mat is set to the RAM region, and writing is allowed. By arranging the data bus for port P1, the write access to the memory mat of the RAM region can be performed via port P1.

Circuitry for generating read mode instructing signal READ includes an AND circuit 81c receiving port designating signal P1S and a port-1 read mode instructing signal READ1, an AND circuit 81d receiving port-2 designating signal P2S and a port-2 read mode designating signal READ2, and an OR circuit 81f receiving the output signals of AND circuits 81c and 81d. OR circuit 81f generates read mode instructing signal READ.

Reading of data/information is permitted in both of the ROM and RAM regions. Accordingly, when port P1 designated by port designating signal P1S applies read mode instructing signal READi, read mode instructing signal READ generated from OR circuit 81f becomes active, and the access to data/information is made according to the read mode instructing signal applied from the port requesting the access.

The connection control of the ports and the activation of the internal operations are all performed according to the activation of mat activating signal MTACT. Therefore, even when the two ports are transferring the data and the instruction in parallel, the memory mat of the ROM region and the memory mat of the RAM region can reliably read the data on the corresponding data buses, and the malfunction can be prevented. By activating port connection control signals MP1 and MP2 according to mat activating signal MTACT, an unselected memory mat can be connected at a high impedance state to the bus of each port so that the malfunction can be prevented.

The portions (circuits 81a-81f) for producing write and read mode instructing signals WRITE and READ are arranged within the access controller, and the determination of the read mode and the write mode is performed for each memory mat according to corresponding port designating signals P1S and P2S. Accordingly, regardless of the region (i.e., ROM or RAM regions) to which the memory mat is set, the setting of the operation mode and the access can be performed accurately for each memory mat, and the write access to the memory mat designated as the ROM region can be reliably inhibited, so that rewriting of the information of the ROM region can be prevented.

Figure 9:
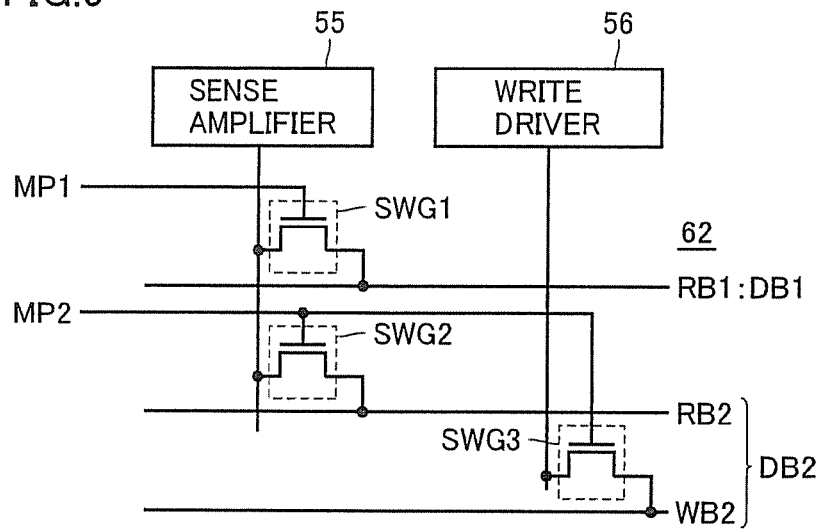
FIG. 9 shows an example of a construction of a connection setting circuit shown in FIG. 3.

FIG. 9 schematically shows an example of the construction of connection setting circuit 62 shown in FIG. 3. In FIG. 9, data bus DB1 coupled to port 1 for transferring information includes a read data bus RB1, and data bus DB2 coupled to port 2 for transferring data includes a read data bus RB2 transferring read data and a write data bus WB2 transferring write data. For the sake of simplifying designating names, buses transferring information such as instructions are merely referred to as "data buses". This is for the purpose of keeping consistency with the construction in which port P1 is used as a port for transferring data in the RAM region in another embodiment which will be described later.

Connection setting circuit 62 includes a switching circuit SWG1 that couples the output signal of sense amplifier 55 to read data bus RB1 according to port connection control signal MP1, a switching circuit SWG2 that transmits the output signal of sense amplifier 55 to read data bus RB2 according to connection control signal MP2, and a switching circuit SWG3 that couples write driver 56 to write data bus WB2 according to connection control signal MP2. As an example, these switching circuits SWG1-SWG3 are each formed of a transfer gate of an NMOS transistor. Switching circuits SWG1-SWG3 may be formed of CMOS transmission gates, respectively. Switching circuits SWG1-SWG3 may be configured with any configuration that can be turned on/off in response to connection control signals MP1 and MP2.

When each of sense amplifier 55 and write driver 56 transmits and receives complementary data (signals), these switching circuits SWG1-SWG3 are each formed of transfer gates for transferring the complementary data. In this case, data buses RB1, RB2 and WB2 each have complementary bus line configuration for transferring the complementary data (signals).

When the corresponding memory mat is used as the ROM region, connection control signal MP1 becomes active, and connection control signal MP2 is held inactive in an access cycle. In this case, the output signal of sense amplifier 55 is transferred to read data bus RB1, and then to the output portion of port P1 (ROM port). In this case, switching circuit SWG3 is off, and the write data is not transferred to write driver 56 so that erroneous rewriting of the storage data is inhibited.

In the construction shown in FIG. 9, there is not provided a write data bus for port P1. This is because the writing is not performed on port P1, and therefore it is not necessary to transfer write data/information to port P1. When the write data bus is arranged for port P1, the corresponding switching circuit is set to the normally off state according to port designating signal P1S.

When this memory mat is used as the RAM region, control signal MP2 becomes active to turn on switching circuits SW2 and SW3 in an access cycle. In addition, switching circuit SWG1 is kept off. Therefore, the reading and writing of the data can be performed via read and write data buses RB2 and WB2, respectively, and data can be bidirectionally transferred via the RAM port (port P2).

Figure 10:
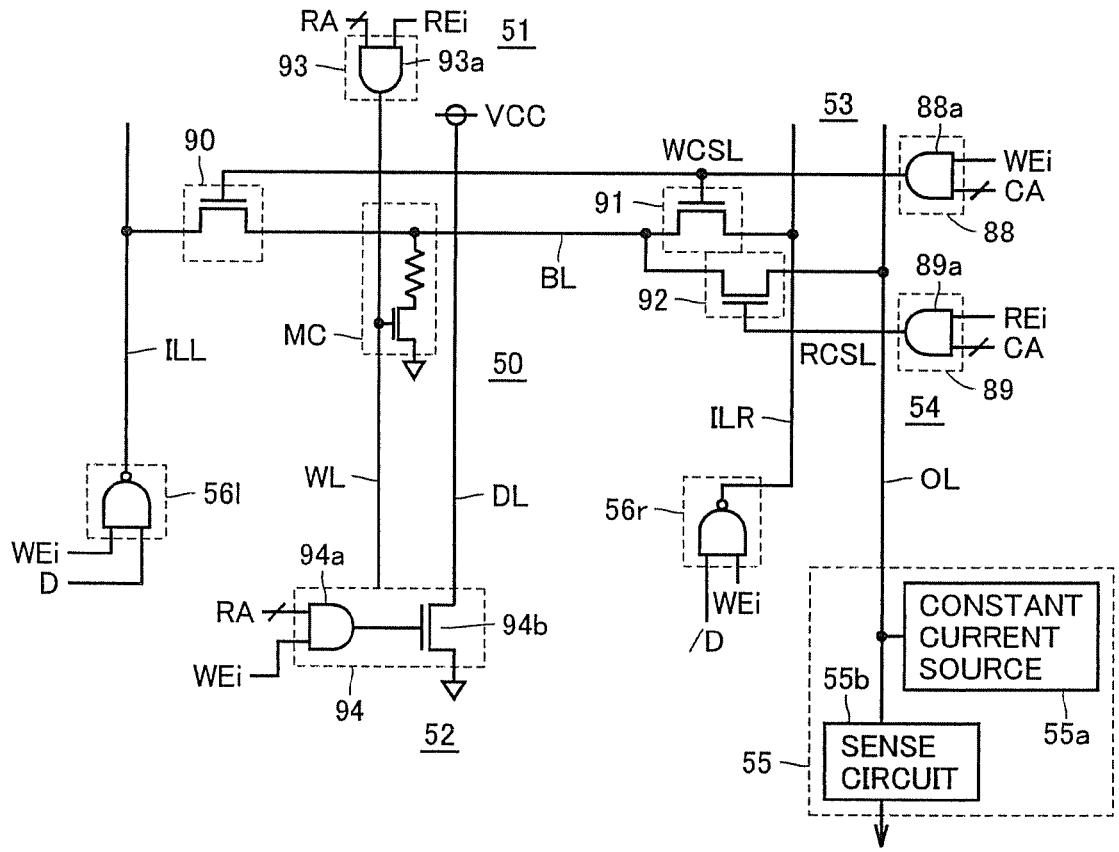
FIG. 10 shows an example of construction of memory array peripheral circuits shown in FIG. 3.

FIG. 10 shows a construction of the peripheral circuitry of memory cell array 50 shown in FIG. 3, and specifically shows, by way of example, constructions of word line driver 51, digit line driver 52, write column select circuit 53 and read column select circuit 54. FIG. 10 also shows the constructions of write driver 56 and sense amplifier 55. For memory cell array 50, internal write data lines ILL and ILR are arranged on the opposite ends of bit line BL, respectively, and an internal read data line OL is arranged on one end side of bit line BL.

Word line driver 51 includes a word line drive circuit 93 arranged corresponding to word line WL. Word line drive circuit 93 includes a unit decode/drive circuit 93a that drives corresponding word line WL to the selected state (H level) according to row address signal RA and read instructing signal REi.

Digit line driver 52 includes unit digit line drive circuits 94 arranged corresponding to the respective digit lines. This unit digit line drive circuit 94 includes an AND type decode circuit 94a producing a digit line select signal according to row address signal RA and write instructing signal WEi, and a drive transistor 94b coupling digit line DL to the ground node according to the output signal of AND type decode circuit 94a. Drive transistor 94b is formed of, e.g., an NMOS (insulated gate type field effect) transistor.

The other end of digit line DL is coupled to a power supply node. Therefore, when digit line DL is selected, a current flows from the power supply node to the ground node.

Write column select circuit 53 includes a unit column decode circuit 88 that is arranged corresponding to bit line BL, and produces a write column select signal WCSL according to write instructing signal WEi and column address signal CA, and write column select gates 90 and 91 that couple corresponding bit line BL to internal write data lines ILL and ILR according to write column select signal WCSL, respectively.

Write column select decode circuit 88 includes an AND decode circuit 88a receiving write instructing signal WEi and column address signal CA. In the data write operation, when column address signal CA designates a corresponding column, unit column decode circuit 88a drives write column select signal WCSL to the selected state of H level.

Read column select circuit 54 includes read column decode circuit 89 that is arranged corresponding to each respective bit line, and receives read instructing signal REi and column address signal CA for producing a read column select signal RCSL, and read column select gate 92 that is arranged corresponding to each respective bit line, and couples corresponding bit line BL to internal read data line OL according to read column select signal RCSL received from read column decode circuit 89. Read column decode circuit 89 includes an AND type decode circuit 89a receiving read instructing signal REi and column address signal CA.

In FIG. 10, column address signal CA and row address signal RA are each a multi-bit address signal, and a corresponding decode circuit is selected in response to a predetermined combination of these address signal bits. One bit line is selected according to one write column select signal WCSL and one read column select signal RCSL. However, these column select signals WCSL and RCSL may be configured to designate simultaneously a plurality of bit lines for reading/writing data in parallel. FIG. 10 representatively shows a construction of a portion writing and reading data/information of one bit.

Write driver 56 includes a drive circuit 56l for driving internal write data line ILL according to write instructing signal WEi and internal write data (information) D, and a drive circuit 56r for driving internal write data line ILR according to write instructing signal WEi and complementary internal write data (information)/D. Drive circuits 56l and 56r are each formed of an NAND circuit, and maintain corresponding internal write data lines ILL and ILR at the power supply voltage level when in the unselected state.

The write or read data is data in the RAM region or information in the ROM region. For the sake of description, it is assumed in the following description that the target of reading/writing is data. However, this does not exclude the construction of the write/read portion for the ROM port.

Sense amplifier 55 includes a constant current source 55a for supplying a constant current to internal read data line OL, and a sense circuit 55b for sensing a current flowing through internal read data line OL to produce the internal read data. Although not shown clearly in FIG. 10, constant current source 55a and sense circuit 55b become active according to sense amplifier activating signal SAEi.

In the data read operation, when the corresponding memory mat is designated, read instructing signal REi becomes active, and read column select circuit 54 becomes active. Accordingly, decode circuit 89 in read column select circuit 54 performs the decoding operation to drive read column select signal RCSL corresponding to a selected column to the selected state according to column address signal CA, and couples bit line BL to read data line OL. Concurrently, word line drive circuit 93 in word line driver 51 drives word line WL in a selected row to the selected state according to read instructing signal REi and row address signal RA. Accordingly, the access transistor is turned on in memory cell MC, and the variable resistance element is connected between the bit and source lines.

The current supplied from constant current source 55a of sense amplifier 55 via internal read data line OL and read column select gate 92 is discharged to the source line (ground line), and the quantity of this discharged current varies depending on the resistance value of the variable resistance element in memory cell MC. Sense circuit 55b senses the discharging current on the internal read data line OL to produce the internal read data.

In the data read operation, write instructing signal WEi is inactive, write column select gates 90 and 91 are kept off, and drive transistor 94b of unit digit line drive circuit 94 is kept off. In the data read operation, therefore, sense amplifier 55 senses the magnitude (large or small) of the quantity of the current flowing through selected memory cell MC, and reads the internal read data. The internal read data produced by sense amplifier 55 is transferred to data bus RB1 or RB2 shown in FIG. 9.

In the data write mode, when the corresponding memory mat is selected, write instructing signal WEi is driven to the selected state, and read instructing signal REi and sense amplifier activating signal (SAEi) are inactive. In this state, write column select signal WCSL is driven to the selected state according to column address signal CA, and corresponding write column select gates 90 and 91 are turned on to couple bit line BL to internal write data lines ILL and ILR, respectively.

Write drive circuits 56l and 56r drive these internal write data lines ILL and ILR according to complementary internal write data D and /D, respectively. When data D is at the H level, complementary write data /D is at the L level. Write drive circuit 56l drives internal write data line ILL to the ground voltage level, and write drive circuit 56r drives write data line ILR to the power supply voltage level. In this case, therefore, the current flows through bit line BL from write data line ILR to write data line ILL.

In digit line driver 52, digit line drive transistor 94b of digit line unit decode circuit 94 is turned on to couple digit line DL to the ground node, so that the current flows through digit line DL. A magnetic field induced by the currents flowing through bit line BL and digit line DL sets the magnetization direction of the ferromagnetic free layer of the variable resistance element (magneto-resistance element) in memory cell MC, and thereby sets the variable resistance element to the high- or low-resistance state.

When write data D is at the L level, the output signal of write drive circuit 56*l* attains the power supply voltage level, and the output signal of write drive circuit 56*r* attains the ground voltage level. In this state, the current flows through bit line BL from internal write data line ILL to internal write data line ILR. Through digit line DL, the current flows in the same direction as that flowing when write data D is at the H level. Through bit line BL, write current flows oppositely to the current flowing when write data D is at the H level, and the variable resistance element in memory cell MC is set to the state opposite to that attained when write data D is at the H level.

As described above, the direction of the current flowing through bit line BL varies according to the logical level of write data D, and the direction of the magnetic field produced by the bit line current varies. The variable resistance element in memory cell MC is the magneto-resistance element of the MRAM cell, and includes the fixed and free layers each formed of the ferromagnetic layer. The magnetization direction of this free layer is set according to the direction of the magnetic field induced by bit line BL current. The magnetization direction of the fixed layer is constant and independent of the flowing directions of the bit and digit line currents. Therefore, the magnetization directions of the free and fixed layers in the variable resistance element (magneto-resistance element) are set to the parallel (same) direction or the antiparallel (opposite) directions according to the direction of the current flowing through bit line BL. Thereby, the resistance value of the variable resistance element is set to the high- or low-resistance state to perform the writing and storing of the data.

Write and read instructing signals WEi and REi as well as sense amplifier activating signal (SAEi) are produced based on the port designating signal designating the port to be connected to the corresponding memory mat, whereby the read/write of the data from/into a selected memory mat can be accurately achieved while inhibiting writing of data in the memory mat of the ROM region.

Connection setting circuit 62 shown in FIG. 9 performs the bus connection according to the data write timing of write drive circuits 56*l* and 56*r* or the data read timing of sense amplifier circuit 55. Thereby, the sense amplifier or write driver can be coupled to the data bus according to the internal operation (read/write operation) of the corresponding memory mat, so that data can be accurately read or write, and problems of writing of data in another memory mat or conflict with read data of another memory mat can be prevented.

According to the above construction, memory mat MATi is a unit in controlling an activation operation, and is represented as a bank. However, the construction described above can be applied, provided that each memory mat MATi has individually peripheral circuitry (memory cell select circuit and write/read circuits) separately from others. When memory mat MATi corresponds to the construction of one memory chip, the access controller can perform setting of the connection path and the internal operation control according to activation control signal (access instruction signal) ACT according to the chip select signal on the mat-by-mat basis, i.e., memory mat by memory mat. In this construction (module construction), data buses RB1, RB2 and WB2 are formed of in-module interconnection lines outside the chips, and the access controller is implemented by the circuit controlling the internal operations of the memory.

In the construction having a plurality of memory blocks arranged in one memory cell array and each corresponding to a memory mat, each memory block may needs to be provided separately with a local data bus. In this case, the connection path between the local data bus and the global data bus that is shared among the plurality of internal memory blocks is established according to the connection control signal. Thereby, each memory block in the one memory array can be used as the ROM or RAM region.

According to the first embodiment of the invention, as described above, each memory mat (memory block or memory chip) is set to the ROM or RAM region, and the ROM and RAM regions are coupled to different ports, respectively, and are coupled to the ROM and RAM ports of an external operational processing circuit. In the operational processing circuit, such an operation is not required that data of data and instructions of different attributes are received from one port, and then are internally re-distributed. Therefore, the operational processing circuit can have a simple internal construction. Also, each item of data is transferred to the port corresponding to its attribute so that the operational processing circuit can execute the data and information processing at a faster timing. In the memory mat, since the ROM and RAM ports are arranged individually and separately from each other, one of the ROM and RAM ports can be accessed before completion of the access to the other port (it is not necessary to give consideration to the recovery time of the internal data line to the initial state), and the data can be transferred fast (because the access cycle time can be reduced).

The ROM and RAM regions within the nonvolatile RAM have variable sizes. Therefore, the ROM and RAM can be formed of the same, fast memory, and the storage capacities can be set to optimum values depending on applications. The memory system allowing fast access and having long lifetime can be achieved with one kind of memory (memories). Therefore, the costs for the design, manufacturing and distribution can be reduced.

Second Embodiment

Figure 11:
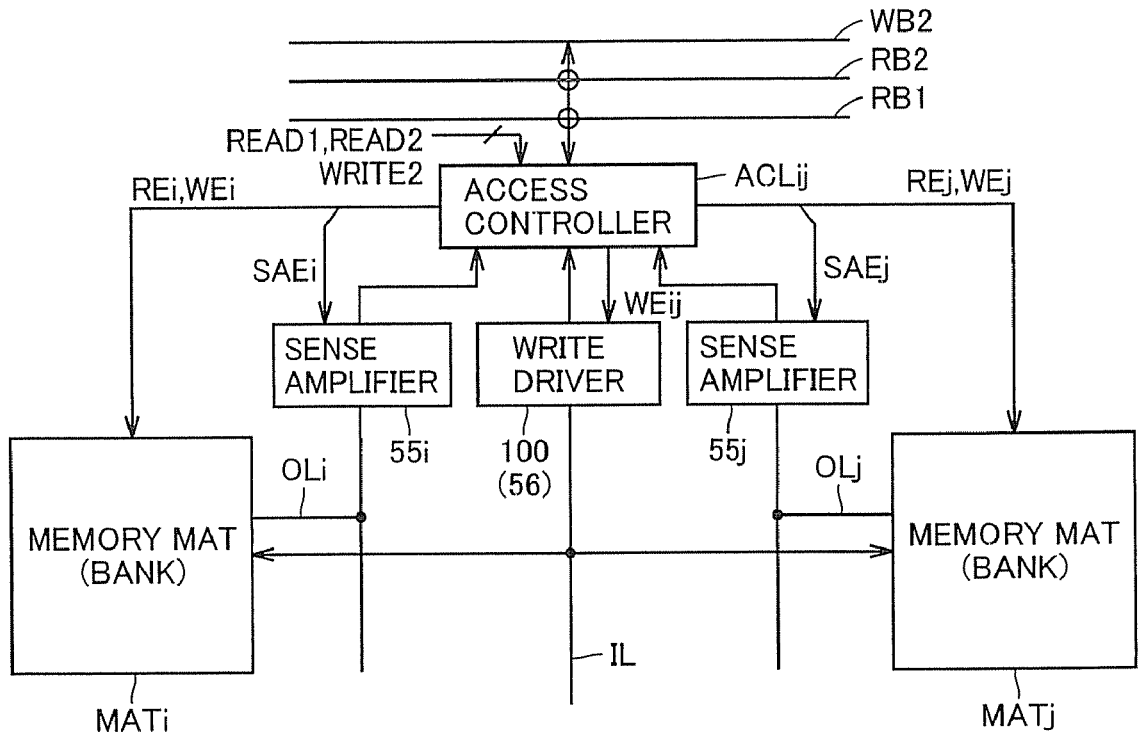
FIG. 11 schematically shows a construction of a main portion of a nonvolatile RAM according to a second embodiment of the invention.

FIG. 11 schematically shows a construction of a main portion of a nonvolatile RAM according to a second embodiment of the invention. In FIG. 11, memory mats MATi and MTj are formed of banks adjacent to each other, respectively. Specifically, memory mats MATi and MATj are formed on the same semiconductor chip, and each memory mat can perform the memory select operation independently of the other. Sense amplifiers 55*i* and 55*j* are arranged for these memory mats MATi and MATj, respectively. Sense amplifier 55*i* amplifies the data read from memory mat MATi via an internal read data line OLi, and sense amplifier 55*j* amplifies the data read from memory mat MATj via an internal read data line OLj.

A write driver 100 (56) is shared between these memory mats MATi and MATj. Write driver 100 (56) writes the data selectively in memory mats MATi and MATj via an internal write data line IL. Therefore, internal write data line IL supplying the write data (write current) from write driver 100 is shared between memory mats MATi and MATj.

For controlling access to memory mats MATi and MATj, an access controller ACLij is shared between them. Access controller ACLij produces read instructing signal REi, write instructing signal WEi and sense amplifier activating signal SAEi for memory mat MATi, and produces a read instructing signal REj, a write instructing signal WEj and a sense amplifier activating signal SAEj for memory mat MATj. Access controller ACLij produces write instructing signal WEij to write driver 100.

Access controller ACLij receives read mode instructing signals READ1 and READ2 as well as write mode instructing signal WRITE2. Read mode instructing signal READ1 is applied from port P1, and read mode instructing signal READ2 and write mode instructing signal WRITE2 are applied from port P2. Access controller ACLij controls the access to memory mats MATi and MATj, and controls the connection to read data buses RB1 and RB2 and write data bus WB2. Read data bus RB1 is coupled to port P1 (ROM port), and transfers information such as instructions and control data. Read data bus RB2 and write data bus WB2 are coupled to port P2 (RAM port), and transfers rewritable data.

As shown in FIG. 11, write driver 100 is shared between memory mats MATi and MATj adjacent to each other on the common semiconductor chip. When the MRAM is employed, write driver 100 performs the data writing by supplying the current, and the supplied current must form the magnetic field so that the current driving power of the write driver is large, and its occupation area is relatively large. Therefore, by sharing write driver 100 between memory mats MATi and MATj formed of the adjacent banks, the layout area of the chip can be reduced.

In either of the cases where memory mats MATi and MATj are connected to the same port, and where they are connected to different ports, respectively, the writing is not simultaneously performed conducted on both of the sharing memory mats (the ROM port is in the write-inhibited state, and does not allow the write access). Therefore, the sharing of the write driver between the memory mats does not cause an error in data writing.

Figure 12:
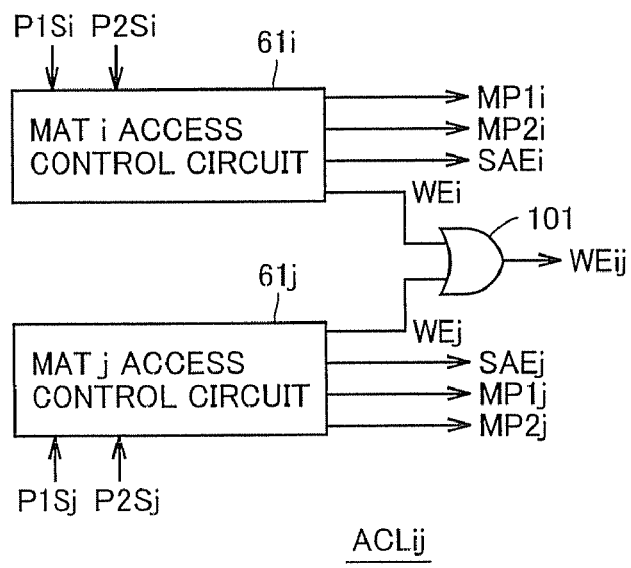
FIG. 12 schematically shows a construction of an access controller according to the second embodiment of the invention.

FIG. 12 schematically shows a portion of the access control circuit in access controller ACLij shown in FIG. 11, and particularly shows a construction of a portion for producing control signals. In FIG. 12, access controller ACLij includes a mat-i access control circuit 61i for controlling the access to memory mat MATi, a mat-j access control circuit 61j for controlling the access to memory mat MATj, and an OR circuit 101 for producing write activating (instruction) signal WEij according to the logical sum between write instructing signals WEi and WEj applied from mat-i and mat-j access control circuits 61i and 61j.

Mat-i and mat-j access control circuits 61i and 61j have substantially the same construction as the access control circuit shown in FIG. 8, and each operates according to the port designating signal applied from the corresponding port designating data holding circuit and according to access instructing signal ACT and the mat select signal (MAS), to produce the corresponding access control signals. The port designating data holding circuits are arranged corresponding to memory mats MATi and MATj, respectively (see FIG. 6), and the access control signals such as a write instructing signal are selectively produced according to the port designating signals P1Si, P2Si, P1Sj and P2Sj applied from the corresponding port designating data holding circuits.

Even in the construction having memory mats MATi and MATj that share internal write data line IL and write driver 100, the write driver can be accurately activated to perform the data writing in the write mode due to the use of OR circuit 101 when one of the memory mats is selected (write instructing signals WEi and WEj for the respective mats set the write column select gate in the selected memory mat to the selected state).

Figure 13:
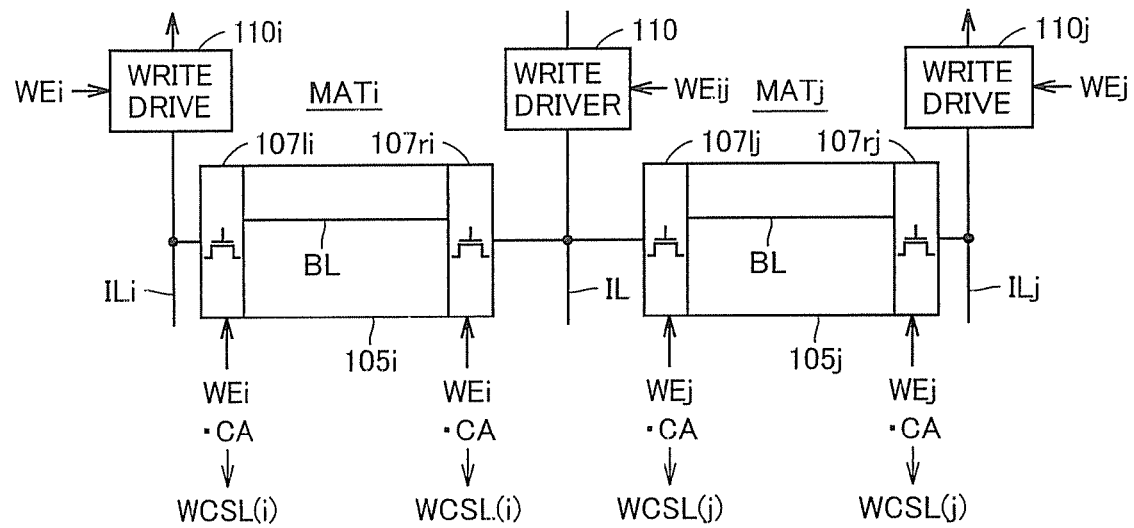
FIG. 13 schematically shows a construction of a modification of the second embodiment of the invention.

FIG. 13 shows an example of arrangement of the write driver. In FIG. 13, memory mat MATi includes a memory cell array 105i having memory cells arranged in rows and columns, and write column select gate groups 107li and 107ri arranged on the opposite end sides of bit lines BL of memory cell array 105i, respectively. Write column select gate groups 107li and 107ri couple bit line BL in a selected column to respective write data lines ILi and IL according to a write column select signal group WCSL(i) produced according to write instructing signal WEi for memory mat MATi and column address signal CA.

According to FIG. 13, write column select signal group WCSL(i) is produced according to logical product of write instructing signal WEi and column address signal CA. This means that when write instructing signal WEi turns active, the column address signal is made valid and the column select operation (decode operation) is performed, and the write column select signal group is produced.

Similarly to memory mat MATi, memory mat MATj includes write column select gate groups 107lj and 107rj arranged on the opposite end sides of bit line BL of a memory cell array 105j, respectively. For memory mat MATj, write column select signal group WCSL(i) is produced according to write instructing signal WEj and column address signal CA, and bit line BL in the selected column is coupled to internal write data lines IL and ILj.

Write driver 100 is shared between memory mats MATi and MATj. Internal write data lines ILi and ILj are provided with write drive circuits 110i and 110j, which in turn cooperate with write driver 100 to supply the write currents to a bit line in the selected column when memory mats MATi and MATj are selected, respectively.

Figure 14:
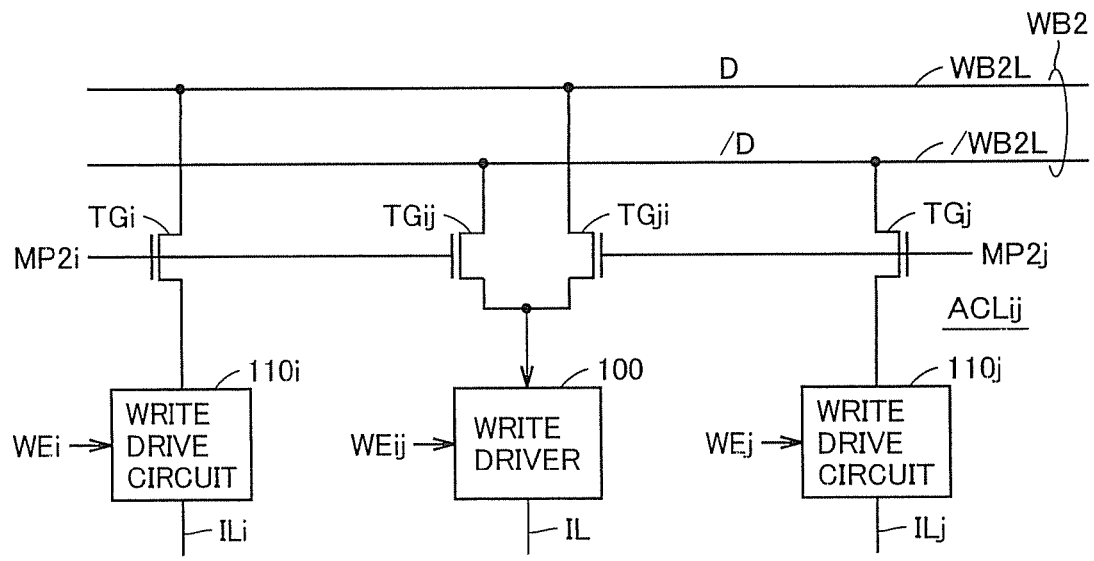
FIG. 14 schematically shows a construction of a connection setting circuit for the construction shown in FIG. 13.

FIG. 14 shows a construction of a connection control circuit for the write drivers shown in FIG. 13, and particularly shows the construction for connection to the write data bus in access controller ACLij. Write data bus WB2 includes write data bus lines WB2L and /WB2L transmitting complementary data signals D and /D, respectively.

Access controller ACLij includes switching gates TGi and TGij that couple write drive circuit 110i and write driver 100 to write data bus lines WB2L and /WB2L according to a port connection control signal MP2i, respectively, and further includes switching gates TGji and TGj that couple write driver 100 and write drive circuit 110j to write data bus lines WB2L and /WB2L according to a port connection control signal MP2j.

When port connection control signal MP2i becomes active, write drive circuit 110i and write driver 100 are coupled to write data bus lines WB2L and /WB2L, and supply the currents to a selected bit line according to complementary data D and /D transmitted through bus lines WB2L and /WB2L, respectively. Write drive circuit 110i, write driver 100 and write drive circuit 110j have the same constructions as write drive circuits 56l and 56r already described and shown in FIG. 10, and supply the write current to a selected bit line in memory mat MAT (MATi, MATj) according to write data D and /D.

When memory mat MATj is selected and port connection control signal MP2j becomes active, switching gates TGji and TGi are turned on to transmit write data D and /D to write driver 100 and write drive circuit 110j, respectively. Write driver 100 and write drive circuit 110j become active to supply the currents to internal write data lines IL and ILj in accordance with write instructing signals WEij and WEj.

In this access controller ACLij, the connection destination of write drive circuits 110i and 110j as well as write driver 100 are changed according to the selected memory mat, whereby the currents can flow in the same direction through the bit lines BL in memory mats MATi and MATj when the write data assumes the same logical value, and the resistance value of the variable resistance element (magneto-resistance element) of the memory cell in each memory mat can match the logical value of the write data between the memory mats.

[Modification of Arrangement of Write Driver]

Figure 15:
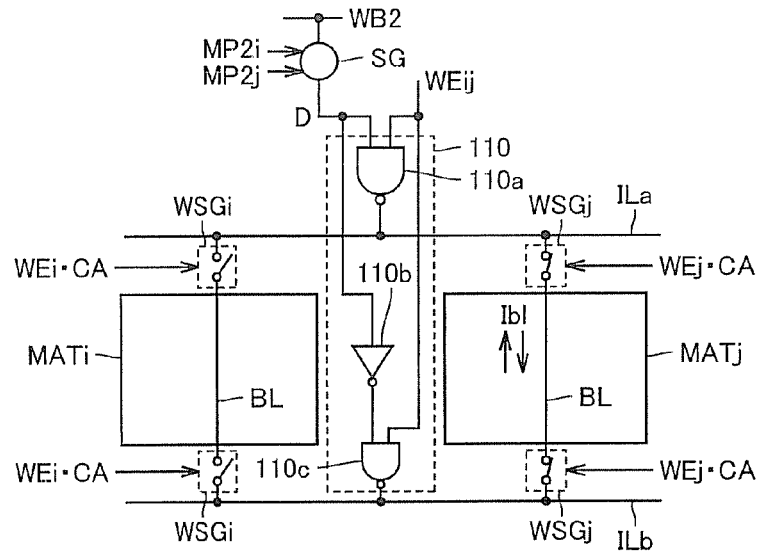
FIG. 15 schematically shows a modification of the second embodiment of the invention.

FIG. 15 shows a modification of the arrangement of the write drivers in the nonvolatile RAM according to the second embodiment of the invention. In FIG. 15, a write driver 110 is arranged between memory mats MATi and MATj, and internal write data lines ILa and ILb each shared between memory mats MATi and MATj are arranged on the opposite sides in the bit line direction of memory mats MATi and MATj. In the data write operation, bit line BL in memory mat MATi is connected to internal write data lines ILa and ILb via write column select gates WSGi provided opposite sides, respectively. Write column select gate WSGi is selectively made conductive according to the write column select signal that is produced by a combination (logical product) of column address signal CA (more accurately, the decode signal thereof) and write instructing signal WEi.

In the data write operation of memory mat MATj, bit line BL is coupled to internal write data lines ILa and ILb by write column select gates WSGj on the opposite sides that are made conductive according to the combination (logical product) between write instructing signal WEj and column address signal CA.

Write driver 110 includes an NAND type drive circuit 110a that receives internal write data D applied via a connection control gate SG included in the access controller and write instructing signal WEij, and drives internal write data line ILa, an inverter 110b that inverts internal write data D and an NAND type drive circuit 110c that drives internal write data line ILb according to the output signal of inverter 110b and write instructing signal WEij.

Connection control gate SG couples write data bus WB2 to write driver 110 according to port connection control signals MP2i and MP2j when one of memory mats MATi and MATj is selected. When write data bus WB2 transfers the complementary data as shown in FIG. 14, inverter 110b is not employed, and complementary data D and /D on the write data bus are transferred to NAND drive circuits 110a and 100c, respectively.

In the data write operation, write column select gates WSGi or WSGj of memory mat MATi or MATj is selected. FIG. 15 shows by way of example a state in which write column select gates WSGj arranged for memory mat MATj are made conductive. Internal write data D is applied from internal write data bus WB2 via switching gate SG according to connection control signal MP2i or MP2j. In memory mats MATi and MATj, bit lines BL are arranged in the same direction with respect to write driver 110, and therefore switching gate SG is not required to change the logic level of write data D according to the position of a selected memory mat. Therefore, when one of port connection control signals MP2i and MP2j is active, switching gate SG connects write driver 110 to write data line WB2L of write data bus WB2 shown in FIG. 14. In the construction shown in FIG. 14, both switching gates TGij and TGji are connected to write data bus line WB2L.

When write data D is at the L level, NAND type drive circuits 110a and 110c produce the output signals at the H and L levels, respectively, and a current Ib1 flows through bit line BL in the direction from internal write data line ILa to internal write data line ILb. When write data D is at the H level, current Ib1 flows through bit line BL oppositely, i.e., in the direction from internal write data line ILb to internal write data line ILa.

Each of internal write data lines ILa and ILb is arranged for use by both memory mats MATi and MATj. However, the write current of the bit line is supplied from intermediate portions of internal write data lines ILa and ILb. Therefore, the path of flow of the bit line write current is equivalently the portion of the internal write data line arranged for one memory mat. Accordingly, even in the construction having the internal write data lines each arranged for the two memory mats, the influence by the interconnection resistances thereof can be suppressed, and the write current can be stably supplied to the bit line.

[Modification of Second Embodiment]

Figure 16:
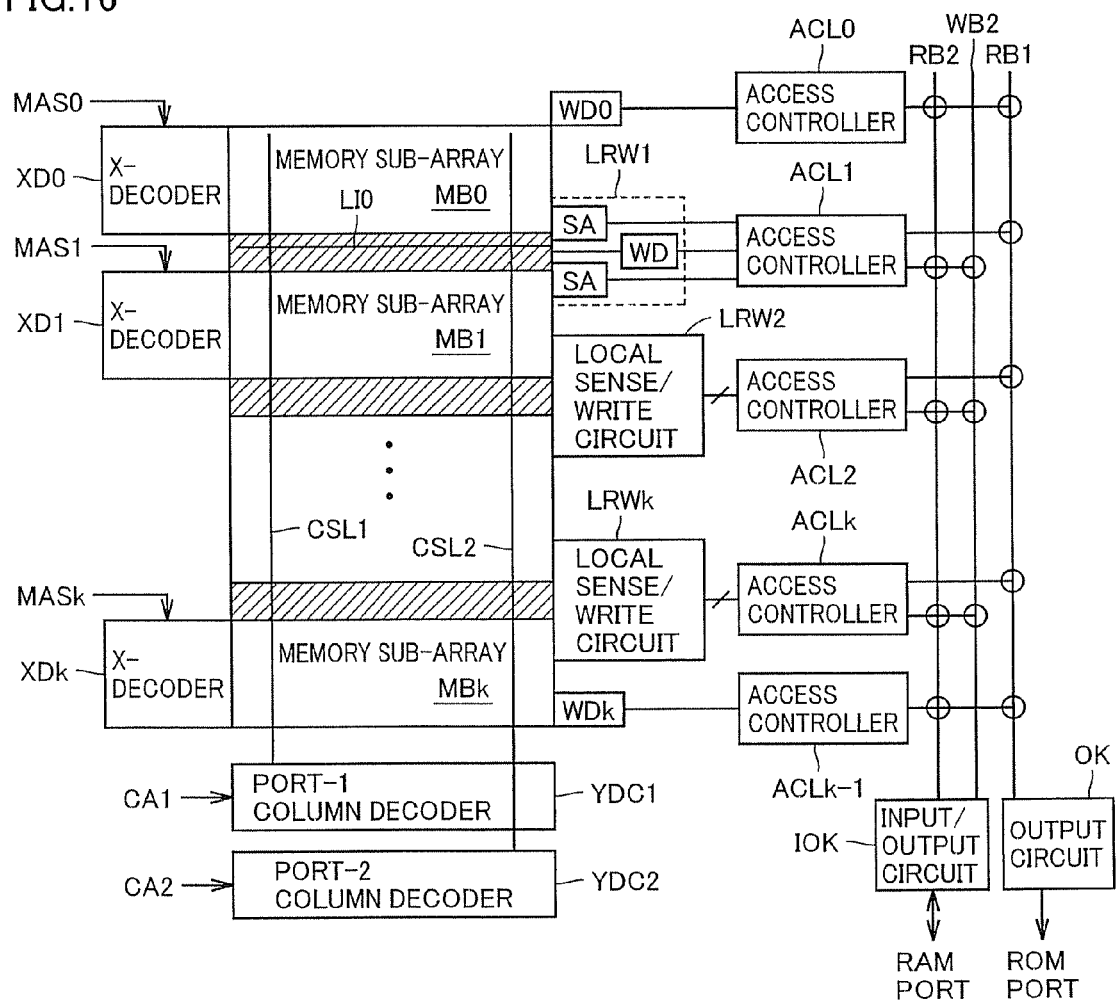
FIG. 16 schematically shows a construction of a second modification of the second embodiment of the invention.

FIG. 16 schematically shows a construction of a modification of the nonvolatile RAM according to the second embodiment of the invention. In FIG. 16, a memory cell array is divided into a plurality of memory sub-arrays MB0-MBk each corresponding to the memory mat. Local data line LIO is arranged in each of boundary regions between memory sub-arrays MB0-MBk. Local sense/write circuits LRW1-LRWk are arranged corresponding to the boundary regions between the memory sub-arrays, respectively.

Further, a write drive circuit WD0 is arranged being opposed to local sense/write circuit LWR1 for memory sub-array MB0, and a write drive circuit WDk is arranged being opposed to local sense/write circuit LWRk for memory sub-array MBk.

Each of local sense/write circuits LRW1-LRWk includes a sense amplifier SA provided for the corresponding memory sub-array, and a write drive circuit WD shared between the corresponding two memory sub-arrays adjacent to each other.

Access controllers ACL1-ACLk are arranged corresponding to local sense/write circuits LRW1-LRWk, respectively, and access controllers ACL0 and ACLk+1 are arranged corresponding to write drive circuits WD0 and WDk, respectively. Access controllers ACL0-ACLk+1 selectively establish the connection to internal read buses RB1 and RB2 as well as write bus WB2 according to the designated ports, similarly to the constructions of the embodiments already described.

Read data bus RB1 is coupled to an output circuit OK, and write and read data buses WB2 and RB2 are connected to an input/output circuit IOK. Output circuit OK constitutes a part of the ROM port, and input/output circuit IOK constitutes a part of the RAM port. Each port includes an input portion for an address signal and control signals.

X-decoders XD0-XDk are arranged for memory sub-arrays MB0-MBk, respectively. Port-1 and port-2 column decoders YDC1 and YDC2 are arranged each shared by memory sub-arrays MB0-MBk, for decoding column address signals CA1 and CA2 applied from ports P1 and P2, respectively.

Port-1 column decoder YDC1 applies a column select signal CSL1 commonly to memory sub-arrays MB0-MBk, and port-2 column decoder YDC2 commonly applies a column select signal CSL2 to memory sub-arrays MB0-MBk.

X-decoders XD0-XDk are activated according to mat select signals MAT0-MATk designating memory sub-arrays MB0-MBk, respectively. In the construction shown in FIG. 16, mat select signals MAT0-MATk are used as the memory sub-array select signals.

In the construction shown in FIG. 16, sense amplifiers SA are arranged corresponding to memory sub-arrays MB0-MBk, respectively, and write drive circuit WD is shared between the two adjacent memory sub-arrays. A construction similar to a portion of controlling connection to write driver 100 shown in FIG. 14 is used for the connection control of write drive circuit WD, and write drive circuit WD is selectively connected to write data bus WB2 according to port connection control signal MP2 for the sharing memory sub-arrays.

In the construction shown in FIG. 16, write drive circuit WD is shared between the two adjacent memory sub-arrays, and therefore the area occupied by the write drive circuit can be reduced.

The operation of accessing memory sub-arrays MB0-MBk are substantially the same as that in accessing the memory mats of the bank configuration in the first and second embodiments already described, and substantially same control is performed except for the construction of the column select gate and for the column select control.

Figure 17:
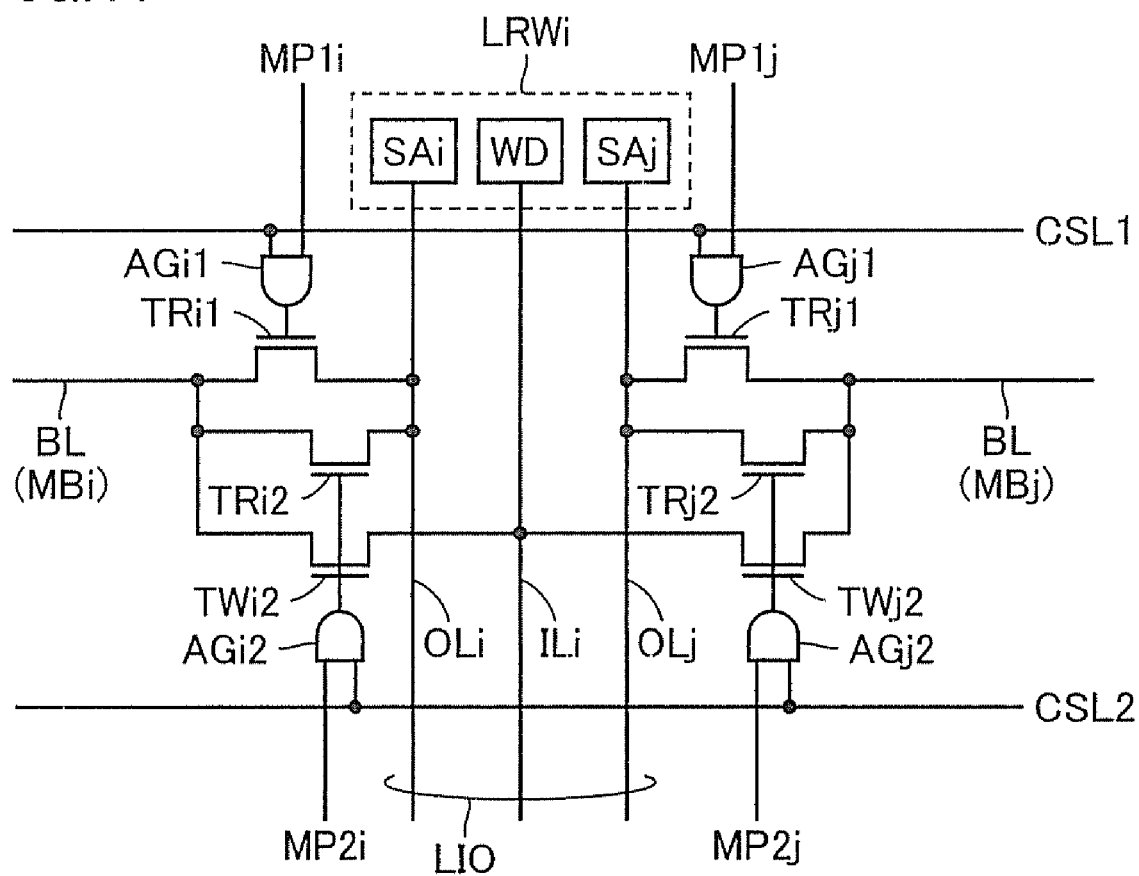
FIG. 17 shows an example of a construction of a column selecting portion for the construction shown in FIG. 16.

FIG. 17 shows an example of a construction of a portion related to local data line LIO arranged in the boundary region between the memory sub-arrays shown in FIG. 16. FIG. 17 shows a construction of a portion related to local data line LIO arranged between two memory sub-arrays MBi and MBj.

Local data line LIO includes internal read data line OLi for memory sub-array MBi, internal read data line OLj for memory sub-array MBj and internal write data line ILi shared between these memory sub-arrays MBi and MBj.

In memory sub-array MBi, bit line BL is provided with a port-1 read column select gate TRi1, a port-2 read column select gate TRi2 and a port-2 write column select gate TWi2. Port-1 read column select gate TRi1 is selectively turned on according to an output signal of an AND circuit AGi1 receiving port-1 connection control signal MP1i and column select signal CSL1 of port 1, and port-2 read column select gate TRi2 is selectively turned on according to an output signal of an AND circuit AGi2 receiving a column select signal CLS2 of port 2 and port-2 connection control signal MP2i. Port-2 write column select gate TWi2 is likewise turned on according to the output signal of AND circuit AGi2.

Read column select gates TRi1 and TRi2 couple bit line BL to internal read data line OLi when made conductive. Write column select gate TWi2 couples bit line BL to internal write data line ILi when made conductive.

In memory sub-array MBj, likewise, a bit line BL is provided with a port-1 read column select gate TRj1, a port-2 read column select gate TRj2 and a port-2 write column select gate TWj2. Port-1 read column select gate TRj1 is selectively turned on according to an output signal of an AND circuit AGj1 receiving column select signal CSL1 of port 1 and a port-1 connection control signal MPij. Port-2 read column select gate TRj2 is selectively turned on according to an output signal of an AND circuit AGj2 receiving port-2 column select signal CSL2 and port-2 connection control signal MP2j for memory sub-array MBj. Port-2 write column select gate TWj2 is selectively turned on according to the output signal of AND circuit AGj2. Read column select gates TRj1 and TRj2 couple bit line BL to internal read data line OLj when made conductive. Write column select gate TWj2 couples bit line BL to internal write data line ILi when made conductive.

The local sense/write circuit shared between memory sub-array MBi and MBj includes sense amplifiers SAi and SAj provided for internal read data lines OLi and OLj, respectively, and further includes a write drive circuit WD provided for internal write data line ILi.

In the construction shown in FIG. 17, when memory sub-array MBi is to be accessed via port P1, port-1 connection control signal MP1i becomes active (i.e., attains the H level). Bit line BL of memory sub-array MBi is selected according to port-1 read column select gate TRi1, and is coupled to internal read data line OLi. Port P1 does not perform write access. Therefore, sense amplifier SAi performs the sense operation to read the data from a selected memory cell in memory sub-array MBi. According to corresponding access controller ACLi shown in FIG. 16, the connection path of the output portion of the sense amplifier is set, and the internal data is read.

When the access is performed via port P2 concurrently with the access from port P1, port-2 column select signal CSL2 is driven to the selected state. In this state, when memory sub-array MBi is driven to the selected state in accordance with the access from port P1, the access from port P2 is made to memory sub-array MBj. This is because port P1 is used for outputting and transferring the data to store information such as instructions by an external operational processing unit, and port P2 transfers the rewritable application data or intermediate processing data. Since the addresses (memory mats) of the regions to be accessed by respective ports P1 and P2 are different from each other, ports P1 and P2 do not access concurrently the same address region (memory mat).

Therefore, when the read access is to be performed from port P1, port connection control signal MP1i for memory sub-array MBi becomes active, and read column select gate TRi1 of memory sub-array MBi is turned on for coupling to internal data read line OLi so that sense amplifier SAi is coupled to the port-1 read data bus. When the read access from port P2 is made on memory sub-array MBj, bit line BL of memory sub-array MBj is connected to internal read data line OLj via read column select gate TR1j, and sense amplifier SAj performs the data reading. Sense amplifier SAj is coupled to the port-2 read data bus. Sense amplifiers SAi and SAj transfer concurrently the read data to ports P1 and P2 (under control of the associated access controllers), respectively.

When the data writing is to be performed on memory sub-array MBj, write column select gate TWj2 is turned on so that the write current is supplied to bit line BL of memory sub-array MBj from write drive circuit WD via internal write data line ILi, and the data writing is performed.

Parallel data writing is not performed on memory sub-arrays MBi and MBj from ports P1 and P2, respectively. Therefore, even when write drive circuit WD driving the internal write data line is shared between memory sub-arrays MBi and MBj, neither conflict of the write data nor conflict between the read data and the write data occurs, and the accurate writing and reading can be achieved.

According to the second embodiment of the invention, the write drive circuit is shared between the adjacent memory mats or between adjacent memory sub-arrays. Thus, in addition to the effects of the first embodiment, the write drive circuits each supplying the write current and occupying a relatively large area can be reduced in number, and the chip layout area can be reduced.

Third Embodiment

Figure 18:
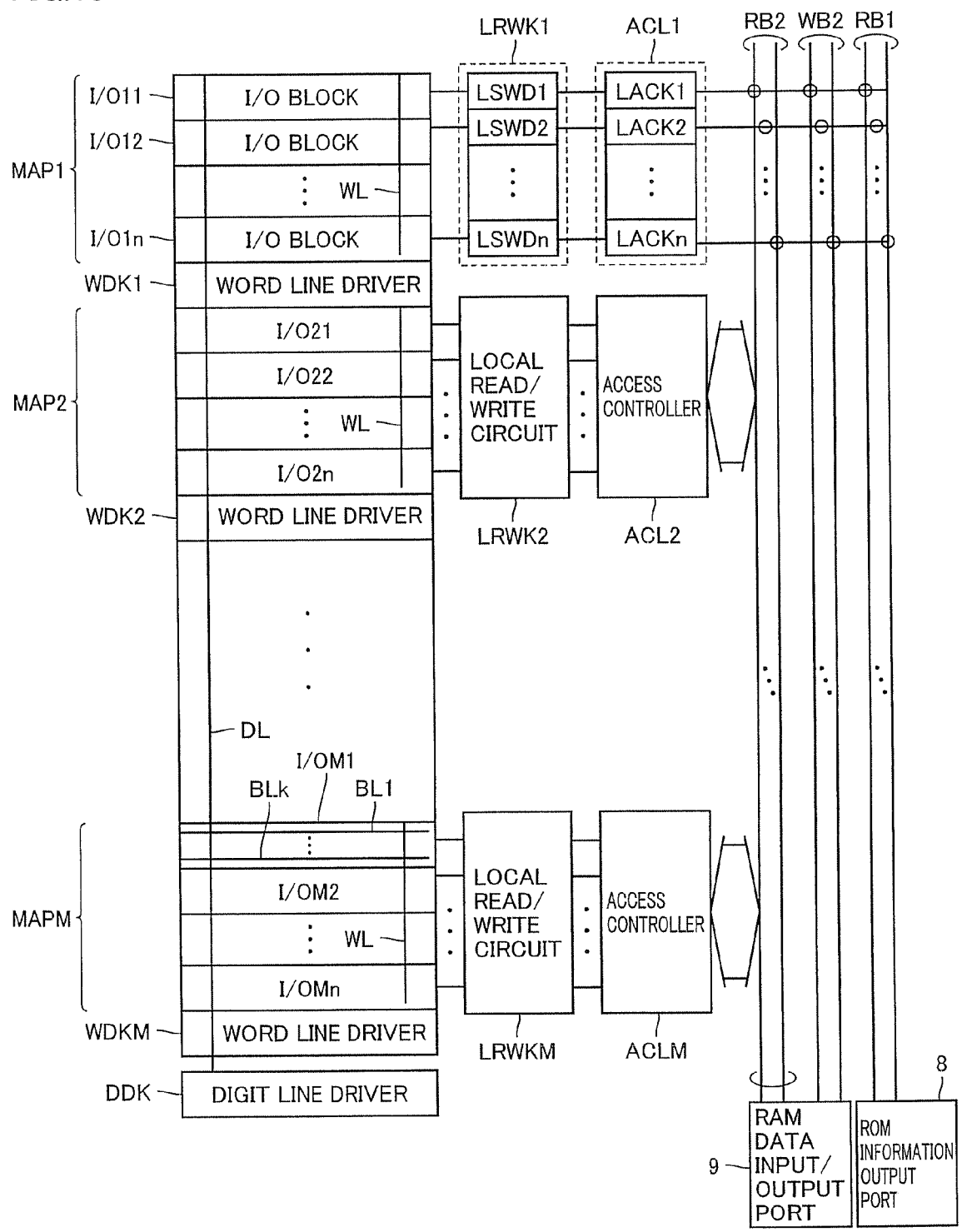
FIG. 18 schematically shows a construction of a nonvolatile RAM according to a third embodiment of the invention.

FIG. 18 schematically shows a whole construction of a nonvolatile RAM according to a third embodiment of the invention. In FIG. 18, the nonvolatile RAM includes M memory array blocks MAP1-MAPM. These memory array blocks MAP1-MAPM may be memory sub-blocks formed by dividing one memory cell array, respectively, or may be memory cell mats arranged individually and separately from each other on a common semiconductor chip. The memory cell mat is a memory circuit unit including an input structure, a column decoder and peripheral circuitry. In FIG. 18, memory array blocks MAP1-MAPM are arranged in one memory array, and is configured to share a digit line DL.

Each of memory array blocks MAP1-MAPM is divided into a plurality of I/O blocks. In FIG. 18, memory array block MAP1 includes I/O blocks I/OM1-I/OMn, and memory array block MAP2 includes I/O blocks I/O21-I/O2-n.

Memory array block MAPM includes I/O blocks I/OM1-I/OMn. Each I/O block stores one bit of data/information in one item of multi-bit data (information). In each I/O block, there are arranged a plurality of bit lines, out of which one bit line is selected for performing read/write of one bit of data. In one memory array block, internal I/O blocks are simultaneously selected.

For these memory array blocks MAP1-MAPM, there are arranged word line drivers WDK1-WDKM, respectively, and a digit line driver DDK is shared among memory array blocks MAPI to MAPM. In the data write operation, digit line driver DDK drives a digit line shared among memory array blocks MAP1-MAPM to the selected state, and supplies the digit line writing current.

Word line WL is selected on a block-by-block basis, i.e., a memory array block at a time, and digit line DL is commonly selected for memory array blocks MAP1-MAPM as described above. Digit line DL is driven to the selected state for the data writing, and word line WL is selected for the data reading. When a write access is made from one port, i.e., the RAM port (port P2), the read access is merely made from port P1. Therefore, the sharing of digit line driver DDK among memory array blocks MAP1-MAPM does not cause any collision of the write data. Even when the data write access from port P2 is made concurrently with the data read access from port P1, the port control is executed for each I/O block, as will be described later. In the above situation, therefore, the write data of port P2 does not affect the read data of port P1 even when the write access from port P2 and the read access from port P1 are made on the same address. Therefore, the parallel write/read can be accurately performed.

Local internal read/write circuits LRWK1-LRWKM are arranged corresponding to memory array blocks MAP1-MAPM, respectively. Each of local read/write circuits LRWK1-LRWKM includes local sense/write drive circuits LSWD provided corresponding to the I/O blocks in the corresponding memory array block (mat). FIG. 18 representatively shows local sense/write drive circuits LSWD1-LSWDn arranged corresponding to I/O blocks I/O11-I/O1n of memory array block MAP1, respectively.

Access controllers ACL1-ACLM are arranged for local write/read circuits LRWK1-LRWKM, respectively. Each of access controllers ACL1-ACLM includes local access control circuits LACK1-LACKn arranged corresponding to local sense/write drive circuits LSWD1-LSWDn in the corresponding local read/write circuit, respectively, and executes the port connection control for each I/O block.

Each of access controllers ACL1-ACLM establishes the connection of read data bus RB2, write data bus WB2 and read data bus RB1 to the predetermined bus lines, and controls write/read of the data.

Read and write data buses RB2 and WB2 are coupled to RAM data input/output port (RAM port) 9, and read data bus RB1 is coupled to ROM information output port (ROM port) 8. RAM data input/output port 9 includes a data output circuit and a data input circuit, and ROM information output port 8 includes an output circuit for the data (information).

In the construction shown in FIG. 18, individual column decoders may be arranged for memory mats MAP1-MAPM, respectively, or the column decoder may be shared among memory mats MAP1-MAPM, similarly to digit line driver DDK.

The respective constructions of local sense/write drive circuits LSWD1-LSWDn as well as the respective constructions of corresponding local access control circuits LACK1-LACKn are substantially the same as those in the first or second embodiment already described. With the corresponding memory mat replaced with one I/O block in the construction in the first or second embodiment, the construction performing the port connection control for each I/O block can be implemented by using the construction in the first or second embodiment already described. However, the present third embodiment differs from the first and second embodiments in that the digit line driver shown in FIG. 3 is shared among memory array blocks MAP1-MAPM in the construction shown in FIG. 18, and is not arranged for each I/O block. The mat select signal is used as the I/O block select signal.

Digit line driver DDK is activated when write mode instructing signal WRITE is applied. This write mode instructing signal WRITE is merely applied from the RAM port, and digit line driver DDK can be activated in the data write operation only by referring to write mode instructing signal WRITE2 included in the control signal applied from port P2.

The write/read of the data in memory array blocks MAP1-MAPM is controlled in the same manner as the first and second embodiments. In contrast to the construction of the second embodiment, however, the local write drive circuit is not shared between adjacent I/O blocks, and is provided for each I/O block (because the adjacent I/O blocks may be assigned to the same port in some cases, and therefore cannot share the write drive circuit).

By performing the port connection control on an I/O block basis in each memory array block, the information/data at the same address on the memory address space (i.e., address region that can be formed by all memory array blocks MAP1-MAPM) can be used as the ROM data and the RAM data independently of each other. In the case where the address space of the operational processing circuit is small, the port connection control can be performed to transmit/receive the information of different attributes, i.e., instructions and application data (or intermediate processing data) to and from the nonvolatile RAM, and the memory address space can be substantially expanded.

Figure 19:
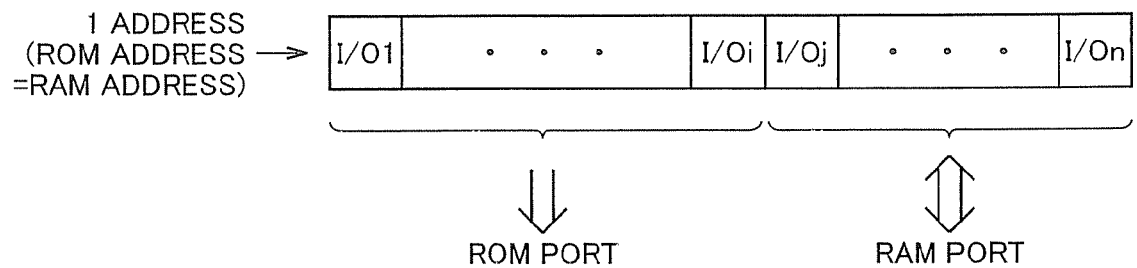
FIG. 19 schematically shows an example of an I/O configuration shown in FIG. 18.

FIG. 19 schematically shows a construction of transfer data of the nonvolatile RAM according to the third embodiment of the invention. According to the address applied from the operational processing circuit, the I/O blocks corresponding to bits I/O1-I/On in one memory array block are designated. For the ROM port, bits I/O1-I/Oi are assigned. For the RAM port, bits I/Oj-I/On are assigned.

For example, in the operation of accessing from the RAM port (port P2), the memory cell selection is executed in parallel in the corresponding I/O blocks in a selected memory array block. When the read access is not performed in the this operation, bits I/O1-I/Oi are not read, and bits I/Oj-I/On are read via port P2. When the access is not performed from port P2, the I/O block select signal corresponding to the mat select signal is inactive, and reading of bits I/Oj-I/On is inhibited. When the read access to the same address is performed in parallel from ports P1 and P2, these bits I/O1-I/On are read in parallel, and are transferred via the ROM port and the RAM port.

When the write access from the RAM port and the read access from the ROM port are made in parallel to the same address, the data writing is performed on bits I/Oj-I/On, and the reading of bits I/O1-I/Oi is performed without being influenced by such writing (because the write/read is performed for each I/O block).

When the access is to be performed from the ports to the memory array blocks at the different addresses, the memory cell selection is executed in the corresponding memory array block according to the access instruction applied from each port, and the access to the I/O blocks corresponding to each port is executed.

Therefore, where the memory mat has a plurality of I/O blocks corresponding to different bits, respectively, each bit can be coupled to port P1 (ROM port) or port P2 (RAM port) according to the port designating data. Thereby, even when the address space of the operational processing circuit or the address space of the nonvolatile RAM is small, the address space can be substantially expanded to execute and/or process the operational processing instruction.

In place of an general construction of a memory system having the address region switched by switching the bank, the port connection control is performed for each I/O block in the present embodiment. Thereby, the same address region can be readily used as the ROM information storage region and the RAM data storage region. The general bank switching on the memory address space suffers from a problem that data in only one of the banks can be used. However, the memory cell selection is executed for each memory array block, and the port connection control is performed for each I/O block, and accordingly, it is possible to access concurrently the data/information at the addresses assigned to these ROM and RAM ports, and the processing efficiency is improved.

Fourth Embodiment

Figure 20:
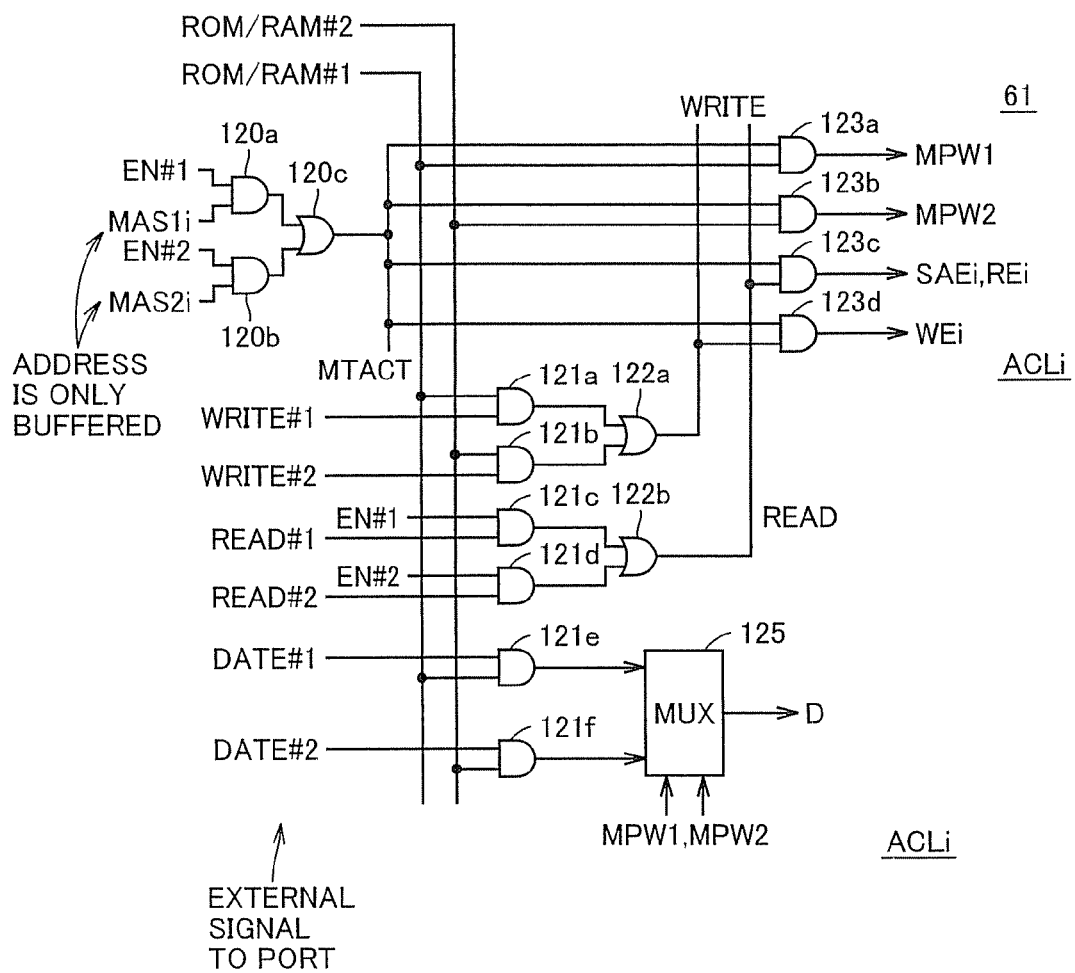
FIG. 20 shows an example of a construction of an access controller in a fourth embodiment of the invention.

FIG. 20 schematically shows a construction of access controller ACLi according to a fourth embodiment of the invention. Access controller ACLi is arranged corresponding to each memory mat for setting the ROM and RAM regions. In the fourth embodiment, an operational processing circuit provided externally or on the same chip accesses each memory mat via ports P1 and P2, and whether these ports P1 and P2 are each used as the ROM port or the RAM port is set by port attribute setting signals ROM/RAM#1 and ROM/RAM#2. Port attribute setting signals ROM/RAM#1 and ROM/RAM#2 set the corresponding ports as the RAM port when at H level. Therefore, in the fourth embodiment, one port is not fixed as the ROM port or as the RAM port, but can be flexibly and appropriately set as the ROM port or the RAM port according to the progress of processing or the contents of processing.

In FIG. 20, access controller ACLi includes an AND circuit 120a receiving an access instructing signal EN#1 (corresponding to the signal ACT) and a mat select signal MAS1i applied from an operational processing circuit external to the memory mats, an AND circuit 120b receiving an access instructing signal EN#2 requesting access to port P2 and a mat select signal MAS2i, and an OR circuit 120c that receives the output signals of AND circuits 120a and 120b, and produces mat activating signal (mat access instructing signal) MTACT. These gate circuits 120a-120c determine whether the corresponding memory mat is the accessing target under request. Mat select signals MAS1i and MAS2i are produced by decoding mat designation address signals in the address signals applied to ports P1 and P2, respectively.

Access controller ACLi further includes an AND circuit 121a that receives port attribute designating signal ROM/RAM#1 for port P1 and write mode designating signal WRITE#1 for port P1, an AND circuit 121b that receives port attribute designating signal ROM/RAM#2 for port P2 and write mode designating signal WRITE#2 for port P2, an OR circuit 122a that receives the output signals of AND circuits 121a and 121b to produce write instructing signal WRITE, an AND circuit 121c receiving access instructing signal EN#1 for port P1 and a read mode designating signal READ#1 for port P1, an AND circuit 121d receiving access instructing signal EN#2 and a read mode instructing signal READ#2 for port P2, an OR circuit 122b that receives the output signals of AND circuits 121c and 121d to produce read instructing signal READ for the corresponding memory mat, an AND circuit 121e receiving data DATA#1 and port attribute designating signal ROM/RAM#1 of port P1, and an AND circuit 121f receiving data DATA#2 and attribute designating signal ROM/RAM#2 of port P2.

AND circuits 121e and 121f fix the output signal at the L level, when corresponding ports P1 and P2 are designated as the ROM ports, to inhibit the internal transfer of corresponding data DATA#1 and DATA#2.

Access controller ACLi further includes an AND circuit 123a that receives mat activating signal MTACT generated from OR circuit 120c and port attribute designating signal ROM/RAM#1 to produce a port connection control signal MPW1, an AND circuit 123b that receives mat activating signal MTACT and port attribute designating signal ROM/RAM#2 to produce a port connection control signal MPW2, an AND circuit 123c that receives mat activating signal MTACT and internal read mode instructing signal READ to produce sense amplifier activating signal SAEi and read instructing signal REi, and an AND circuit 123d that produces write instructing signal WEi according to internal write mode instructing signal WRITE and mat activating signal MTACT.

In the construction shown in FIG. 20, when port attribute designating signal ROM/RAM#1 or ROM/RAM#2 is set to the L level, and the corresponding port is designated as the ROM port, AND circuits 121a and 121b inhibit the internal transfer of write mode instructing signal WRITE#1 or WRITE#2, and the activation of internal write mode instructing signal WRITE stops. The internal transfer of the write data is likewise inhibited, and an erroneous writing of the storage information in the ROM region is prevented.

When port attribute designating signals ROM/RAM#1 and ROM/RAM#2 are set to the H level designating the RAM port, AND circuits 121a and 121b transmit write mode instructing signals WRITE#1 and WRITE#2 corresponding to the ports, and internal write mode instructing signal WRITE is produced.

Port specific read mode instructing signals READ#1 and READ#2 are transmitted via AND circuits 121c and 121d according to the activation of access instructing signals EN#1 and EN#2 applied for port activation, and internal read mode instructing signal READ is produced. Thereby, sense amplifier activating signal SAEi and read instructing signal REi are activated in a selected memory mat, and the internal data reading is performed.

Port connection control signal MPW1 is set to the H level when the corresponding memory mat is selected and port-1 attribute designating signal ROM/RAM#1 is at the H level. Likewise, port connection control signal MPW2 is set to the H level when the mat activating signal MTACT and port-2 attribute designating signal ROM/RAM#2 are at the H level. Therefore, port connection control signals MPW1 and MPW2 control the operation of a multiplexer 125 to couple the corresponding write driver to the data bus of the corresponding port when at the H level. Multiplexer 125 controls only the internal transfer of the write data, and the read data is internally transferred to an operational processing circuit external to the memory mats via the corresponding port.

Figure 21:
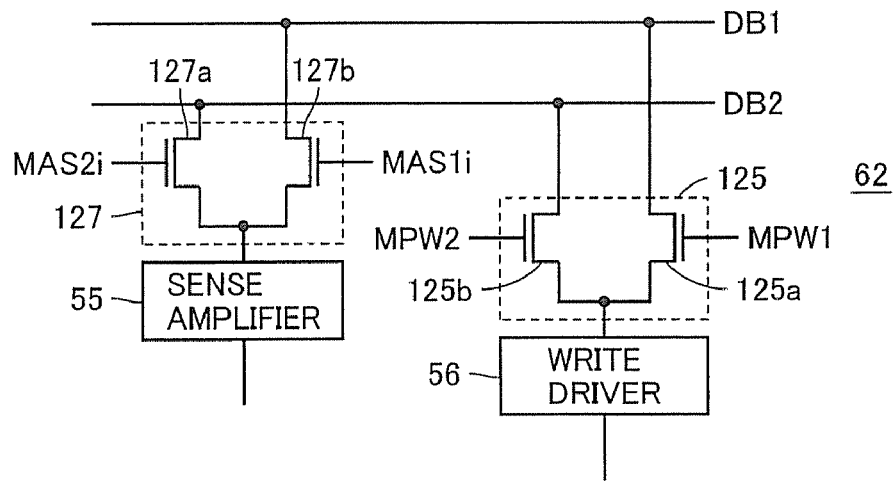
FIG. 21 schematically shows a construction of a connection setting portion included in the access controller in the fourth embodiment of the invention.

FIG. 21 shows an example of the construction of data bus connection setting circuit 62 included in access controller ACLi. FIG. 21 shows that data buses DB1 and DB2 transfer both the write and read data. These data buses DB1 and DB2 each may be configured to have write data bus and the read data bus provided separately and individually.

The memory mat is provided with sense amplifier 55 and write driver 56. Multiplexer 125 includes a transfer gate 125a that is turned on to couple write driver 56 to port-1 data bus DB1 when port connection control signal MPW1 is at the H level, and a transmission gate 125b that is turned on to connect write driver 56 to port-2 data bus DB2 when port connection control signal MPW2 is active at H level.

When port attribute designating signals ROM/RAM#1 or ROM/RAM#2 sets data bus DB1 or DB2 corresponding to port P1 or P2 to the RAM region, write driver 56 is coupled to the corresponding data bus to perform the data writing.

A read connection setting circuit 127 is provided for sense amplifier 55 and includes a transfer gate 127a that is turned on according to mat select signal MAS2i, to connect sense amplifier 55 to data bus DB2, and a switching (transfer) gate 127b connecting sense amplifier 55 to data bus DB1 according to memory mat select signal MAS1i.

Mat select signals MAS1i and MAS2i become active when corresponding memory mats are selected, respectively. When port P1 or P2 accesses the corresponding memory mat, the read data of sense amplifier 55 is applied to data bus DB1 or DB2 connected to the corresponding port. Read connection setting circuit 127 uses mat select signals MAS1i and MAS2i, and the data reading can be performed regardless of whether ports P1 and P2 are each set to the ROM port or the RAM port in the state where the corresponding memory mat is set to either the ROM region or the RAM region.

Therefore, by utilizing the construction of access controller ACLi shown in FIGS. 20 and 21, the writing in a memory mat designated as the ROM region can be inhibited independently of the other mats regardless of whether each of ports P1 and P2 is set to the ROM port or RAM port, and the data destruction can be reliably prevented.

[Modification]

Figure 22:
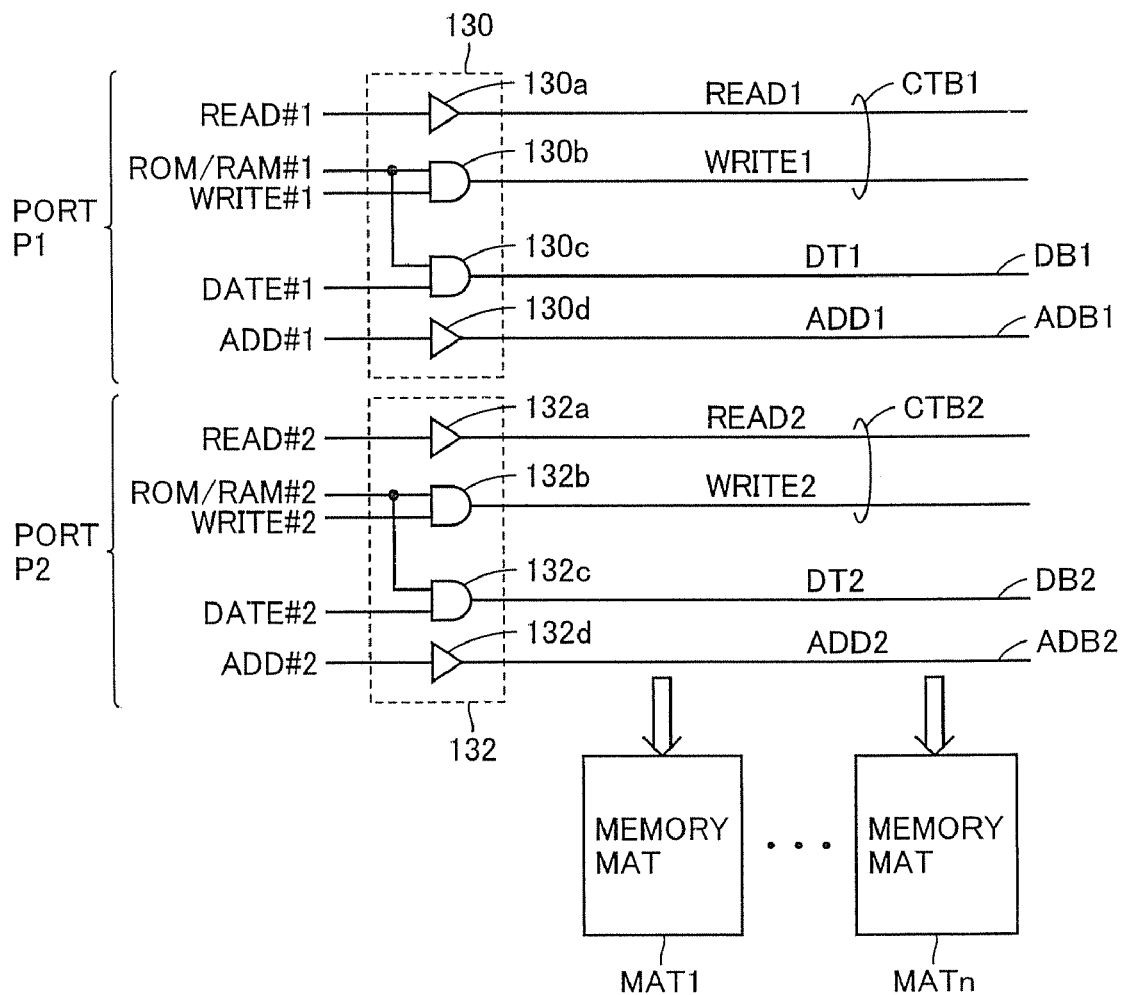
FIG. 22 schematically shows a construction for inhibiting data writing in a first modification of the fourth embodiment of the invention.

FIG. 22 shows a construction of a modification of a write inhibit circuit according to the fourth embodiment of the invention. In FIG. 22, control buses CTB1 and CTB2, data buses DB1 and DB2, and address buses ADB1 and ADB2 are shared among memory mats MAT1-MATn. Port-1 and port-2 input circuits 130 and 132 are provided for ports P1 and P2, respectively. Port-1 input circuit 130 includes a buffer circuit 130a that buffers port-1 read mode instructing signal READ#1 to produce internal port-1 read mode instructing signal READ1, an AND circuit 130b that receives port attribute designating signal ROM/RAM#1 and port-1 write mode instructing signal WRITE#1 to produce internal port-1 write mode instructing signal WRITE1, an AND circuit 130c that receives port attribute designating signal ROM/RAM#1 and write data DATA#1 to produce internal write data DT1, and a buffer circuit 130d that buffers an externally applied address signal ADD#1 to produce and transmit a port-1 internal address signal ADD1 onto address bus ADB1.

Port-2 input circuit 132 includes a buffer circuit 132a that buffers port-2 read mode instructing signal READ#2 to produce internal port-2 read mode instructing signal READ2, an AND circuit 132b that receives port attribute designating signal ROM/RAM#2 and port-2 write mode instructing signal WRITE#2 to produce internal port-2 write mode instructing signal WRITE2, an AND circuit 132c that receives port attribute designating signal ROM/RAM#2 and write data DATA#2 to produce internal write data DT2, and a buffer circuit 132d that buffers an address signal ADD#2 to produce an internal address signal ADD2.

Internal port-1 write mode designating signal WRITE1 and internal port-1 read mode designating signal READ1 are transmitted on to control signal lines of control bus CTB1 of port P1. Internal port-2 read mode designating signal READ2 and internal write mode designating signal WRITE2 are transmitted onto control signal lines of control bus CTB2 of port P2.

In the construction shown in FIG. 22, inhibition/permission of the internal writing is set according to port attribute designating signals ROM/RAM#1 and ROM/RAM#2 on a port-by-port basis, and it is not necessary to arrange, in each memory mat, a construction for inhibiting the rewriting of information in the ROM region, and the circuit construction can be made simple (because the bus connection control for the sense amplifier and the write driver can be executed according to the mat select signal).

Second Embodiment

FIG. 23 schematically shows a construction of a modification of the fourth embodiment of the invention. In FIG. 23, mode register circuits 140a and 140b are arranged for ports P1 and P2, respectively. Mode register circuit 140a produces a port attribute designating signal FROM/RAM#1 according to write mode instructing signal WRITE#1, access instructing signal (mat activating signal) EN#1 and address signal ADD#1 received from port P1. Likewise, mode register circuit 140b produces an attribute designating signal FROM/RAM#2 for port P2 according to write mode instructing signal WRITE#2, access instructing signal (mat activating signal) EN#2 and address signal ADD#2 received from port P2.

Mode register circuit 140a produces and latches port attribute designating signal FROM/RAM#1 according to the timing relationship between control signals WRITE#1 and EN#1 as well as a specific address bit of address signal ADD#1. Likewise, mode register circuit 140b takes in a specific address bit of address signal ADD#2 according to a specific timing relationship between write mode designating signal WRITE#2 and access instructing signal EN#2, and produces and latch port attribute designating signal FROM/RAM#2 according to the taken specific address signal bit.

In the construction having mode register circuits 140a and 140b arranged corresponding to the memory mat, the memory mat can be designated by address signals ADD#1 and ADD#2, and accordingly, mode register circuits 140a and 140b can produce port attribute designating signals FROM/RAM#1 and DROM/RAM#2, respectively, for each memory mat.

These mode register circuits 140a and 140b may be shared by all the memory mats. For example, when each port is continuously used as the RAM port or ROM port, as is done in a burst mode or the like, setting of the port attribute is performed first in the successive cycles, and the data access will be performed according to the port attribute thus set.

In this case, the externally provided operational processing circuit does not supply a port attribute designating signal. The port attribute is determined within the nonvolatile RAM according to signals FROM/RAM#1 and FROM/RAM#2 designating the attribute of the respective port, and the access control is executed.

Port attribute designating signals FROM/RAM#1 and FROM/RAM#2 generated from mode register circuits 140a and 140b are used in each memory mat instead of port attribute designating signals ROM/RAM#1 and ROM/RAM#2 shown in FIGS. 20 and 22.

According to the fourth embodiment of the invention, as described above, the port can be set to any of the ROM port and the RAM port, the data writing of the port designated as ROM port is reliably inhibited, so that the flexibility of access to the port is improved.

The memory mat can be configured with any one of the constructions in the first to third embodiments already described.

Fifth Embodiment

FIG. 24 schematically shows a construction of an operational processing system according to a fifth embodiment of the invention. In this operational processing system, an operational processing circuit 200 and a nonvolatile RAM can bidirectionally transfer information via ports P1 and P2. Port attribute designating signals ROM/RAM#1 and ROM/RAM#2 designate whether ports P1 and P2 are to be used as the ROM region or the RAM region. Therefore, a nonvolatile RAM 203 has the same construction as those in the first to fourth embodiments already described, and can access in parallel specific ports P1 and P2 to take out in parallel the instruction and operational processing data. Further, port P1 can be used as the RAM port instead of the ROM port, and the required data can be transferred in parallel.

FIG. 25 represents a data access sequence in the operational processing system according to the fifth embodiment of the invention. In the operational processing system, the operation cycles are defined according to the clock signal, and each cycle shown in FIG. 25 is specified by the clock signal.

In a cycle #1, ports P1 and P2 are set to the ROM and RAM ports, respectively. This setting is performed by port attribute designating signals ROM/RAM#1 and ROM/RAM#2. In the cycle #1, port P1 reads the data/information of the ROM region in nonvolatile RAM 203, and port P2 reads or writes the data in the RAM region.

In a cycle #2, port P1 is set to the ROM region, and the reading of data/information is performed. Port P2 is not accessed (NOP state). In this cycle #2, therefore, the instruction or the control data in the ROM region of nonvolatile RAM 203 is read, to be processed by operational processing circuit 200.

In a clock cycle #3, ports P1 and P2 are both set to the ROM region. In this case, the sense amplifier in the memory mat can be connected to either of data buses DB1 and DB2 (see FIG. 21) coupled to the respective ports P1 and P2, so that the data can be read from any memory mat set to ROM region among the memory mats in nonvolatile RAM 203. Instruction/control data can be read to be processed in parallel from different addresses in the ROM region of nonvolatile RAM 203.

In a clock cycle #4, port P1 is not accessed (NOP state). Port P2 is set to the RAM port, and the read/write of data is executed.

In a clock cycle #5, both ports P1 and P2 are set to the RAM port, and the read/write of data at different addresses is executed in the RAM region of nonvolatile RAM 203. In the memory mats, since the write driver can be connected to data buses DB1 and DB2 arranged for the respective ports P1 and P2 (see FIG. 21), the access (read/write) to the data can be performed on the different memory mats in the RAM region of nonvolatile RAM 203.

In a clock cycle #6, the necessary processing is completed, or the completion of the processing is waited for, so that ports P1 and P2 do not perform the access (NOP state).

As shown in clock cycles #3 and #5, respectively, both ports P1 and P2 are set to the ROM port and the RAM port, and the access to the instruction/data can be performed. This port designation is performed by an execution instruction of operational processing circuit 200. Therefore, in a binary operation, two terms of source data can be read in parallel via ports P1 and P2 from the nonvolatile RAM, and in addition, two different instructions can be read in parallel from the ROM ports. For example, even when operational processing is performed with different instruction sizes or data sizes, and double word length data or a double word length instruction is to be processed, parallel reading of a unit length instruction or unit length data can be performed to execute the double word length instruction or to transfer the double word length data (although upper and lower instructions (data) of the double word length instruction must be stored in different memory mats, respectively).

Therefore, nonvolatile RAM 203 can be used as any of the ROM and RAM without impairing the performance. The port-parallel access can provide the flexible memory system, and can improve the processing efficiency of operational processing circuit 200.

For setting the attribute of the port, it is merely necessary to set appropriately the logical levels of port attribute designating signals ROM/RAM#1 and ROM/RAM#2 according to an execution instruction of operational processing circuit 200. When operational processing circuit 200 is formed of a microprocessor, an access control signal generating portion provided therein can produce the port attribute control signals based on a decode instruction (micro-instruction) applied from an instruction decoder.

[Modification]

FIG. 26 schematically shows a construction of operational processing circuit 200 according to the fifth embodiment of the invention. In FIG. 26, operational processing circuit 200 includes a processor (or microcontroller) 210 for executing operational processing, and an address table 220 for storing the ROM and RAM region addresses in the nonvolatile RAM. This address table 220 includes an ROM address storage region 250a for storing addresses A#0-A#M in the ROM region and an address storage region 250b for storing the addresses in the RAM region.

Processor (or microcontroller) 210 determines the port with reference to address mapping on the address table 220 when accessing the nonvolatile RAM. Specifically, ports P1 and P2 are allocated to the ROM and RAM region addresses preferentially, respectively. Processor (or microcontroller) 210 monitors, in the access operation, whether both ports P1 and P2 are being used. When port P1 or P2 is not being used, processor (or microcontroller) 210 refers to address table 220 and particularly to the addresses of address regions 250a and 250b, sets port attribute designating signal ROM/RAM#1 and ROM/RAM#2 for the unused port and the target port, respectively, and prefetches the data (or instructions) of the same attribute.

It is not necessary to set, in advance, the access port by an execution instruction, and the load on the program design is reduced. The attribute of the port to be accessed can be dynamically set according to the processing status, and the data/information can be efficiently accessed depending on the processing situation.

According to the fifth embodiment of the invention, as described above, the two ports of the nonvolatile RAM can be set to any of the ROM and RAM ports in every cycle, and the data in the ROM and RAM regions can be efficiently accessed, so that the processing efficiency of the operational processing system can be improved.

Sixth Embodiment

Figure 27:
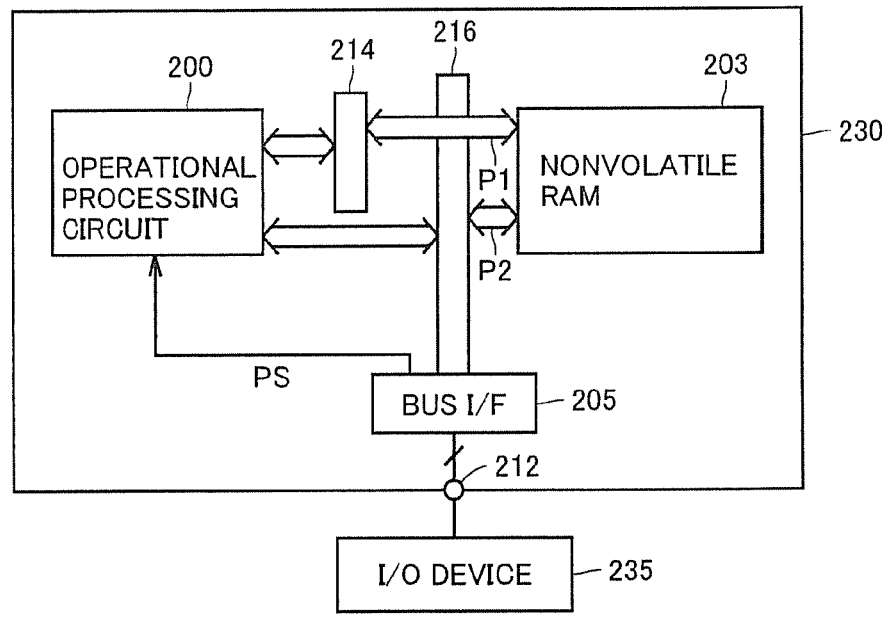
FIG. 27 schematically shows a whole construction of an operational processing system according to a sixth embodiment of the invention.

FIG. 27 schematically shows a construction of an operational processing system 230 according to a sixth embodiment of the invention. Referring to FIG. 27, operational processing system 230 is a one-chip microprocessor or a one-chip microcontroller, and includes operational processing circuit 200 formed of an ALU (Arithmetic and Logic processing Unit), a CPU (Central Processing Unit) or the like, and also includes nonvolatile RAM 203 having the internal constructions already described in connection with the first to fifth embodiments.

Operational processing circuit 200 is coupled to port P1 of nonvolatile RAM 203 via an (instruction) bus 214, and is coupled to port P2 of nonvolatile RAM 203 via a (data) bus 216. Bus 216 is coupled to a bus interface circuit (bus I/F) 205. Bus interface circuit 205 is coupled to an external peripheral device (I/O device) 235 via a terminal 212.

Peripheral device 235 is an input device such as an ROM writer or a keyboard. I/O device 235 is used for setting the allocation of nonvolatile RAM 203 to the ROM and RAM regions. In the port setting operation, I/O device 235 asserts a port setting signal PS (i.e., sets to the H level) when the allocation of nonvolatile RAM 203 to the ROM and RAM regions is to be executed. In response to the assertion of port setting signal PS, operational processing circuit 200 or external I/O device 235 executes the attribute setting processing on the ports and/or memory mats of nonvolatile RAM 203.

Figure 28:
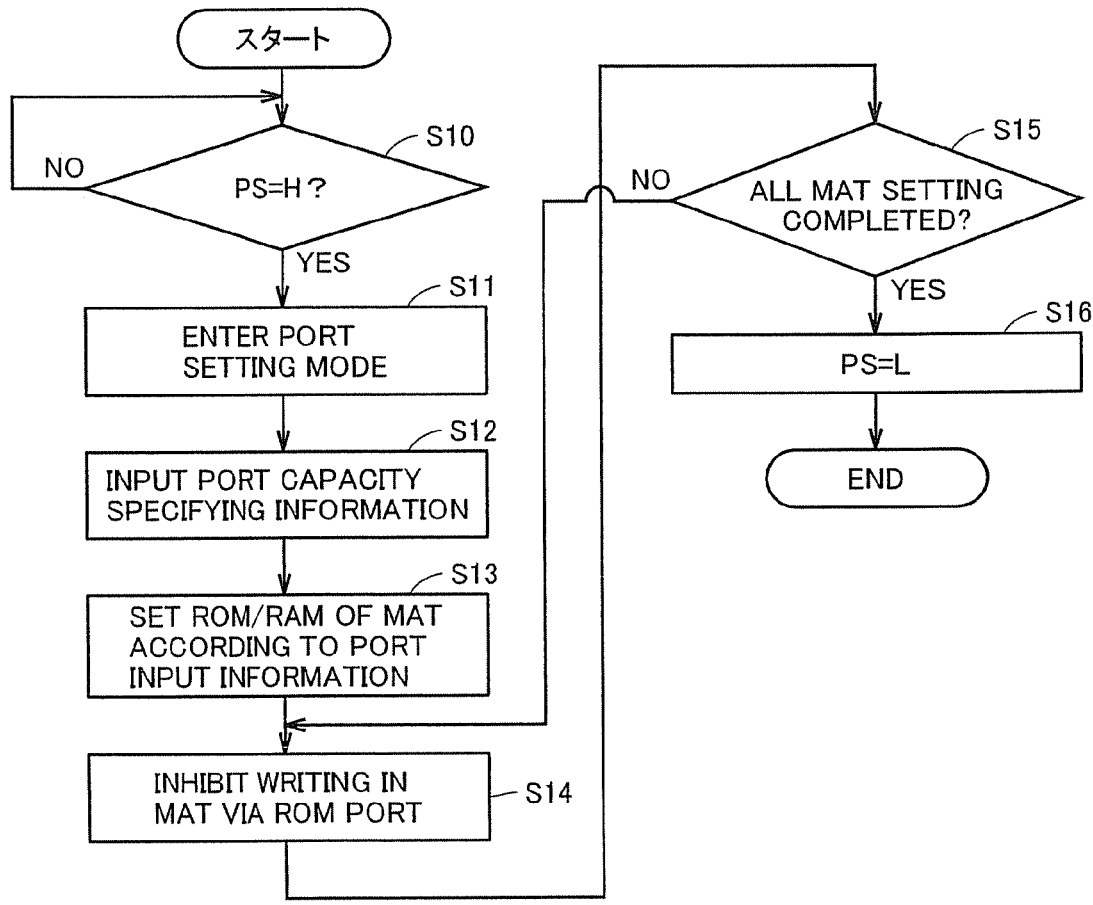
FIG. 28 is a flowchart illustrating an operation of the operational processing system shown in FIG. 27.

FIG. 28 is a flowchart representing a processing sequence for allocating the RAM and ROM regions of the nonvolatile RAM in operational processing system 230 shown in FIG. 27. Referring to FIG. 28, description will now be given on the sequence of the memory mat attribute allocation processing in the operational processing system shown in FIG. 27.

First, it is determined whether the port setting mode is designated or not (step S10). Operational processing circuit 200 performs this determination by determining whether port setting signal PS is asserted to the H level.

When port setting signal PS is asserted, operational processing circuit 200 determines that the port setting mode is set, and enters the port setting processing mode (step S11).

Then, external I/O device 235 supplies the information specifying the storage capacities of the ROM and RAM regions in nonvolatile RAM 203 (step S12). As this specifying information, I/O device 235 may supply the number of the memory mats forming the ROM region and the number of the memory mats forming the RAM region. Since the storage capacity of each memory mat is fixed, I/O device 235 may merely supply the information of the storage capacity values of the ROM and RAM regions in a dialog box displayed in a window on a screen.

Operational processing circuit 200 performs the setting of the ROM and RAM regions of the memory mats in nonvolatile RAM 203 according to the port setting input information. In this operation, when nonvolatile RAM 203 includes a memory mat that is not used according to the entered port capacity specifying information, this region is set to neither the ROM region nor the RAM region. This unallocated region is saved as a reserved region, or is used as a shadow RAM region that stores storage information of a low-speed storage device such as an external hard disk or a mask ROM. Usually, the shadow RAM region is not addressed and used by a user when executing a processing.

The writing of a required OS (operating system: basic software), a boot program for booting up the system, fixed control data and the like may be executed before setting the storage capacity in step S13, or may be executed after step S13.

After the required information is written in the ROM region, processing is performed to inhibit the writing in the memory mat set to the ROM region (step S14). In this operation, the write inhibit bit employed in the first embodiment may be set, or the register circuit may store the ROM/RAM attribute setting information, as is done in the fourth embodiment.

Then, it is determined whether the ports (ROM/RAM regions) for all the memory mats in the nonvolatile RAM are set or not, and it is also determined whether the write inhibition is set for all the memory mats in the ROM region (step S15).

When the setting of the RAM/ROM regions (ports) and the setting of the write inhibition of the ROM region (port) are completed for all the memory mats, the port setting mode ends, and external I/O device 235 or operational processing circuit 235 deasserts port setting signal PS (step S16). This port setting signal PS may be deasserted merely by clicking an end button on the display screen by I/O device 235 in response to processing completion display supplied from operational processing circuit 200. Also, in the case where a write device such as a ROM writer is used, the ROM writer may set the port setting signal PS to the L level in accordance with the completion instructing signal supplied from operational processing circuit 200.

By the series of processing described above, operational processing system 230 can selectively set the ROM and RAM regions in nonvolatile RAM 203, and can set the memory mat of the ROM region into the write inhibiting state.

Figure 29:
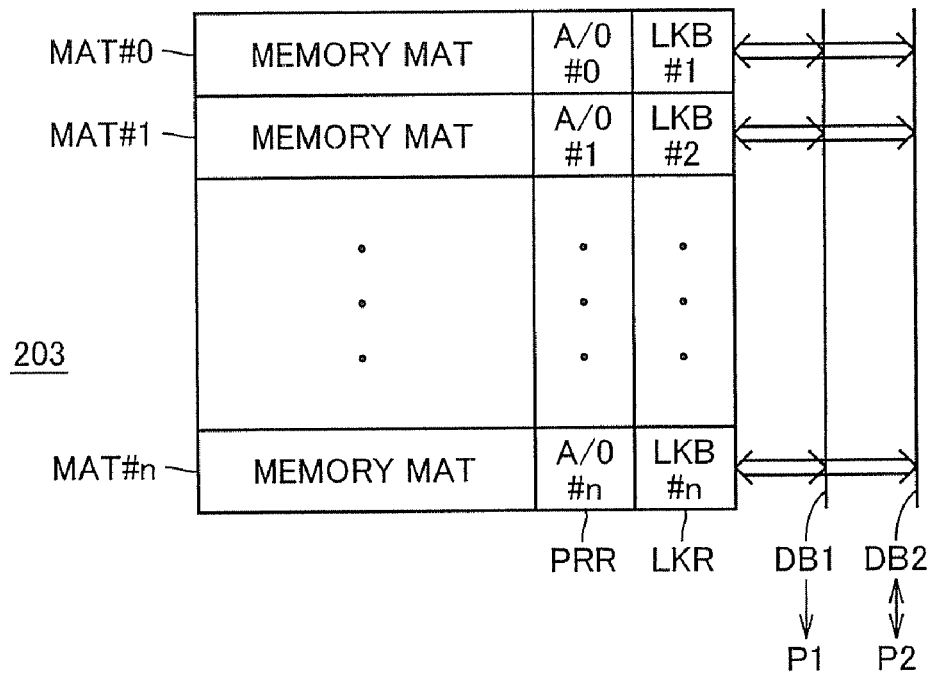
FIG. 29 schematically shows a construction of a nonvolatile RAM shown in FIG. 27.

FIG. 29 schematically shows an internal state of nonvolatile RAM 203 after completion of the port setting mode. Memory mats MAT#0-MAT#n are formed in the nonvolatile RAM, and ROM/RAM attribute designating bits A/O#0-A/O#n as well as write inhibiting bits LKB#1-LKB#n are set up in memory mats MAT#0-MAT#n, respectively. A ROM/RAM (port) attribute designating bit storage region PRP and a write inhibiting bit storage region LKR can be configured with the construction in the first embodiment, third embodiment or the like already described. According to the states of bits set up in these regions PRP and LKR, each of memory mats MAT#0-MAT#n is selectively coupled to data bus DB1 for port P1 and data bus DB2 for port P2. In this case, data bus DB1 may be set up for the ROM region, and may be configured to transfer the data in one-way direction. Alternatively, the construction in the fifth embodiment may be employed. Specifically, each of ports P1 and P2 may be coupled to the bidirectional data bus, these data buses DB1 and DB2 may be used as the bidirectional data buses, and each of memory mats MAT#0-MAT#n is connected to either of data buses DB1 and DB2.

[Modification]

Figure 30:
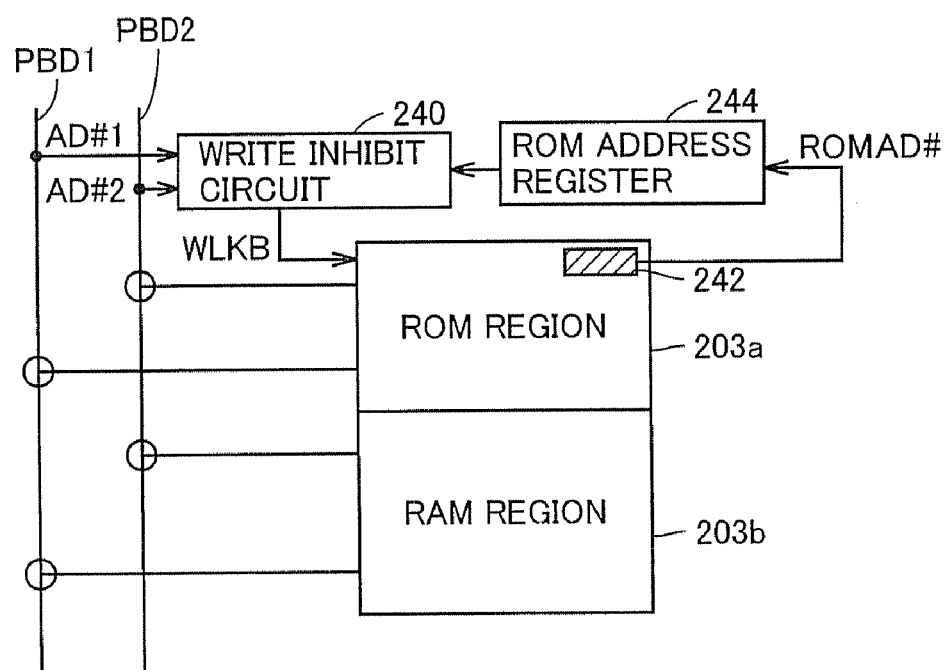
FIG. 30 schematically shows a construction of a modification of a sixth embodiment of the invention.

FIG. 30 schematically shows a construction of a modification of the nonvolatile RAM according to the sixth embodiment of the invention. In FIG. 30, nonvolatile RAM 203 includes memory mats allocated to ROM and RAM regions 203a and 203b after completion of the port setting mode, respectively. ROM region 203a stores address information ROMAD# designating the ROM address region at its specific address location. Each of ROM and RAM regions 203a and 203b is coupled to port buses PBD1 and PBD2. Port bus PBD1 is provided for port P1, and transfers control signals, addresses and data. Port bus PBD2 is provided for port P2, and likewise includes an address bus, a control bus and a data bus.

Addresses AD#1 and AD#2 on port buses PBD1 and PBD2 are compared with the addresses stored in an ROM address register 244. When the applied address signal designates ROM region 203a, a write inhibit signal WLKB is asserted to inhibit the writing in this ROM region 203a.

In the operation of booting up the system, ROM address register 244 reads and stores the ROM region address designating information ROMAD# stored in a specific address location (region) 242 of the ROM region. A write inhibit circuit 240 is formed of a comparison circuit, for example, and selectively asserts write inhibit signal WLKB according to a result of comparison.

In the construction shown in FIG. 30, each of ports P1 and P2 may be configured to be used as the ROM and RAM ports. Even in this configuration, the attribute of the memory mat is set to the ROM or RAM region, and write inhibit circuit 240 applies write inhibit signal WLKB to whole ROM region 203a, whereby the writing in ROM region 203a can be inhibited.

The write inhibit circuit 240 asserts write inhibit signal WLKB regardless of the data read/write mode, when an access is made to an address within a range designated by address information ROMAD# stored in ROM address register 244. Alternatively, write inhibit circuit 240 may be configured to perform the comparing operation and assert inhibit signal WLKB based on the result of comparison when the write mode is designated.

The construction for achieving the write inhibition in ROM region 203a may be the same as that in the fourth embodiment. Such write inhibiting circuit configuration is merely required to maintain the circuitry related to the writing in the memory cell array forming the memory mat included in ROM region 203a in the inactive state.

According to the construction shown in FIG. 30, the writing can be inhibited for whole ROM region 203a, and even when the size of this ROM region (i.e., size on the address space) changes, ROM address designating information ROMAD# stored in a specific region (address location) of ROM region 203a can be changed according to the set ROM capacity. Thus, it is possible to accommodate for such change in ROM size without difficulty.

According to the 6th embodiment of the invention, as described above, each memory mat is designated as the ROM region or RAM region in the initial setting operation of the nonvolatile RAM, and the write inhibit bit is set for the region designated as the ROM region for inhibiting the writing. Thereby, the initial setting can be reliably performed according to the sizes of the required ROM and RAM regions in the nonvolatile RAM.

Seventh Embodiment

Figure 31:
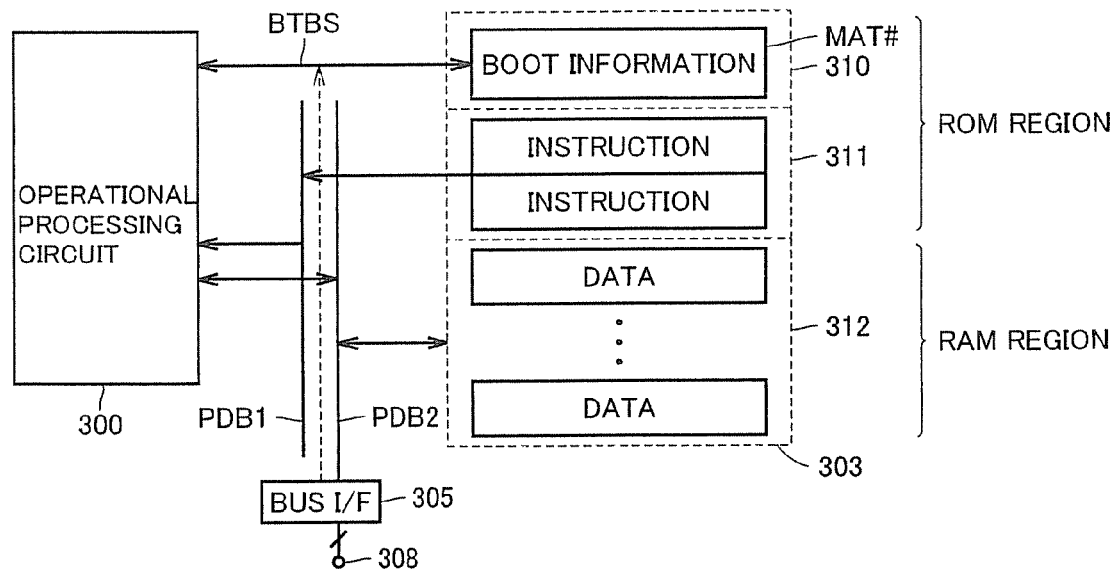
FIG. 31 schematically shows a construction of an operational processing system according to a seventh embodiment of the invention.

FIG. 31 schematically shows a construction of an operational processing system according to a seventh embodiment of the invention. In FIG. 31, in this operational processing system (semiconductor integrated circuit device), a port-1 data bus PDB1 for transferring instructions and a port-2 data bus PDB2 for transferring data are located between an operational processing circuit 300 and a nonvolatile RAM 303, and further a boot bus BTBS for transferring boot information is arranged between operational processing circuit 300 and nonvolatile RAM 303. Nonvolatile RAM 303 includes a boot region 310 for storing the boot information, an instruction region 311 for storing instruction/control data and a data region 312 for storing data. Boot region 310 and instruction region 311 are used as the ROM, and rewriting of the stored contents thereof is inhibited. Data region 312 allows rewriting of the stored data.

Similarly to the embodiment already described, memory mats MAT# are arranged in boot region 310, instruction region 311 and data region 312, and the numbers of memory mats MAT# included in these regions 310, 311 and 312 are variable within a range of the storage capacity of nonvolatile RAM 303.

Operational processing circuit 300 is formed of a processor or a microcontroller. Boot region 310 stores programs for booting up operational processing circuit 300 and the operational processing system, internal voltage tuning information for the nonvolatile RAM or operational processing circuit 300, failure-repairing information for memory cell redundant replacement of the nonvolatile RAM and a program required in booting up by the user. The boot information stored in boot region 310 refers to information required in a boot operation when booting up the system. Instruction region 311 stores information including program instructions such as an OS and basic software, control data of which values are fixedly set and are required for executing the programs.

Data region 312 stores application software and application data to be used temporarily, and intermediate data produced during execution of instructions.

Instruction region 311 and data region 312 are coupled to port-1 and port-2 data 44 buses PDB1 and PDB2, respectively. The port connection construction of instruction region 311 and data region 312 may be configured similarly to that in the fourth or fifth embodiment, and thus may be configured such that both instruction region 311 and data region 312 use port-1 and port-2 data buses PDB1 and PDB2.

Boot bus BTBS is normally connected to a boot ROM or the like, and operational processing circuit 300 is generally provided with a port for connection to such a low-speed boot ROM. Boot bus BTBS is coupled to boot region 310 of nonvolatile RAM 303.

Figure 32:
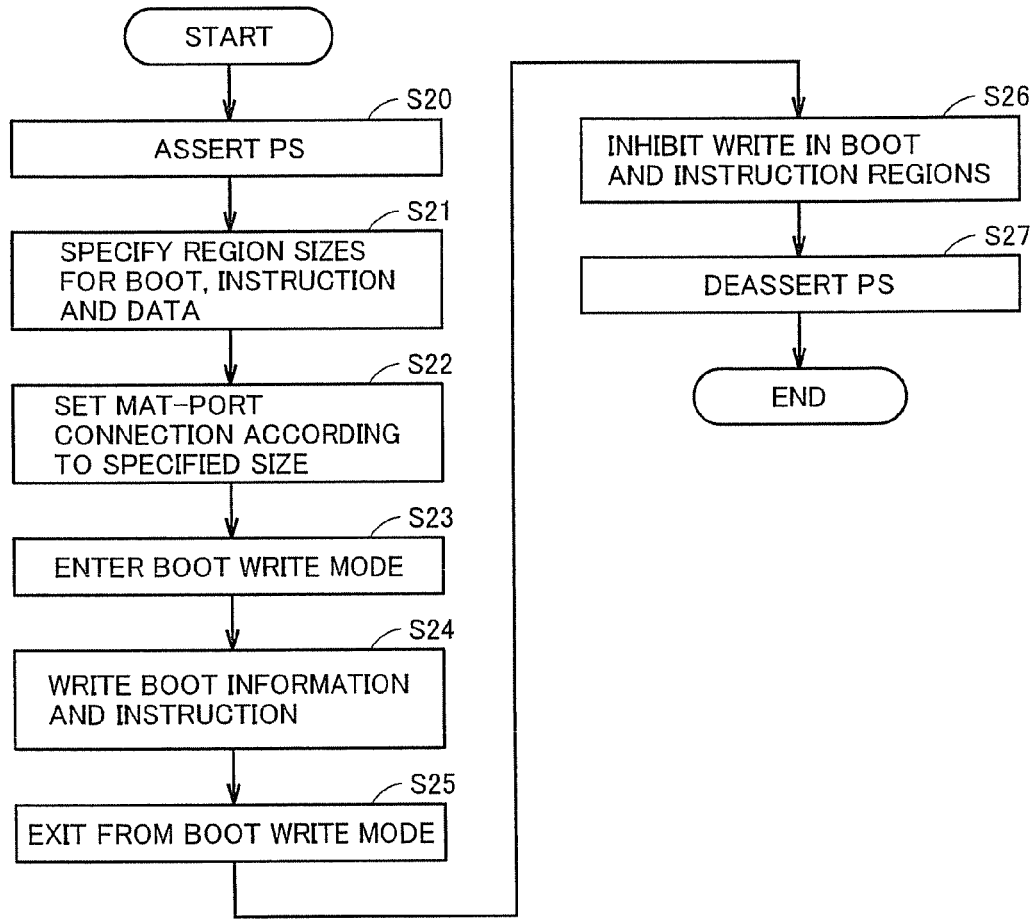
FIG. 32 is a flowchart representing an operation of a semiconductor integrated circuit device shown in FIG. 31.

FIG. 32 is a flowchart representing an example of boot information and instruction write sequence (initial setting sequence) in the operational processing unit shown in FIG. 31. Now, the operation for initial setting will be described with reference to the flow chart shown in FIG. 32.

First, the port setting mode is set by asserting port setting signal PS (see FIG. 27) in step S20.

Then, information is supplied via a bus I/F 305 for specifying the capacities of respective regions 310, 311 and 312 for the boot-up, instructions and data (step S21). In operational processing circuit 300, the address regions to be allocated to respective regions 310, 311 and 312 are set according to the information on the storage capacities of these regions, and the memory mats are allocated to the regions 310, 311 and 312 (step S22). Operational processing circuit 300 supplies the mat attribute information to each memory mat MAT# according to the allocation of the attribute of each memory mat, and sets the connection path of each memory mat (step S22). Thereby, when the port attribute is ascertained, boot region 310 is coupled to boot bus BTBS, instruction region 311 is coupled to port-1 bus (instruction bus) PDB1 and data region 312 is coupled to port-2 bus (data bus) PDB2.

In this state, the boot information is externally written via bus I/F 305 in memory mat MAT# of boot region 310, and the program instruction is externally written in instruction region 311 (step S23). When writing this boot information, the boot information input port included in bus I/F 305 may transfer the boot information from bus I/F 305 to boot bus BTBS, and the writing of boot information in the memory mat of boot region 310 may be performed under the control of an external circuit. Alternatively, in the operation of writing the boot information, operational processing circuit 300 may drive boot bus BTBS to write the boot information in boot region 310 under the control of operational processing circuit 300.

Required instruction writing is performed on each memory mat of instruction region 311. When the port attribute is fixed, the connection between the port and the memory mat is set, and the above instruction writing is performed via the port connected to instruction region 311, i.e., port-1 bus PDB1. When the port attribute is dynamically switched when executing the processing, any of ports P1 and P1 may be used for the instruction writing, but port-1 data bus PDB1 is preferably used for the instruction writing in view of compatibility with the port-fixed use.

When the writing of boot information and instructions is completed in step S24, the boot write mode is completed, and boot write mode exit is executed (step S25). After the boot write mode exits, data writing in boot region 310 via boot bus BTBS is inhibited.

Then, processing of inhibiting writing of data in boot and instruction regions 310 and 311 is executed (step S26). The data write inhibition for instruction region 311 may be performed utilizing the approach already described in connection with the first to fourth embodiments. The connection path to boot bus BTBS is set for boot region 310, and the write inhibition for boot region 310 is executed using boot bus BTBS. In nonvolatile RAM 303, for each of buses PDB1 and PDB2 for respective ports P1 and P2, an address bus and a control bus are provided so as to be shared among all memory mats MAT# in the nonvolatile RAM, in addition to internal data bus. Therefore, the storage of write inhibit bit in the memory mat of instruction region 311 may be performed using these internal control bus and address bus for port P1 or P2. For step S24 of writing the boot information and instructions, such a construction may be employed that the write inhibit bit is written in each of the corresponding memory mats after completion of writing of the boot information and instruction. A construction of inhibiting the writing in whole instruction region 311 may be employed, as is done in the sixth embodiment.

Instead of the above constructions and approaches, the write inhibition may be set according to the following processing. In step S22, operational processing circuit 300 merely sets the attribute allocation for each memory mat and each port, and the writing of the boot information and instruction is executed via port P1 or port P2. After completion of the writing of the boot information and instruction, the connection path is set between each memory mat and the ports, and then the writing in boot region 310 and instruction region 311 is inhibited. In this case, the bit for inhibiting the writing to each memory mat can be written and set up in the corresponding memory cell array via a particular bus. Thereafter, the port setting signal is deasserted in step S27, and the series of port setting processing is completed.

Due to provision of the special access port, i.e., boot bus BTBS, the system boot-up processing can be executed by reading the boot information via boot bus BTBS at high speed, as compared with the construction in which a boot ROM is employed and the boot information is loaded and executed via a low-speed local boot bus.

Figure 33:
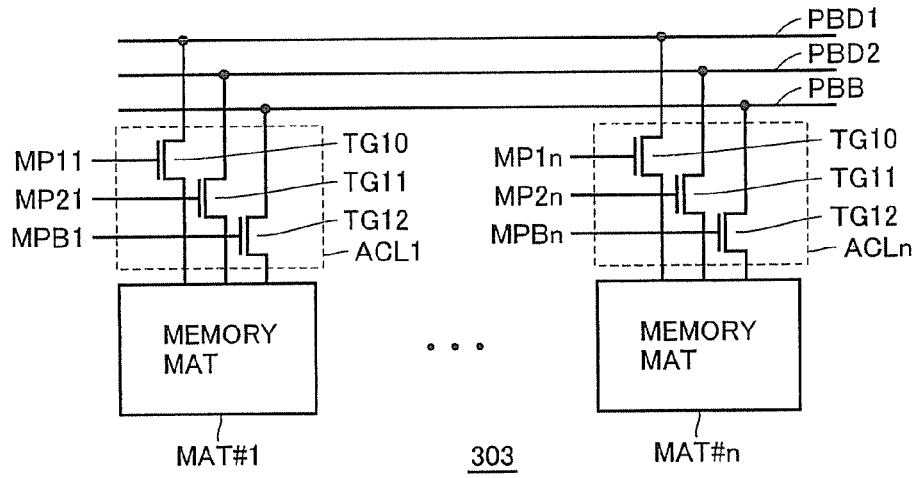
FIG. 33 schematically shows a construction of a connection setting portion of a memory mat in a memory system shown in FIG. 31.

FIG. 33 schematically shows an internal construction of nonvolatile RAM 303 shown in FIG. 31. Nonvolatile RAM 303 includes memory mats MAT#1-MAT#n, and access controllers ACL1-ACLn are arranged corresponding to these memory mats MAT#1-MAT#n, respectively.

Access controller ACL1 includes bus connection switches TG10, TG11 and TG12 receiving port connection control signals MP11, MP21 and MPB1, respectively. Via these bus connection switches TG10, TG11 and TG12, memory mat MAT#1 is selectively coupled to internal buses PBD1, PBD2 and PBB corresponding to ports P1 and P2 and the boot bus, respectively.

Access controller ACLn likewise includes bus connection switches TG10, TG11 and TG12 that are selectively turned on according to port connection control signals MP1n, MP2n and MPBn for memory mat MAT#n, respectively. Bus connection switches TG10, TG11 and TG12 of access controller ACLn can be turned on to couple memory mat MAT#n to internal buses PBD1, PBD2 and PBB, respectively.

These bus connection switches TG10, TG11 and TG12 couple the sense amplifier and the write driver included in corresponding memory mat MAT# to the designated internal bus according to the operation mode. Internal buses PBD1, PBD2 and PBB includes the address bus, control bus and data bus. In the data bus, the read data bus for transferring the read data may be separately provided from the write data bus for transferring the write data, or the common bus may be used for transferring the read data and the write data.

[Modification]

Figure 34:
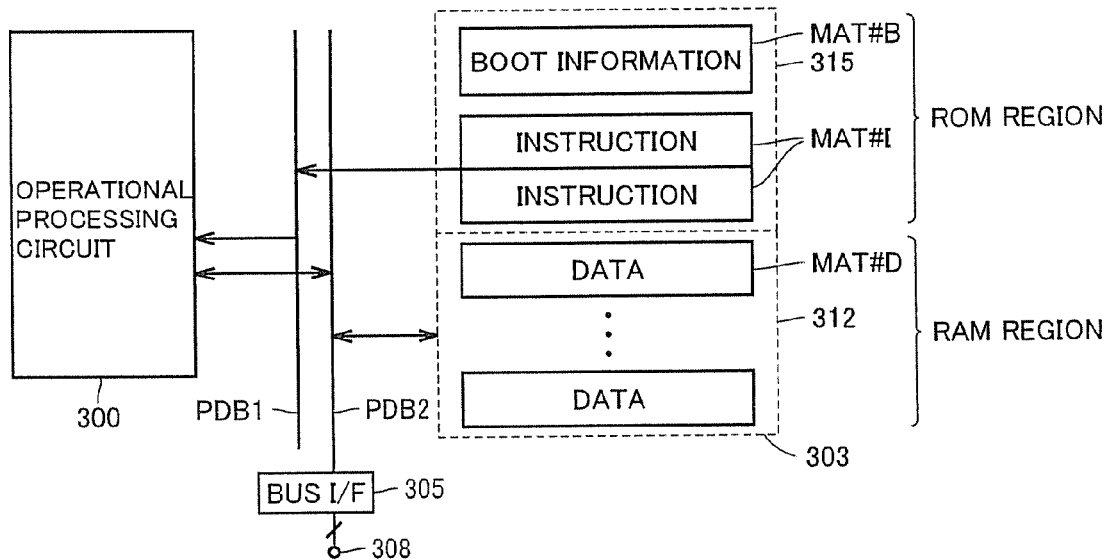
FIG. 34 schematically shows a construction of a modification of the seventh embodiment of the invention.

FIG. 34 schematically shows a construction of a nonvolatile RAM of a modification of the seventh embodiment of the invention. In FIG. 34, nonvolatile RAM 303 includes an instruction region 315 and data region 312. Instruction region 315 includes a boot memory mat MAT#B (i.e., memory mat for booting) for storing boot information and memory mats MAT#1 for storing instructions (including control data), and is used as the ROM region.

Data region 312 includes memory mats MAT#D for data storage, and is used as the RAM region.

Nonvolatile RAM 303 has substantially the same internal construction as those in the first to fourth embodiments already described. These regions 315 and 312 have variable sizes, and the number of memory mats MAT#B for storing boot information and the number of memory mats MAT#1 storing instruction and the number of memory mats MAT#D storing data are variable. The writing into the memory mat of ROM region 315 is inhibited.

Bus PDB1 for port P1 and bus PDB2 for port P2 are arranged between operational processing circuit 300 and nonvolatile RAM 303. A boot bus is not employed. Therefore, the boot information is transferred via bus PDB1 to operational processing circuit 300.

In the construction shown in FIG. 34, the boot information storage region is arranged in the same region as the region of storing the instructions. The nonvolatile RAM is a fast memory of e.g., an MRAM, and the instruction memory and the boot memory have the same high processing speed, and there is no need to provide a separate boot bus, and the bus construction can be made simple.

In the construction shown in FIG. 30, a bus interface circuit (I/F) 305 and an external terminal 308 are provided, and the boot information and instructions are written via the bus I/F 305. According to such construction, the writing of the boot information can be performed using the processing sequence employed in the sixth embodiment and shown in FIG. 28 as the write sequence.

In the construction shown in FIG. 34, bus PDB1 is used as the instruction bus for transferring instructions, and bus PDB2 is used as the bus for accessing the RAM region.

However, buses PDB1 and PDB2 each may be configured to transfer both the information of ROM region and the data of RAM region.

According to the seventh embodiment of the invention, as described above, the region for storing the boot information is ensured in the instruction region. Thus, the boot information can be transferred fast, and the system booting can be made fast. In the case of transferring the boot information via a dedicated boot bus, the memory system can be achieved in which a boot ROM is used to transfer the boot information at high speed to the microprocessor or microcontroller connected to the local boot bus without changing the port construction as described.

Eighth Embodiment

FIG. 35 schematically shows a construction of an operational processing unit 400 according to an eighth embodiment of the invention. In FIG. 35, operational processing unit 400 includes an operational processing circuit 402 and a nonvolatile RAM 404 for storing information required by operational processing circuit 402. Preferably, operational processing unit 400 is formed of a semiconductor integrated circuit device, and is integrated on a single semiconductor chip.

Nonvolatile RAM 404 is formed of two ports 411a and 411b, and a memory region 410 including ROM and RAM regions 410a and 410b arranged corresponding to ports 411a and 411b, respectively. ROM and RAM regions 410a and 410b include memory mats which are variable in number. Ports 411a is used as ROM information transfer port, and port 411b is used as a RAM port transferring the RAM information. Each of these ports 411a and 411b has a function of transferring information/signals. Nonvolatile RAM 404 has substantially the same internal construction as the nonvolatile RAM in the first to fourth and seventh embodiments already described.

Operational processing circuit 402 is a single-port processor or microcontroller, and has one port PRT. A port select circuit 406 is arranged between operational processing circuit 402 and nonvolatile RAM 404. According to a port setting signal PSS supplied from operational processing circuit 402, port select circuit 406 alternatively connects port PRT of the operational processing circuit to ports 411a and 411b of the nonvolatile RAM 400.

Operational processing circuit 402, nonvolatile RAM 404 and port select circuit 406 in operational processing unit 400 are preferably formed on the same semiconductor chip. Therefore, the chip layout may be implemented so as for nonvolatile RAM 404 to include port select circuit 406.

FIG. 36 represents an example of an access sequence of the operational processing device shown in FIG. 35. In FIG. 35, a clock signal (not shown) applied to operational processing circuit 402 likewise defines each cycle.

Memory region 410 in nonvolatile RAM 404 may be configured employing the construction in any one of the first to fourth embodiments.

In a cycle #1, the information in ROM region 410a is accessed and read. In this operation, operational processing circuit 402 designates port 411a by port designating signal PSS. Thereby, port select circuit 406 couples port PRT to port 411a, and data is read from ROM region 410a.

In a cycle #2, access to RAM region 410b is designated. According to port designating signal PSS, port select circuit 406 couples port PRT to RAM port 411b. The write/read of data is performed on RAM region 410b.

In a cycle #3, port designating signal PSS designates the access to ROM region 410a again. Thereby, port PRT is coupled to ROM port 411a, and the information is read from ROM region 410a.

In a cycle #4, no processing is performed (NOP state).

In cycles 5 and 6, port designating signal PSS designates RAM region 410b, and access (read or write) to required data is executed in each cycle.

Port designating signal PSS is similar to port attribute designating signal ROM/RAM# in the third embodiment. When the instruction or data is to be accessed according to the contents of processing, operational processing circuit 402 refers to the internal address table, monitors the region of the access requested address or a flag indicative of the attribute of the access request target that specifies the instruction/data, and sets the port setting signal.

As shown in FIG. 35, operational processing circuit 402 of the single port successively accesses nonvolatile RAM 404 having ROM ports 411a and 411b while setting the port by select circuit 406. Thereby, the bus construction in operational processing circuit 402 can be simple, and thereby the layout area of the buses for operational processing circuit 402 can be reduced so that the chip area of operational processing unit 400 can be reduced.

Operational processing unit 400 may be arranged on a printed board outside the non-volatile RAM, instead of the single semiconductor chip.

Ninth Embodiment

FIG. 37 schematically shows a whole construction of an operational processing unit according to a ninth embodiment of the invention. In FIG. 37, an operational processing unit 450 includes an operational processing circuit 460 having two ports PRT1 and PRT2, a nonvolatile RAM 470 having a single port 471 and a port select circuit 475 for selecting a connection port between operational processing circuit 460 and the nonvolatile RAM.

In nonvolatile RAM 470, memory region 410 includes ROM and RAM regions 410a and 410b. These ROM and RAM regions 410 and 410b have variable sizes similarly to the constructions already described in connection with the first to fourth and seventh embodiments.

Port select circuit 475 alternatively couples ports PRT1 and PRT2 of operational processing circuit 460 to a memory port 471 according to a port designating signal supplied from operational processing circuit 460. This port setting signal PSS merely designates or selects port PRT1 or PRT2.

FIG. 38 shows an example of an access sequence of the operational processing unit shown in FIG. 37. In FIG. 38, each cycle is defined by the clock signal defining the operation cycle of operational processing circuit 460.

In a cycle #1, read access from port PRT1 is performed, and port PRT2 requests RAM access in the same cycle. Port select circuit 475 selects different connection paths depending on the first and second halves of the cycle of the clock signal, respectively, and thereby establishes the access paths to memory port 471.

FIG. 38 represents an example of the processing sequence, in which port PRT1 is selected in the first half cycle of the clock signal, and port PRT2 is selected in the second half cycle of the clock signal. In nonvolatile RAM 470, therefore, the designated ROM information is read by accessing ROM region 410a in the first half of the cycle, and reading or writing of the RAM data is executed by accessing RAM region 410b in the second half of the cycle.

In a cycle #2, port PRT1 designates the ROM access, and port PRT2 does not request the access (NOP state). Port select circuit 475 selects port PRT1 in the first half of the cycle so that ROM region 410a is accessed in nonvolatile RAM 470, and the ROM data (information) is read out. In the second half of the cycle, the access to nonvolatile RAM 470 stops.

In a cycle #3, port PRT1 designates the access to the ROM region 410a, and port PRT1 likewise designates the access to ROM region 410a. In this case, memory port 471 continuously access ROM region 410a in the first and second halves of the cycle #3.

In a cycle #4, port PRT1 does not issue an access request (NOP state). Port PRT2 requests access to RAM region 410b. Therefore, the access to memory port 471 is not performed in the first half of cycle #4, and the access to RAM region 410b is performed in the second half of the cycle.

In a cycle #5, ports PRT1 and PRT2 designate the RAM access. In cycle #5, therefore, the access to RAM region 410b via memory port 471 is continuously performed in the first and second halves of the cycle.

In a cycle #6, the access to information/data to nonvolatile RAM 470 is not performed.

Port setting signal PSS changes its state according to the rising and falling of the clock signal defining the operational processing cycle, and thereby changes the connection path of port select circuit 475. Therefore, nonvolatile RAM 470 operates with a cycle time equal to half the cycle time of operational processing circuit 460. Port select circuit 475 is a kind of parallel-to-serial converter circuit (when viewed from the operational processing circuit).

In the case where the rising and falling of the clock signal define the starts of the operation cycles of ports PRT1 and PRT2, respectively, operational processing circuit 402 can internally execute the operational processing in a pipelined fashion, using the information/data of ports PRT1 and PRT2.

FIG. 39 schematically shows a construction of nonvolatile RAM 470 shown in FIG. 37. In nonvolatile RAM 470 shown in FIG. 39, memory region 410 includes a plurality of memory mats MAT#1-MAT#n, and write inhibit circuits PHBT1-PHBTn arranged corresponding to memory mats MAT#1-MAT#n, respectively. Write inhibit circuits PHBT1-PHBTn inhibit writing into corresponding memory mats MAT#1-MAT#n when corresponding memory mats MAT#1-MAT#n are designated as the ROM region. Write inhibit circuits PHBT1-PHBTn may be configured employing the constructions already described in connection with the first to fourth and seventh embodiments.

Memory port 471 includes an input/output circuit 471b coupled to a node 471a, and an internal bus 471c coupled commonly to memory mats MAT#1-MAT#n. Internal bus 471c includes buses transferring the addresses, control signals and data, respectively.

In the operational processing unit, port select circuit 475 and nonvolatile RAM 470 are integrated on the same semiconductor chip, and therefore, node 471a is implemented merely by an on-chip interconnection line (s).

In nonvolatile RAM 470, as shown in FIG. 39, memory mats MAT#1-MAT#n in memory region 410 are commonly coupled to internal bus 471c, and a construction for switching or selecting the bus connected to the memory mat is not required. Therefore, when the nonvolatile RAM has a single-port configuration, its internal construction can be made simple, and a construction for switching the bus connection is not required so that the layout area can be small.

In the construction employing a single-port nonvolatile RAM and a multi-port processor (operational processing circuit) that differ in number of ports from each other, the single port of the memory can be used as any of the ROM port and the RAM port by using port select circuit 475. Accordingly, the data/information can be transferred efficiently while maintaining the port compatibility, and the processing efficiency can be improved.

The nonvolatile RAM has the single-port construction, and does not internally require a construction for selecting the port of the memory mat, so that the circuit construction can be simple, and the chip layout area can be small.

Memory mats MAT#1-MAT#n and write inhibit circuits PIBT1-PIBTn may be configured employing the constructions already described in connection with the first to fourth and seventh embodiments.

Tenth Embodiment

FIG. 40 schematically shows a construction of a memory system for an operational processing system according to a tenth embodiment of the invention. In FIG. 40, a nonvolatile RAM 500 is coupled to an internal bus 503. Nonvolatile RAM 500 includes an instruction region (ROM region) 501 and a data region (RAM region) 502. These instruction and data regions 501 and 502 have variable sizes similarly to the first to eighth embodiments, and are configured such that the attribute (ROM/RAM region) of each memory mat or each I/O block can be set independently of the others.

A ROM cache 510 is arranged between internal bus 503 and a ROM port 511. A cache controller 512 is arranged for ROM cache 510. Cache controller 512 controls the access to ROM cache 510 according to an access request that is supplied from the operational processing circuit (not shown) via an instruction bus. A RAM cache 515 is arranged between internal bus 503 and a RAM port 519 coupled to the data bus. A cache controller 517 controls the operation of RAM cache 515. RAM cache controller 517 controls the access to the RAM cache according to the access request supplied via RAM port 519.

ROM cache 510 and RAM cache 515 are each formed of an SRAM (Static Random Access Memory) or a nonvolatile RAM (e.g., MRAM) of small storage capacity, and cache the data required by an external operational processing circuit. In addition to nonvolatile RAM 500 allowing fast access, ROM and RAM caches 510 and 515 are arranged and coupled to different ports, respectively. Thus, ROM and RAM ports 511 and 519 can be accessed concurrently, and the required information and data can be transferred fast and efficiently.

These ROM and RAM caches 510 and 515 have small storage capacities, and therefore, loads on internal signal lines can be small, and decoding of the address can be simple due to the small storage capacities. Thus, the data can be transferred faster. Accordingly, the fast access of this memory system can be achieved, similarly to the construction that uses first and secondary caches in a processor system, for example.

Figure 41:
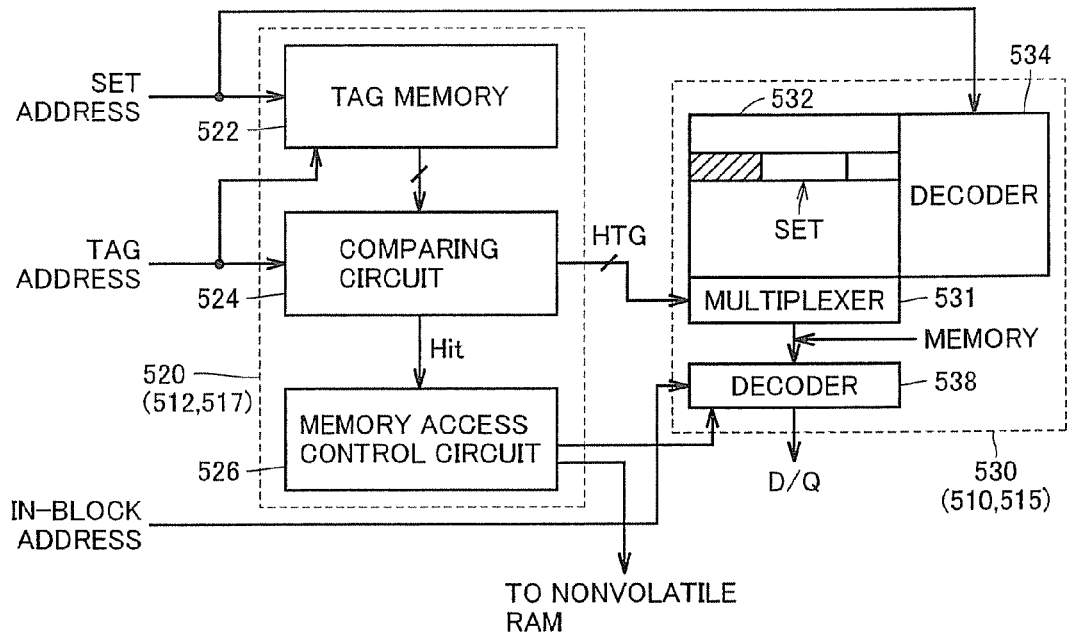
FIG. 41 shows by way of example a cache controller and a cache memory shown in FIG. 40.

FIG. 41 schematically shows constructions of caches 510 and 515 as well as cache controllers 512 and 517 shown in FIG. 40. ROM cache 510 and RAM cache 515 have the same internal construction, and In FIG. 41, a cache memory 530 is shown representing these cache memory collectively as a memory. Cache controllers 512 and 517 operate according to different processing sequences in response to occurrence of a write miss, respectively, but have the same block construction. Therefore, cache controllers 512 and 517 are generically represented by a cache controller 520.

In the cache system, mapping between the cache memory and the main memory (instruction region 501 and data region 502) is generally performed in a direct mapping scheme or a set associative scheme. FIG. 41 shows, by way of example, the cache construction employing the set associative scheme as the mapping scheme. In this set associative scheme, the corresponding main memory (instruction region 501 and data region 502) are divided into a plurality of column blocks, and a tag memory 522 stores the address of the data block cached in the cache memory for each column block. In tag memory 522, a plurality of sets of cache memory are provided. In each column block of the main memory, the data in the regions of the plurality of sets are cached. The number of the sets and the size (cache block size) of the data block specified by the tag address depend on the storage capacity of cache memory 530 or a cache hit rate.

The set corresponds to a so-called word line address in the memory cell array of cache memory 530. The address of the memory cell in the main memory is formed of the tag address, set address and column in-block address.

In FIG. 41, cache controller 520 includes a tag memory 522 for storing a tag address of data cached in cache memory 530, a comparing circuit 524 for comparing the address read from tag memory 522 according to the set address with an applied tag address, and a memory access control circuit 526 for controlling the access of cache memory 530 according to a signal Hit indicative of a match/mismatch result of comparing circuit 524.

When tag memory 522 has not stored the applied tag address, i.e., when the cache memory has not stored the access-requested data, memory access control circuit 526 temporarily inhibits the access to cache memory 530, and accesses the corresponding region of the nonvolatile RAM to transfer and store the access-requested data block to and in the cache memory. In parallel with this storage, memory access control circuit 526 allows the access to the access-requested data.

Comparing circuit 524 produces a signal group HTG indicating match/mismatch for each column block included in the set address, and asserts signal Hit indicative of the cache hit when one of cache hit signal groups HTG indicates the matching. Therefore, when cache memory 530 has stored the data at the address externally requested by the operational processing circuit, cache hit signal Hit is asserted, and the corresponding data is read from cache memory 530 (in the case of read access).

In each set, cache memory 530 includes a data array 532 for storing data for each column block, a decoder 534 that decodes the set address to select the set designated by the set address in data array 532, a multiplexer 536 that selects the hit column block from the selected set according to cache hit signal group HTG supplied from comparing circuit 524, and a decoder 538 that selects the data from the column block selected by multiplexer 536 according to the in-block address indicating the memory cell location in the column block and supplied from the operational processing circuit. For example, when this column block is a 64-bit data block, decoder 538 selects the data of the bit width used by 8-bit or 16-bit operational processing circuit.

Tag address is also supplied to tag memory 522. When a cache miss occurs, this tag address is replaced with the tag address of the set in the column block indicated by the tag address in tag memory 522. This replacement of the tag address is executed, e.g., according to LRU logic, in which the least recently used tag address is selected to be replaced.

When ROM cache 510 caches an instruction, this instruction is usually executed sequentially according to a count of a program counter except for the case of branching processing. In this case, therefore, ROM cache 510 is merely required to store instructions one by one. Cache controller 512 is merely required to have a function of prefetching the instruction in instruction region 501, and is not particularly required to perform the cache processing. Therefore, in the case of the instruction cache, for which construction will be described later, cache controller 512 for ROM cache 510 merely uses ROM cache 510 as an FIFO buffer, and successively transfers the data to the operational processing circuit in accordance with access requests when the instruction ROM cache becomes full. In addition, when the address of the ROM cache advances a predetermined number and the predetermined number of instructions are consumed, cache controller 512 accesses RAM region 501 again, and transfers the instructions to the consumed address region of the ROM cache. Thus, cache controller 512 will perform the data transfer corresponding to the cache block size at a time.

In this tenth embodiment, however, such a case is also assumed that both cache controllers 512 and 517 determine hit/miss of cache, and the ROM port is used as a port for transferring data other than the sequentially accessed instructions.

Figure 42:
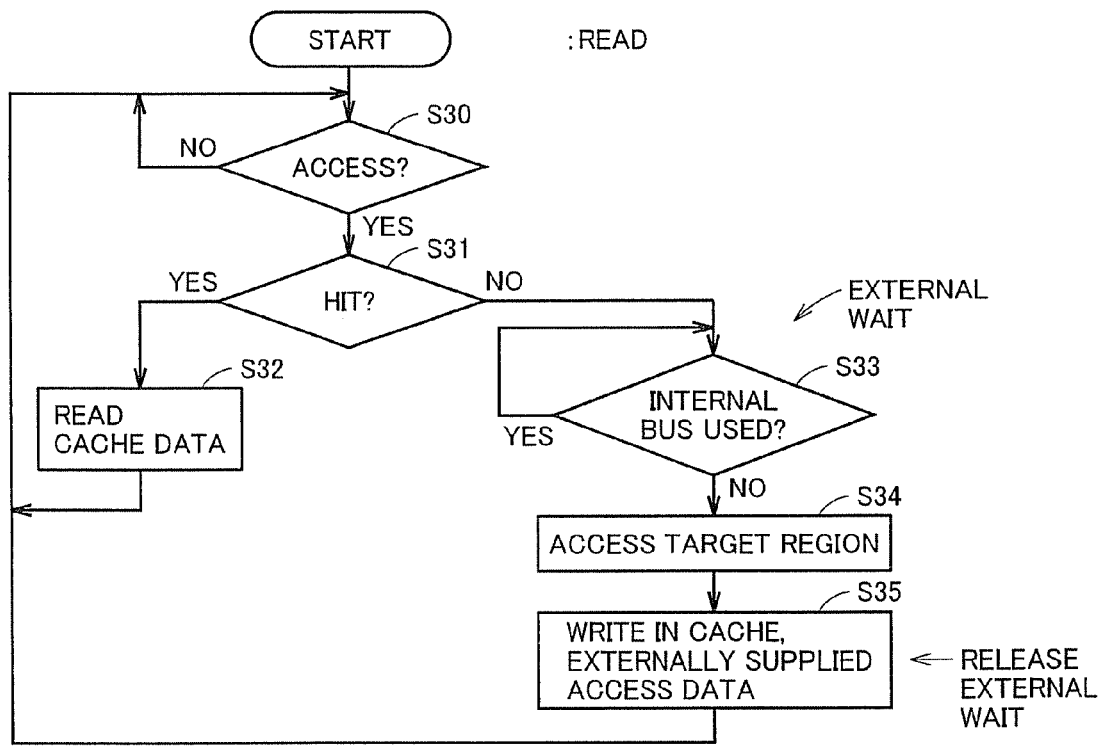
FIG. 42 is flowchart representing operations of the cache memory and the cache controller shown in FIG. 41.

FIG. 42 is a flowchart representing operations for data reading of cache memory 530 and cache controller 520 shown in FIG. 41. Referring to FIG. 42, description will now be given on the operations of cache memory 530 and cache controller 520 shown in FIG. 41. In the following description, when the cache target region is the RAM region, the cache memory returns the data back to the nonvolatile RAM to execute the writing of the cache data. When the cache target region is the ROM region, an operation is merely performed to read cache block data including the access-requested data from the ROM region, and is written in the cache memory.

First, it is determined whether the access is externally requested (step S30). This determination is performed according to the control signal (e.g., access instructing signal EN#) not shown in FIG. 41. This step S30 is repeated until the access request is made, and the system waits for issuance of the data request.

When the access request is issued, tag memory 522 selects the corresponding set according to the set address, and reads the tag address for each column block included in the corresponding set. Comparing circuit 524 compares in parallel the tag address and the tag addresses for the respective blocks read from tag memory 522, determines the match/mismatch for the respective column blocks and produces cache hit signal group HTG and cache hit signals Hit.

According to cache hit signal Hit, memory access control circuit 526 determines cache hit/miss (step S31).

In the case of the cache hit, cache memory 530 operates to read the data of the column block including the applied tag address by decoder 534 and multiplexer 536 according to the set address and cache hit signal group HTG. Then, decoder 538 is activated by memory access control circuit 526 to read the data from the column block selected according to the applied in-block address and transfer the data to the external port (ROM or RAM port) in step S32.

Conversely, when it is determined in step S31 that the cache miss occurs, access control circuit 526 sets an external to a wait state, and determines whether internal bus 503 (see FIG. 40) is being used or not (step S33). When the internal bus is being used, the access to the internal bus is put in a wait state, and access control circuit 526 waits for the released state of the internal bus.

When the internal bus is not being used, cache controller 520 accesses the target region (ROM or RAM region), and the stored information is read from the memory cells in the column block designated by the applied address (set and tag addresses) in step S34. In this operation, the data of the cache block size is read in parallel from the corresponding region, and is written in cache memory 530. Also, the transferred access data in the block is selected according to the in-block address, and is externally output (step S35).

When the data is transferred between cache memory 530 and the corresponding ROM or RAM region in the data read mode, the cache system of the copy-back type operates such that an old cache data block is returned from the cache memory to the corresponding ROM/RAM region, and then the data to be accessed is read from the ROM/RAM region, and is transferred to cache memory 530.

Specifically, in the cache system of the copy back scheme, the data in the corresponding block is selected in the cache memory, e.g., according to the LRU logic (in which the cache data block of the least recently used tag address is selected), and is written back in the corresponding region of the nonvolatile RAM (i.e., the address region designated by the selected set address and tag addresses in the ROM/RAM region), and then the data reading is executed according to the access-requested memory address. The column block can be specified by the value of the tag address. In one column block, the tag address is incremented by the number of column blocks.

The cache system of the copy-back scheme may be configured as follows. A dirty bit is used and monitored, and it is determined whether writing of cache data is performed or not. When the dirty bit in the block to be returned back does not indicate the writing, the data block is not returned back, and the data block in the target region is transferred from nonvolatile RAM to cache memory 530.

In the cache system of a write-through scheme, when the contents of the cache memory are rewritten, the storage data/information in the corresponding region of the nonvolatile RAM is rewritten in parallel with the writing into the cache. Since coherency of the cache is always maintained, the replacement target data block is not transferred from the cache memory to the nonvolatile RAM. In tag memory 522, the tag address is updated according to, e.g., the LRU logic to register a new tag address, and the data block is read from the access target region in the nonvolatile RAM, and is stored in the region where the replacement target block of the cache memory is stored.

When writing the data of the cache block size in cache memory 530, tag memory 522 stores a new tag address supplied from the operational processing circuit, the corresponding hit signal in the hit signal group HTG supplied from comparing circuit 524 attains the hit state and multiplexer 536 stores the data transferred from the memory (target region) in the corresponding region. In this operation, decoder 534 selects the data of the transferred data cache block size, and the access-requested data in the cache block size data is selected and read. The cache block size is usually the size of the data block that is transferred between the nonvolatile RAM and the cache in one transfer cycle, and depends on the bit width of internal data bus 503 between the cache and nonvolatile RAM. However, the size of the cache block may be an integer multiple of the bus width of internal data bus 503, and the data of the cache block size may be transferred between cache memory 530 and the nonvolatile RAM by performing the transference a plurality of times.

When cache memory 530 is ROM cache 510 and a cache read miss occurs, the data block including the access-requested data in ROM region 501 is read and transferred to the ROM cache, and the data is not returned method). This is because the write access to ROM cache 510 is not performed.

Figure 43:
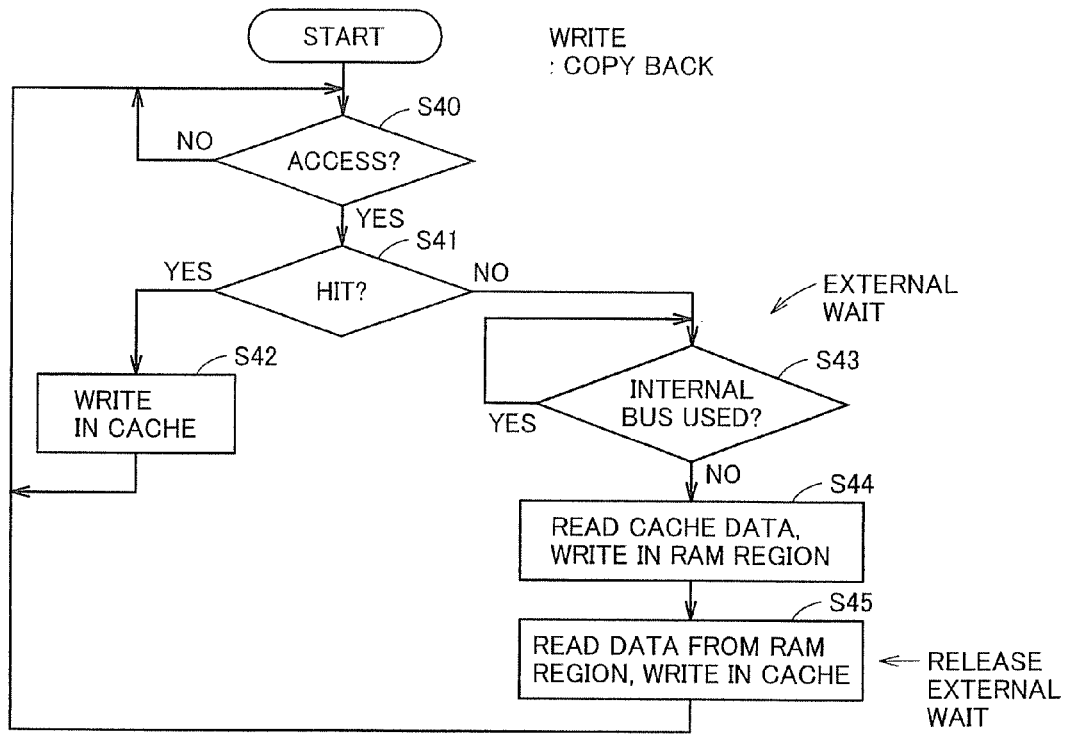
FIG. 43 is a flowchart representing an operation during data writing performed in a copy-back scheme by the cache controller shown in FIG. 41.

FIG. 43 represents an operation in the copy-back scheme for data writing of cache controller 520 and cache memory 530 shown in FIG. 41. Referring to FIG. 43, description will now be given on the cache operation in the data write operation of the copy-back scheme. In this description, the write access requesting the data writing is not performed on the ROM cache, and is performed only on the RAM cache. In the following description, it is described that the access target region of the nonvolatile RAM is the RAM region.

In a step S40, a control signal (not shown) is monitored to determine whether an access request to cache memory 530 (i.e., request for access to nonvolatile RAM) is issued or not.

When the access request is issued, determination of cache hit/miss is performed according to the set address and the tag address (step S41). In the case of the cache hit, cache memory 530 stores the access-requested data, and the supplied write data is written at the corresponding location of cache memory 530 (step S42). Then, the process returns back to step S40.

In the case of the cache miss, a wait state to the external is first set, and it is determined whether internal bus 503 is being used or not (step S43). When internal bus 503 is being used, the system waits for the released state of the bus. When internal bus 503 is not being used, the data of the cache block size that is selected, e.g., according to the LRU logic is read from cache memory 530, and is written in the corresponding region of the RAM region (step S44). The reading of the data of the cache block size in this operation of return back of data from cache memory 530 to the RAM region may be performed concurrently with step S43 of determining the occupation of the internal bus.

Then, the data of the cache block size including the access-requested data in the RAM region of the nonvolatile RAM is read according to the set address and tag address supplied from the operational processing circuit, and is written in cache memory 530. Also, the externally supplied write data is written concurrently in cache memory 530 according to the in-block address (step S45). When the writing is completed, the wait state to the external is released, and the process returns back to step S42 for waiting for the nest access request.

Therefore, when the cache write miss occurs, the copy-back scheme requires, similarly to the case of the read miss, the steps of temporarily transferring the old data stored in the cache memory to the RAM region, and then writing the data of the cache block size including the access-requested data in cache memory 530 from RAM region.

Figure 44:
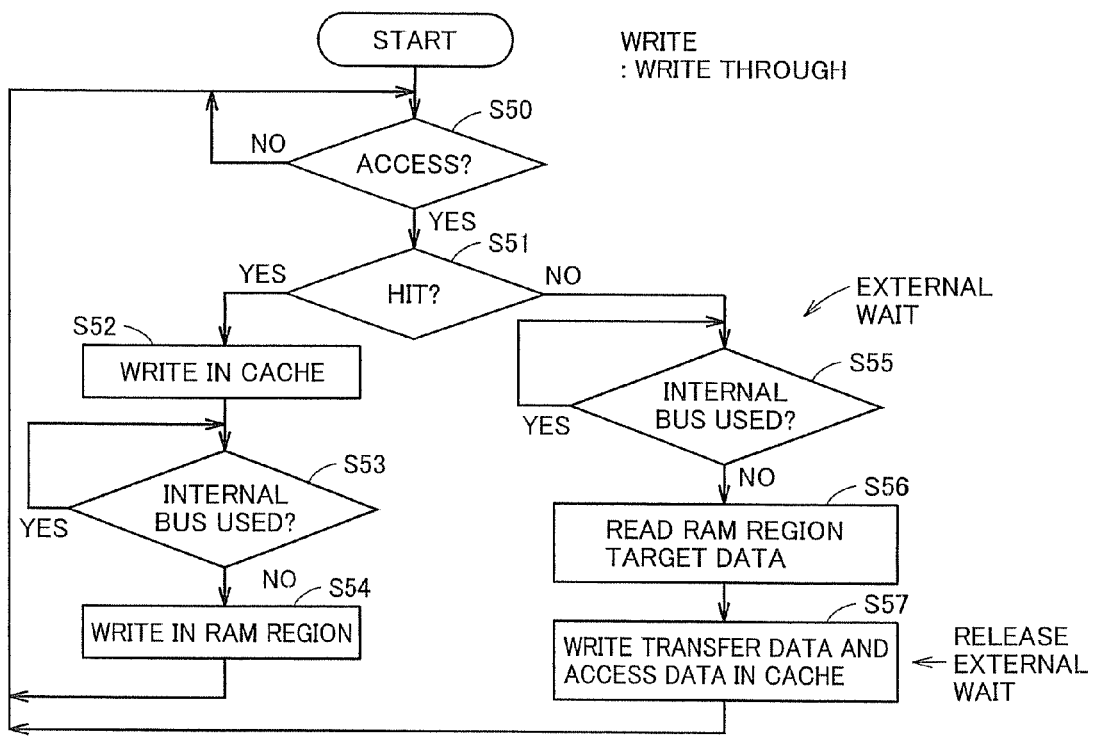
FIG. 44 is a flowchart representing an operation during data writing in a write-through scheme performed by the cache controller shown in FIG. 41.

FIG. 44 is a flowchart representing operations for data writing in the write-through scheme of cache memory 530 and cache controller 520 shown in FIG. 41. Referring to FIG. 44, description will now be given on the operations of the cache controller and the cache memory shown in FIG. 41.

Similarly to the copy-back scheme, it is determined in step S50 whether the access request is issued or not. When the access request is issued, it is determined in next step S51 whether the cache hit occurs or not. Comparing circuit 524 shown in FIG. 41 performs this determining operation by making a comparison with the tag address read from tag memory 522, similarly to the cache operation already described.

When the cache hit occurs, decoder 538 and multiplexer 536 shown in FIG. 41 select the write location according to the cache hit signal group HTG and the in-block address, and the data is written at the selected write location in cache memory 530 (step S52).

It is also determined whether internal bus 503 is being used or not (step S53). When the internal bus is not being used, the supplied write data is written in the corresponding region of the RAM region (step S54). Therefore, when the write data is written in the cache memory, the write data is written in parallel at the corresponding access-requested memory location of the RAM region. Therefore, the data stored in cache memory 530 normally match with the corresponding data in the RAM region, and the cache coherency is ensured.

In the copy-back type, return of the data of a cache block size may be selectively performed according to the on/off state of the dirty bit indicating the rewriting of data, whereby the penalty at the time of write miss can be reduced. (When the dirty bit is on and the data rewriting is indicated, the data block is returned back to the RAM block.) However, in the write-through scheme, the coherency of data between the cache memory and the RAM region is always ensured, whereby the dirty bit is not required, and the cache system can have a simple construction. Since the return back of cache block data to the RAM region is not performed in any case, the penalty at the time of write miss can be reduced. (The writing of write data in the RAM region is executed in parallel with the access to the cache memory, and the cache access conceals the writing into the RAM region.)

When it is determined in step S51 that the cache miss occurs, it is then determined whether the internal bus can be used or not (step S55). When the internal bus is empty, the target data in the RAM region is read (step S56), is transferred to cache memory 530 and is written together with the externally supplied write data and the data transferred from the RAM region at the corresponding location of the cache memory (step S57). After this writing, the wait state to the external is released, and the process returns to the step S50 for waiting for the access request.

Therefore, the following operation is allowed by employing the cache memory for both the RAM and ROM regions. Thus, when the cache miss occurs and the data of the cache block size is being internally transferred to the target region of the nonvolatile RAM, the other port can access the data/information according to the cache hit, and therefore the penalty upon the cache miss can be reduced.

When the operational processing system is a semiconductor integrated circuit device, the internal data bus between the ROM cache and the RAM cache is an on-chip interconnection lines. Therefore, in contrast to the case of employing an external discrete cache memory, no restriction is imposed due to pin terminals. Therefore, the bit width of the cache data transfer bus (internal data bus 503) can be readily set to the cache block size, and the cache block size can be set to a desired size. Accordingly, it is possible to reduce the time required for data transfer at the time of cache miss, and the fast cache system can be achieved.

According to the write-through scheme, the data written in the RAM region differs in bit width from the cache block transferred from the RAM region to the cache memory at the time of cache miss. When the MRAM is used as the nonvolatile RAM, however, the write column select gate is provided separately from the read column select gate. Thus, a construction can be readily implemented in which the write operation is performed an external data bit width at a time, and the read operation is performed by selecting collectively the data of the cache block size for reading. (In this read operation, a predetermined number of low-order bits of the column address are set to a degenerated state to make the read data bit width larger than the write data bit width, or the numbers of bit lines simultaneously selected by the write column select line and the read column select line are changed from each other.)

In the construction in which a write column select gate and a read column select gate are formed of a common gate, the memory cell addresses (tag, set and in-block addresses) are all made valid in the data write operation. Further, in the data read operation, only the data addresses (set and tag addresses) of the cache block size are made valid, and the in-block address of the memory cell is set to the degenerated state. Thereby, the data of the cache block size can be simultaneously read.

Figure 45:
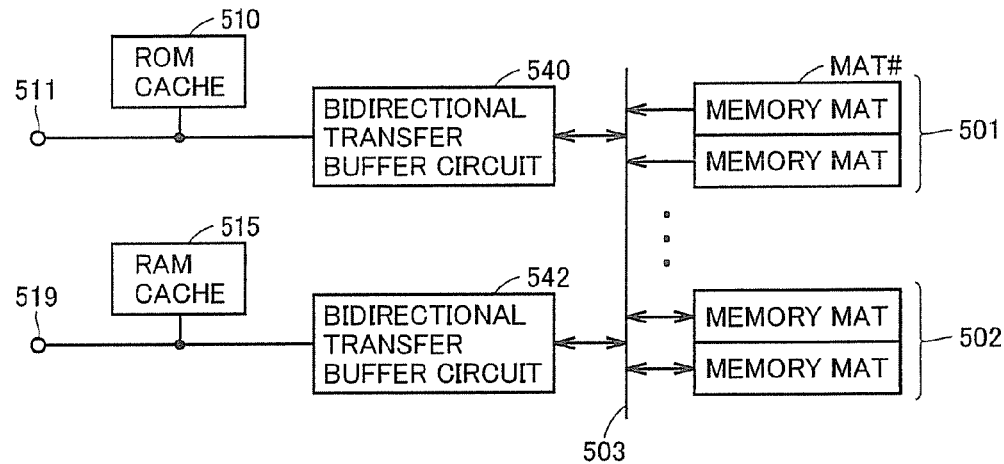
FIG. 45 schematically shows a construction of a portion for transferring data between a cache and a memory mat in the tenth embodiment of the invention.

FIG. 45 specifically shows a construction of a port for performing data transfer between ROM and RAM caches 510 and 515 and ROM and RAM regions 501 and 502 according to the tenth embodiment of the invention.

In FIG. 45, a bidirectional transfer buffer circuit 540 is arranged between ROM cycle 510 and internal bus 503, and a bidirectional transfer buffer circuit 542 is arranged between RAM cache 515 and internal bus 503.

Each of ROM region 501 and RAM region 502 includes one or more memory mats MAT#, which are commonly coupled to internal bus 503.

Bidirectional transfer buffer circuits 540 and 542 are employed for preventing collision of data on internal bus 503. Bidirectional transfer buffer circuit 540 isolates the data bus coupled to ROM port 511 from internal bus 503, and bidirectional transfer buffer circuit 542 isolates RAM port 519 from internal bus 503. Thus, when cache hit or miss occurs for ROM cache 510 or RAM cache 515, such a situation can be prevented that the ROM cache data and the RAM cache data are transmitted concurrently to internal data bus 503. Therefore, accurate transfer (internal transfer and external transfer) of the cache data can be achieved.

Cache controllers 512 and 517 may execute the transfer operation control for bidirectional transfer buffer circuits 540 and 542, and alternatively, bidirectional transfer buffer circuits 540 and 542 may be arranged in cache controllers 512 and 517 for such control, respectively. Alternatively, bidirectional transfer buffer circuits 540 and 542 may be provided in ROM and RAM caches 510 and 515, respectively. Bidirectional transfer buffer circuits 540 and 542 may be provided in the nonvolatile RAM, and the control circuit in the nonvolatile RAM may execute the transfer operations thereof.

In the transfer operation, bidirectional transfer buffer circuits 540 and 542 include the latch circuits and the transfer buffers of the same bit width as internal bus 503, and execute the latching and buffering of the transfer data transferred between the cache and the memory mat of the nonvolatile RAM. The data transfer from the cache to the RAM region is performed by latching the cache block data read from the cache, and then transferring the latched data block to the memory mat in the RAM region. In the operation of transferring the data from the RAM or ROM region to the cache, bidirectional transfer buffer circuit 540 or 542 executes the latching of the data read from the memory mat as well as the transfer of the latched data to the ROM/RAM cache.

Bidirectional transfer buffer circuit 540 is arranged for ROM cache 510, and performs the latching of the data read from the ROM region as well as the transfer of the latched data to the ROM cache during the operational processing in the actual operation. For writing the initial information, bidirectional transfer buffer circuit 540 is arranged, and supports the bidirectional data transfer function for the ROM region.

Bidirectional transfer buffer circuits 540 and 542 are arranged such that all the components forming the cache system are integrated on the same semiconductor chip, and the arranging position or layout of a specific circuit for implementing a function block is appropriately determined in view of the utilization efficiency of the chip area.

[Modification]

Figure 46:
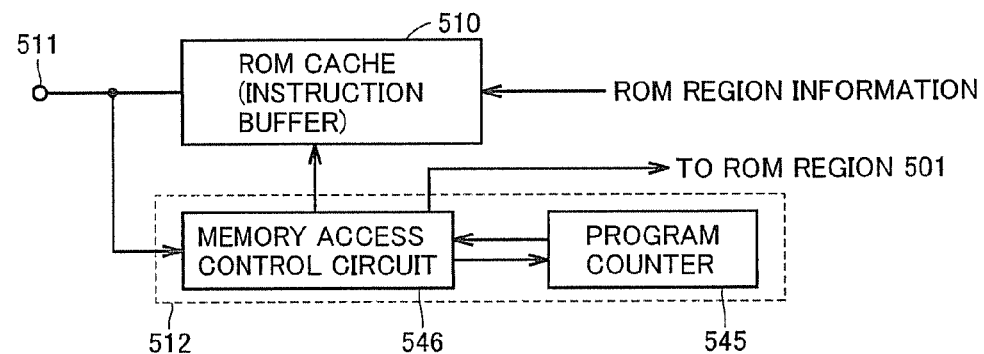
FIG. 46 shows an example of a construction of an ROM cache controller of a modification of the tenth embodiment of the invention.

FIG. 46 schematically shows a construction of ROM cache controller 512 in a modification of the tenth embodiment according to the invention. In FIG. 46, ROM cache controller 512 includes a program counter 545 and a memory access control circuit 530. Memory access controller 530 produces an address for the ROM region (501) according to the count of program counter 545, and reads the data from the ROM region. Further, memory access control circuit 530 stores the data thus read in ROM cache 510, and successively outputs stored information (instructions) of ROM cache 510 according to the access request supplied from ROM port 511.

The ROM regions (501) stores the program instruction and the boot instructions. In executing a program or boot instructions, instructions are executed sequentially. Thus, the instructions are successively executed according to the count of program counter 545 unless interruption or the like occurs. Therefore, when storing the instructions in the ROM region (501), it is not particularly required to determine the cache hit/miss. Accordingly, the ROM region (501, see FIG. 40) is accessed starting at the initial address of the instruction sequence that is set in program counter 545, and the instructions of the cache block size are transferred to ROM cache 510. From ROM cache 510, the stored instructions are successively read and transferred to the operational processing circuit.

Figure 47:
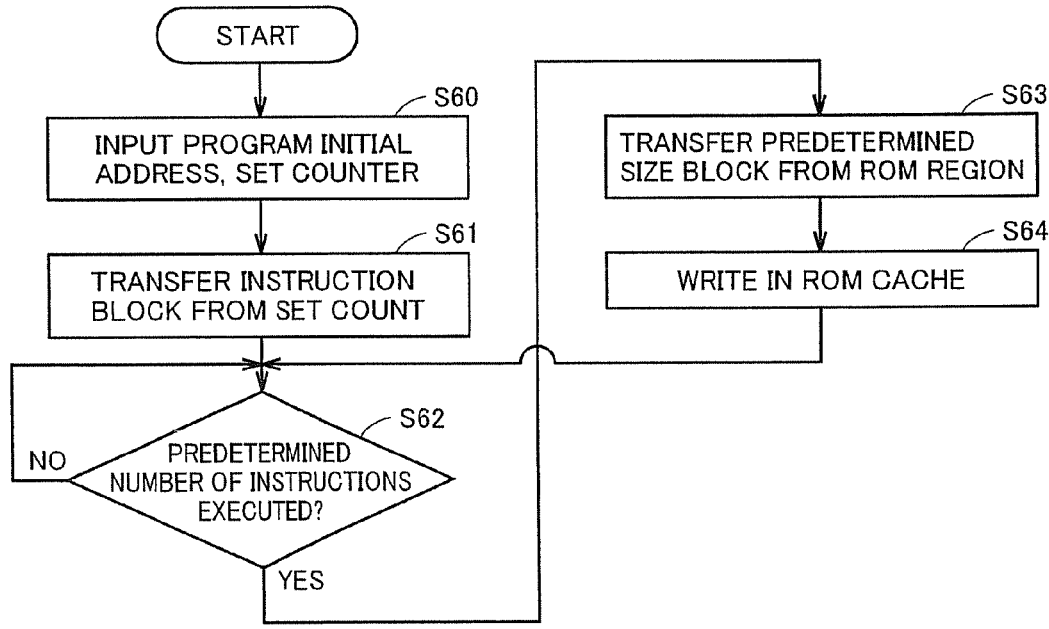
FIG. 47 is a flowchart representing an operation of the ROM cache controller shown in FIG. 46.

FIG. 47 is a flowchart representing the operations of ROM cache controller 512 shown in FIG. 46. Referring to FIG. 47, description will now be given on the operations of ROM cache controller 512 shown in FIG. 46.

When executing the program, the operational processing circuit first applies the initial (first) address of the program together with the access request via ROM port 511. Memory access control circuit 530 sets the received program initial address in program counter 545 (step S60). According to the initial address set in program counter 545, memory access control circuit 530 accesses the ROM region (501) when the internal data bus (503) is not being used, reads the instructions of the cache block size into ROM cache 510 (step S61). After the instructions of the cache block size are transferred, the count of program counter 545 is updated by a value corresponding to the instruction address of the cache block size.

ROM cache 510 is substantially an FIFO (First-In First-Out) memory. After the instructions are transferred from the ROM region, memory access control circuit 530 successively reads the stored instructions starting at the initial address in ROM cache 510, and transfers the read out instructions to the operational processing circuit via ROM port 511. Memory access control circuit 530 repeats the access to the ROM region (501) to read the instruction blocks from the ROM region, and transfers the read out instruction blocks to ROM cache 510 until ROM cache 510 becomes full (step S61).

When the cache instruction blocks are transferred and ROM cache 510 becomes full, the external operational processing circuit successively reads the instructions via ROM port 511, and executes them. When reading the instructions, memory access control circuit 530 successively updates the read address in ROM cache 510, and monitors the update of the read address in the ROM cache for determining whether the number of instructions read from ROM cache 510 to ROM port 511 reaches a predetermined value (e.g., corresponding to the cache block size) or not.

When memory access control circuit 530 determines that the predetermined number (corresponding to the cache block size) of instructions are executed, it makes new access to the ROM region (501) to read the next instruction block, and writes the instruction block in the region of ROM cache 510 where the instructions already used are stored (steps S63 and S64).

ROM cache 510, which is essentially an FIFO (First-In First-Out) memory, successively updates the read and write addresses. When ROM cache 510 is formed of the MRAM, the address of ROM cache 510 is updated merely using a read address counter and a write address counter. In this case, the cache block size of the instructions is larger than the bit width of the instruction transferred to the operational processing circuit via ROM port 511, and therefore, the size of the write block data to be written in ROM cache 510 is larger than the bit width of the instruction read out to ROM port 511. When ROM cache 510 is formed of the MRAM, the write column select gate is separately provided from the read column select gate, and therefore, the difference between the write block size and the cache instruction bit width of different values can be readily accommodated for (similarly to the write-through). When ROM cache 510 is formed of the SRAM, the two-port configuration having separate write and read paths can be used similarly to a general FIFO, whereby the write data block size and the bit width of the read instruction of different values can be readily handled. By employing the write column address and the read address that differ in valid bit number from each other, the bit width of the instruction read from ROM cache 510 can be smaller than the size of the instruction block written in ROM cache 510 (a predetermined number of low-order bits of the write column address are set to a degenerated state).

According to the construction shown in FIG. 46, when the boot information is executed at the time of system boot-up, a power-on detection signal or the like initializes program counter 545 to set an initial (start) address of the boot region. Then, memory access control circuit 530 accesses the ROM region (501) according to the address set in program counter 545, successively reads required boot information and stored the read out boot information in ROM cache 510.

According to the constructions of ROM cache 510 and ROM cache controller 512 shown in FIG. 46, when a branch instruction is executed in an instruction execution sequence, for example, ROM cache 510 can store the instruction block to be executed after the branch is taken and the instruction to be executed when the branch is not taken. ROM cache 510 sets the read address depending on the taken/not-taken of the branch. Therefore, even when the instruction is executed based on the branch predictive method for executing instructions with the branch direction predicted and the branch prediction is missed, a penalty for the prediction miss can be reduced, and a next instruction can be immediately read to ROM port 511. This can simplify the construction of the branch prediction target buffer (BTB) used in the cache system of the branch prediction scheme.

As described above, the nonvolatile RAM includes the ROM and RAM regions, the main memory has a variable size, the cache of a small storage capacity is arranged for each of the ROM and RAM regions and therefore the fast operational processing is implemented. Further, even when a cache miss occurs on one port, required instruction/data can be transferred to the other port from the cache, and the penalty for the cache miss can be reduced.

When the MRAM is used as the main storage and writing of data is executed in the copy-back scheme at the time of the cache write miss, the number of writing of the MRAM is reduced, and the current consumption is reduced.

Figure 48:
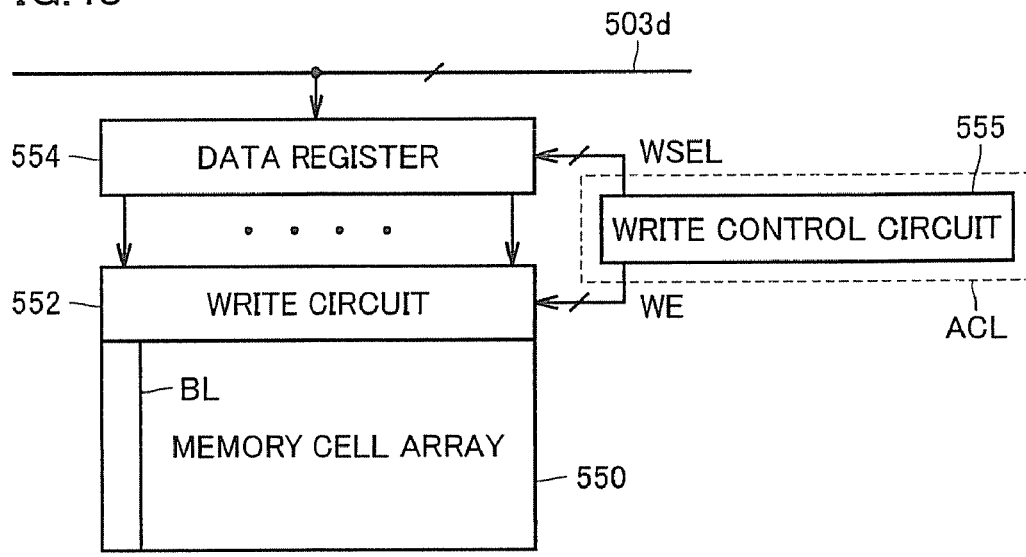
FIG. 48 schematically shows a construction of a data write portion of the memory mat in the tenth embodiment of the invention.

FIG. 48 schematically shows a construction of a data write portion of the memory mat of the nonvolatile RAM used in the cache system for the copy-back scheme. In FIG. 48, memory mat MAT# includes a memory cell array 550 having MRAM cells arranged in rows and columns, and a write circuit 552 writing data in a selected memory cell of memory cell array 550. Write circuit 552 includes both a write column select circuit and a write drive circuit.

A data register 554 is provided for write circuit 552 for latching in parallel the data bits transmitted via an internal data bus 503*d*. A write control circuit 555 is arranged in an access controller ACL for controlling the data latch operation of data register 554 and the write operation of write circuit 552. Access controller ACL implements substantially the same functions as the access controllers in the first to seventh embodiments already described, and controls the execution of the data writing according to the write access request when the write access to corresponding memory mat MAT# is made.

Figure 49:
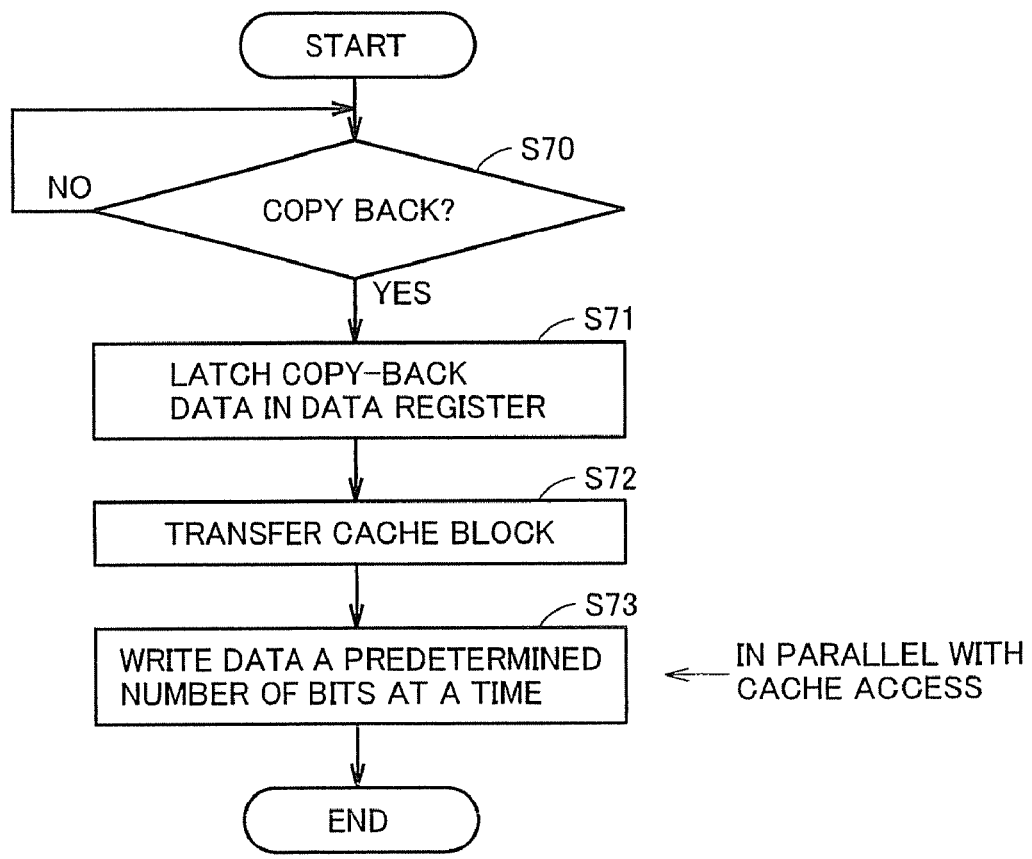
FIG. 49 is a flowchart representing an operation in data writing of the memory mat shown in FIG. 48.

FIG. 49 is a flow chart representing a write operation control sequence of write control circuit 555 shown in FIG. 48. Referring to FIG. 49, description will now be given on the operations for data writing by the construction shown in FIG. 48.

The data of the cache block size is returned back via an internal data bus 503*d* in the copy-back scheme.

First, the corresponding cache controller issues the access request. According to this access request, it is determined whether the copy-back is to be executed or not (step S70). In the cache system of the copy-back scheme, it can be determined that the copy-back operation is to be executed when the data write access is requested as the access request.

When the copy back data write is requested, access controller ACL determines according to the transfer address received from the cache controller whether corresponding memory mat MAT# is designated or not. For writing the copy-back data in corresponding memory mat MAT#, write control circuit 555 produces a latch control signal WSEL to activate data register 554, and stores in parallel the copy-back data that is returned back via internal data bus 503*d* (step S71). After data register 554 latches the copy-back data, write control circuit 555 transmits the signal indicative of the completion of data latch to the corresponding cache controller via the path (not shown).

The cache controller operates in response to the write completion indicating signal returned back to the addresses (tag and set addresses) of the data block including the access-requested data. The memory mat to be accessed is selected according to the transferred address, and the corresponding access controller reads the addressed data block, and returns the data via the internal read data (not shown) in step S72. The memory mat storing the access-requested data is the memory mat storing the copy-back data or another memory mat. In any of the cases, data register 554 stores the copy-back data block, and the reading and returning back of the data block access-requested by the operational processing circuit can be executed without any influence of the returning back of the copy-back data.

Write control circuit 555 controls data register 554 to latch the data, and to transfer the data from data register 554 to write circuit 552 a predetermined number of bits at a time when the data read request is not applied to corresponding memory mat MAT# after latching the address of the copy-back data. Write circuit 552 successively activates circuit groups each including a predetermined number of write drive circuits according to a write instructing signal WE, and executes the data writing (step S73).

In this write operation, when memory cell array 550 is the MRAM, the digit line is selected, and the bit line is selected by the write column select gate. When the digit line is arranged commonly to the write data of the cache block size, and bit lines BL in the selected columns correspond to the different data bits, the units each including the predetermined number of write drive circuits are successively activated in write circuit 552 while maintaining digit line DL in the selected state. The write column select gates are configured to couple the bit lines of the cache block size in parallel to the different internal write data lines, respectively according to one write column select line. The write column select gates of the cache block size are held in the selected state, and the write drive circuits are successively activated to write the data bits in a unit of the predetermined number.

When the I/O blocks are arranged in memory cell array 550, the bit lines corresponding to the different I/O blocks (data bits) are selected in parallel, and are coupled to the corresponding internal write data lines, respectively. The write drive circuits are arranged corresponding to the respective internal write data lines, and are successively activated by the predetermined number of write drive circuits. The construction for activating the write drive circuits in a unit of the predetermined number can be readily achieved by successively shifting active write instructing signal WE, e.g., with a shift register and successively applying the active write instruction signal (write enable signal) to the predetermined number of write drive circuits.

Data register 554 may transfer the storage data to the corresponding active write drive circuits a predetermined number of bits at a time (according to a control signal WSEL).

In the operation of writing this copy-back data block in memory mat MAT#, the data is successively written a predetermined number of bits at a time, whereby the write current can be dispersed in the MRAM used as the main memory, and the peak current in the write operation can be reduced.

In the operation of writing the copy-back block data, the data writing may be performed by selecting in parallel a plurality of memory mats in the RAM region. In this case the memory mats are successively activated, and the data writing is performed in each memory mat a predetermined number of bits at a time. In one memory mat, when write control circuit 555 performs the data writing, it successively activates the write drive circuit activating signals produced based on the write instructing signal, and the write drive circuit activating signal is transferred to an adjacent memory mat when corresponding write circuit 552 completes the data writing. Thereby, it is possible to achieve the construction in which the data writing performed a predetermined number of bits at a time is successively performed for each memory mat on the plurality of memory mats.

When the data writing of the return back data block is performed a predetermined number of bits at a time, a plurality of cycles are required for writing all the data contained in the cache block. However, the access-requested cache block has been transferred to the corresponding cache. The cache exploits the locality of the data access, and there is a high probability that the access to the cache is performed continuously (i.e., cache hit continues). Therefore, by successively executing the writing of the copy-back data in the nonvolatile RAM in parallel with the cache access cycles, it is possible to conceal the writing of data in the RAM region by the cache access cycles, and it is possible to suppress the increase in cache cycle.

As described above, the nonvolatile RAM having the ROM and RAM regions of the variable sizes is employed as the main storage, the caches are arranged for the ROM and RAM regions, respectively, and these caches can be accessed in parallel. When cache miss occurs in one port, the access can be performed via the other port, and the penalty upon the cache miss can be smaller than the cache miss penalty in the construction of the single-port cache.

[First Modification]

Figure 50:
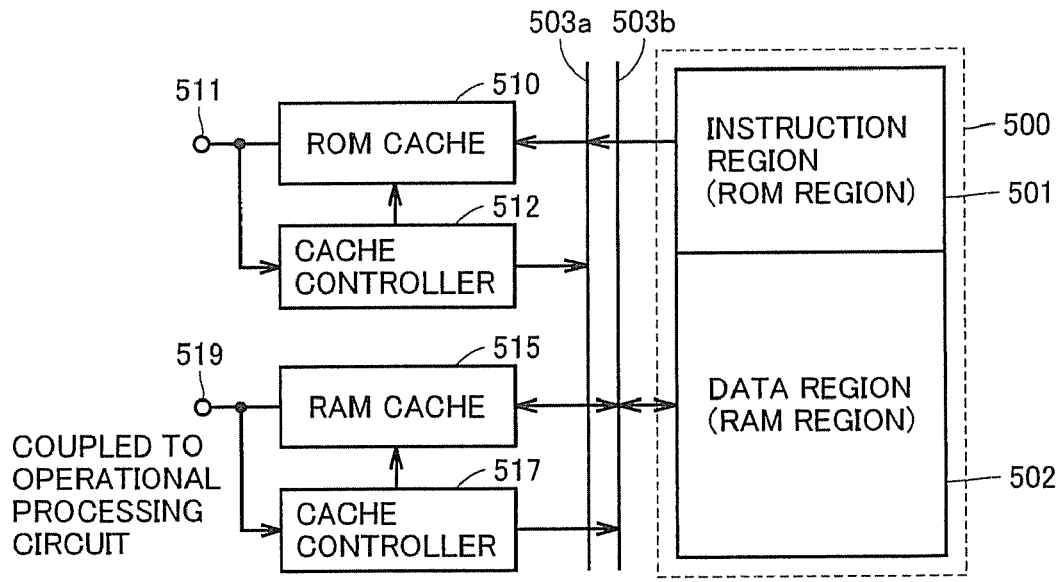
FIG. 50 schematically shows a construction of a memory system of a modification of the tenth embodiment of the invention.

FIG. 50 schematically shows a construction of a cache system according to a first modification of the tenth embodiment of the invention. The cache system shown in FIG. 50 differs in construction from the cache system shown in FIG. 40 in the following points. Specifically, the internal bus is divided into ROM and RAM buses 503a and 503b. In nonvolatile RAM 500, instruction region (ROM region) 501 is coupled to internal ROM bus 503a, and data region (RAM region) 502 is coupled to internal RAM bus 503b. Cache controllers 512 and 517 transfer the control signals to internal buses 503a and 503b, respectively. ROM cache 510 receives the data from internal ROM bus 503a, and RAM cache 515 bidirectionally transfers the data to and from internal RAM bus 503b.

Other constructions of the cache system shown in FIG. 50 are the same as those of the cache system shown in FIG. 40. Corresponding portions are allotted the same reference numerals.

In the construction shown in FIG. 50, ROM and RAM buses 503a and 503b separate from and independent of each other are internally arranged. Therefore, when the cache miss occurs, cache controllers 512 and 517 are not required to determine whether the internal bus is being used or not, and can perform the data transfer to/from instruction region (ROM region) 501 and data region (RAM region) 502 without waiting for the unused state of the internal bus. Therefore, the penalty (wait time) upon the cache miss can be further reduced. The operations of cache controllers 512 and 517 are the same as those in the operation flowchart represented in FIGS. 42 to 44 already described, except for the step of determining the usage state of the internal bus.

According to the construction of the first modification, since the ROM and RAM buses separate from and independent of each other are internally arranged, the cache miss penalty can be reduced and the fast cache system can be achieved.

The construction of allocating the memory mats to the instruction region and the data region as well as the construction of controlling the bus connection may be the same as those in the first to fourth and seventh embodiments already described.

Second Embodiment

Figure 51:
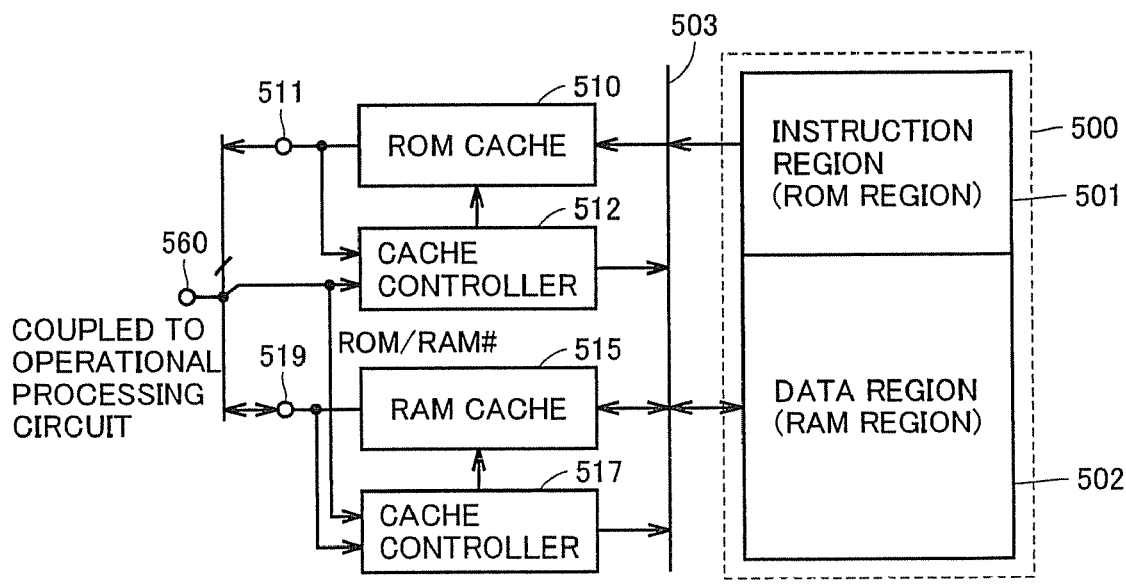
FIG. 51 schematically shows a memory system of a second modification of the tenth embodiment of the invention.

FIG. 51 shows a construction of a second modification of the cache system according to the tenth embodiment of the invention. In the cache system shown in FIG. 51, ROM and RAM ports 511 and 519 shown in FIG. 40 are commonly coupled to a memory port 560. Therefore, the operational processing circuit outside the cache is a single-port processor or a single-port microcontroller. Other constructions of the cache system shown in FIG. 51 are the same as those of the cache system shown in FIG. 40 except for that port attribute designating signal ROM/RAM# is used as the access instructing signal. Corresponding portions are allotted the same reference numerals, and description thereof is not repeated.

In the cache system shown in FIG. 51, cache controllers 512 and 517 determine according to port attribute designating signal ROM/RAM# received from port 560 whether the requests for access to cache controllers 512 and 517 are issued or not, respectively. Other operations for cache access are the same as those of the cache system shown in FIG. 40. Therefore, even in the operational processing circuit formed of the single-port processor or microcontroller, the instructions and data can be transferred fast.

When ROM and RAM caches 510 and 515 can operate at half the cycle time of the external operational processing circuit, cache controllers 512 and 517 may be configured to perform the cache determination in the first and second halves of the operating cycle of the operational processing circuit, respectively. In this construction, it is not particularly necessary to supply port attribute designating signal ROM/RAM# from port 560, and access instructing signal ACT or EN# is applied at the time of access to the cache.

For the single-port operational processing circuit, the two-port construction is employed in the cache system, and the caches are arranged for the instruction and the data, respectively. The instruction/data can be transferred fast to execute the operational processing, resulting in improved system performance.

[Third Modification]

Figure 52:
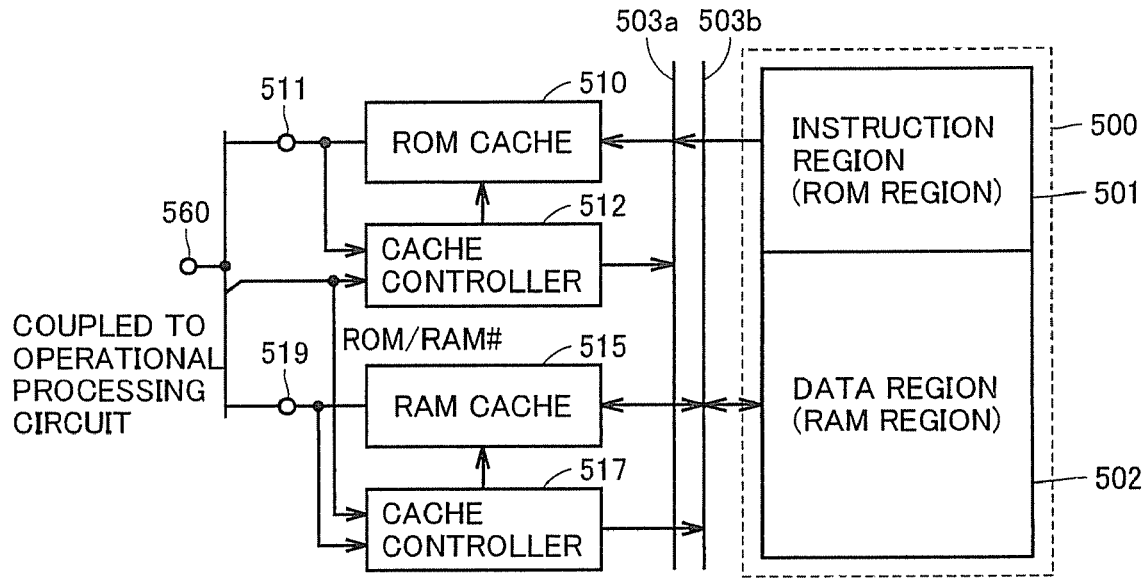
FIG. 52 schematically shows a construction of a third modification of a memory system according to the tenth embodiment of the invention.

FIG. 52 schematically shows a construction of a cache system of a third modification of the tenth embodiment according to the invention. The cache system shown in FIG. 52 differs from the cache system shown in FIG. 50 in the following constructions. ROM and RAM ports 511 and 519 are commonly coupled to memory port 560. Via this memory port 560, the operational processing circuit supplies port attribute designating signal ROM/RAM# to cache controllers 512 and 517. Other constructions of the cache system shown information 52 are the same as those of the cache system shown in FIG. 50. Corresponding portions are allotted the same reference numerals, and description thereof is not repeated.

In the construction of the cache system shown in FIG. 52, even when the instruction/data are transferred via one memory port 560, ROM and RAM caches 510 and 515 can transfer the data/instruction via internal ROM bus 503a and internal RAM bus 503b, and the penalty upon cache miss can be reduced.

By utilizing port attribute designating signal ROM/RAM#, the cache controller in the NOP state can be reliably set to the NOP state when the access to data region (RAM region) 502 is successively performed in one cycle of the operational processing circuit, or when the access to instruction region (ROM region) 501 is successively performed. Therefore, the power consumption can be reduced.

According to the construction of the cache system shown in FIG. 52, when the operation cycle time of ROM and RAM caches 510 and 515 does not exceed half the operation cycle time of the external operational processing circuit, it is not particularly necessary to supply port attribute designating signal ROM/RAM#, and accesses may be made to ROM and RAM caches 510 and 515 in the first and second halves of the operation cycle, respectively.

According to the tenth embodiment of the invention, as described above, the cache memories are provided for the nonvolatile RAM having the instruction region (ROM region) and the data region (RAM region) of variable sizes, respectively. Therefore, the cache miss penalty can be reduced, and the cache system of small cache miss penalty can be achieved.

In the single-memory-port construction (FIG. 51) having the internal bus shared between the ROM and RAM caches, while the ROM cache is in the wait state due to a cache miss, the RAM cache can be accessed, and the required RAM data can be transferred without waiting for the RAM data when the RAM cache is in the hit state. Thus, the data transfer efficiency can be improved.

Eleventh Embodiment

Figure 53:
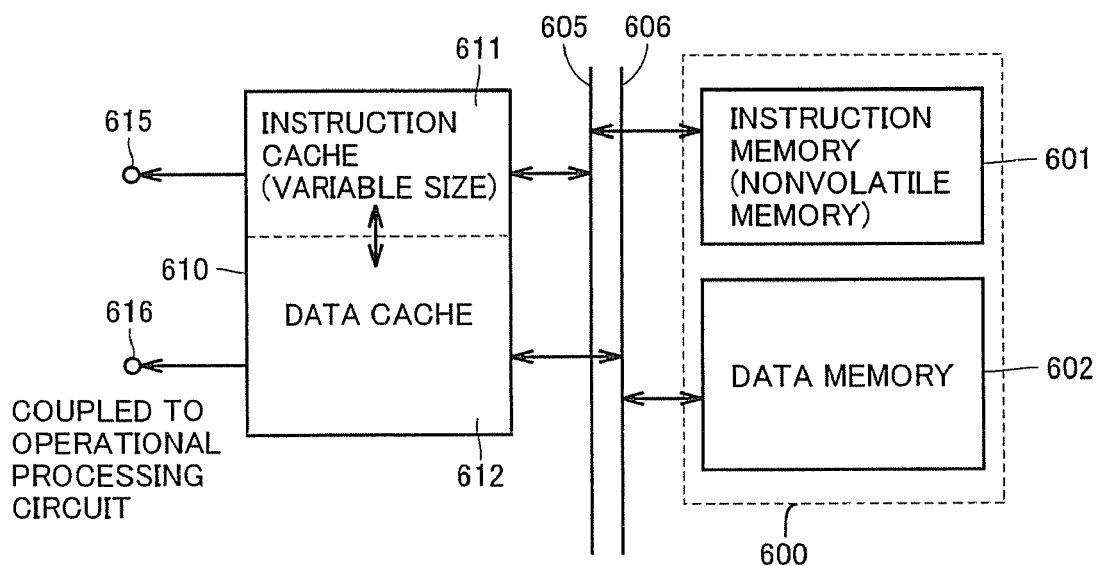
FIG. 53 schematically shows a construction of a memory system according to an eleventh embodiment of the invention.

FIG. 53 schematically shows a construction of a cache system according to an eleventh embodiment of the invention. In FIG. 53, the cache system includes a main memory 600, and a cache memory 61 for caching the storage data/information of main memory 600.

Main memory 600 includes an instruction memory 601 storing a non-rewritable instruction, and a data memory 602 storing rewritable data. Instruction memory 601 is implemented by a flash memory or a nonvolatile memory such as an MRAM or FeRAM. Data memory 602 is formed of a random access memory such as a DRAM, an SRAM, a flash memory, an MRAM or the like depending on the construction and performance of the system. Instruction memory 601 is coupled to an internal bus 605, and data memory 602 is coupled to an internal bus 606.

Cache memory 610 includes an instruction cache 611 and a data cache 612. Cache memory 610 is formed of a nonvolatile RAM similarly to the constructions of the first to tenth embodiments already described. Each of instruction cache 611 and data cache 612 has a variable size, and is implemented by memory mats of the number depending on the system construction.

Constructions for connection between instruction and data caches 611 and 612 and internal buses 605 and 606 are substantially the same as those in the first to fourth, seventh and tenth embodiments already described. However, it is necessary to transfer data from instruction memory 601 into instruction cache 611, and the region of instruction cache 611 for such storage of instruction memory data is rewritable. The data rewriting is inhibited in nonvolatile instruction memory 601.

Figure 54:
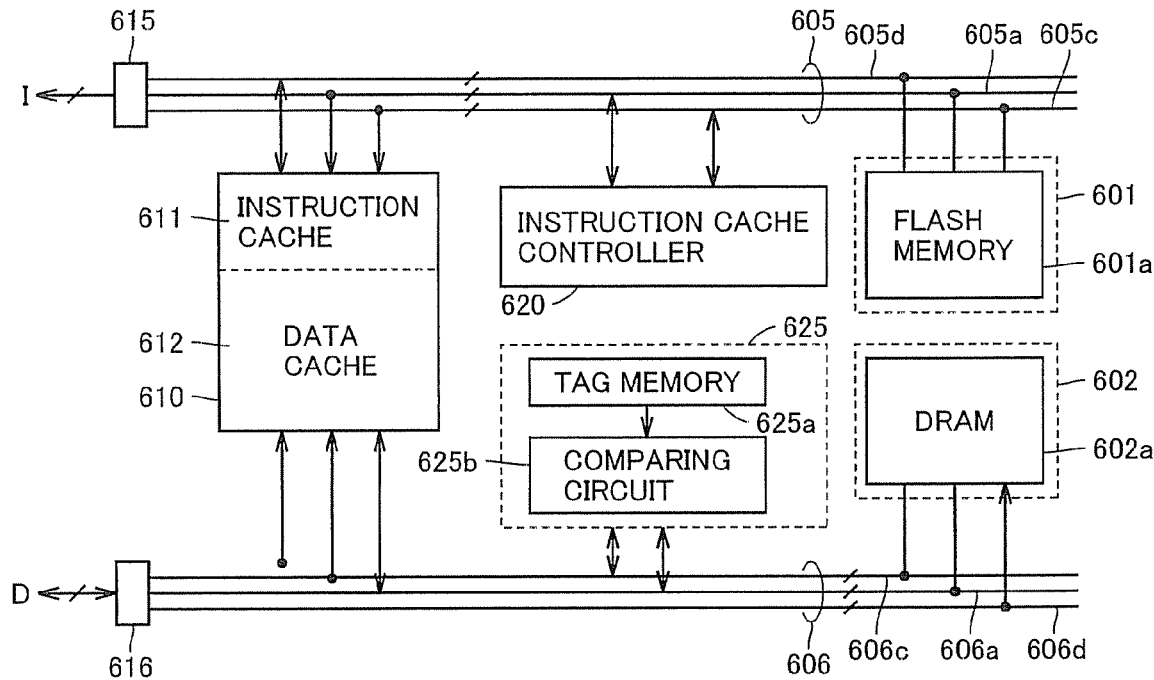
FIG. 54 shows more specifically the construction of the memory system shown in FIG. 53.

FIG. 54 shows more specifically the construction of the cache system shown in FIG. 53. In FIG. 54, a ROM port 615 is coupled to internal ROM bus 605. Internal ROM bus 605 includes a data bus 605d, an address bus 605a and a control bus 605c. These data bus 605d, address bus 605a and control bus 605c are coupled to instruction cache 611, and are also coupled to instruction memory 601 formed of, e.g., a flash memory 601a.

Internal ROM bus 605 is further coupled to an instruction cache controller 620 for controlling the access to instruction cache 611. Instruction cache controller 620 is coupled to address bus 605a and control bus 605c.

Internal bus 606 coupled to a RAM port 616 includes a control bus 606c, an address bus 606a and a data bus 606d. Data cache 612 is coupled to these control bus 606c, address bus 606a and data bus 606d.

Data memory 602 is formed of, e.g., a DRAM (Dynamic Random Access Memory) 602a. DRAM 602a is coupled to control bus 606c, address bus 606a and data bus 606d. A data cache controller 625 is arranged for controlling the access to data cache 612. As components in data cache controller 625, FIG. 54 representatively shows a tag memory 625a for storing the tag addresses, and a comparing circuit 625b for comparing an applied tag address with the addresses of tag memory 625a.

Comparing circuit 625b transmits a result of the comparison onto control bus 606c for controlling the access to data cache 612. The number of tag addresses stored in tag memory 625a varies depending on the size of data cache 612 (because the number of the cache sets varies). Therefore, tag memory 625a has the capacity corresponding to the maximum number of the sets that are available as data cache 612 (in the case where the cache system of the set associative scheme is constructed). When data cache 612 has a storage capacity smaller than the possible maximum capacity of data cache 612, a region storing the sets removed from the maximum set number is unused in tag memory 625a. Thus, only the sets corresponding to the actually used capacity of data cache 612 are used, and the set regions other than the above are unused. This achieves the variable size of data cache 612 without changing the construction of tag memory 625a.

Instruction cache controller 620 is configured employing substantially the same construction as cache controller 512 shown in FIG. 46 because instruction cache 611 functions as a so-called instruction buffer. A memory access control circuit (circuit 530 in FIG. 46) included in instruction cache controller 620 stores the initial and final values of the addresses of the region used as the instruction cache of cache memory 610. Program counter 545 shown in FIG. 46 is not required to change its number of bits, and its count is set according to the instruction address supplied from the external operational processing circuit. In the instruction access operation, the reading and storing of instructions are performed cyclically within the address region set in instruction cache 611 while successively updating the addresses.

Since instruction cache controller 620 is configured employing substantially the same construction as cache controller 512 shown in FIG. 46, the cache access to instruction cache 611 can be performed without changing the internal circuit construction of the cache controller even when the capacity of instruction cache 611 changes and thus the address region changes. In this construction, the operation of instruction cache controller 620 controlling the access to instruction cache 611 is the same as the control sequence illustrated in FIG. 47. When the access to instruction cache 611 is to be performed, instruction cache controller 620 supplies an instruction for data reading together with the read address to instruction cache 611 via control bus 605c, and the cache data (I) is read from instruction cache 611 to data bus 605d. It is assumed that a cache miss does not occur in instruction cache 611, and instruction cache 611 does not return the instructions back to instruction memory 601 (flash memory 601a).

When a predetermined number of instructions are read from instruction cache 611, instruction cache controller 620 accesses flash memory 601a via address bus 605a and control bus 605c, reads the corresponding instructions from flash memory 601a onto data bus 605d and writes the read out instructions in the corresponding region of instruction cache 611 (i.e., region where the consumed instructions are stored). Instruction cache 611 operates as an FIFO memory for reading and storing the instructions.

In the operation of accessing data cache 612, data cache controller 625 controls the access. In the operation of accessing the data in data cache 612, data cache controller 625 supplies a hit signal sent from comparing circuit 625b to control bus 606c, and reads the data from data cache 612, using the in-block address on address bus 606a and the cache hit signal group.

When a cache miss occurs, external access to data cache 612 is stopped, and data cache controller 625 accesses DRAM 602a via control bus 606c, address bus 606a and data bus 606d, and transfers the data block including necessary data to data cache 612. When the data block is transferred from DRAM 602a to data cache 612, the return of data from data cache 612 back to the DRAM is executed according to the copy-back scheme or the write-through scheme in the same manner as that in the tenth embodiment already described.

In the operation of using instruction cache controller 620 and data cache controller 625 shown in FIG. 54, the bit width of the data transferred via internal data buses 605*d* and 606*d* determines the block size of the cache. Therefore, in the operation of externally supplying the instruction/data from the cache via ports 615 and 616, the required data is selected and transferred in these ports 615 and 616 according to the in-block address of the cache address. In the operation of internally transferring the write data from RAM port 616, the write data is transferred to the data bus lines in the bit positions specified by the in-block address of RAM data bus 606*d*.

Figure 55:
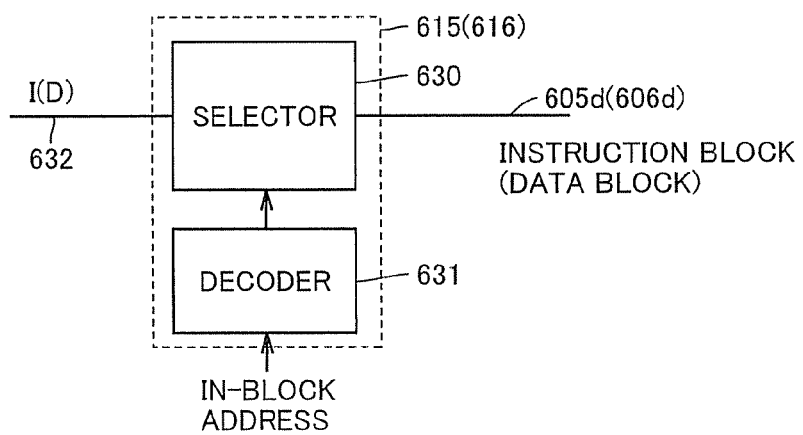
FIG. 55 shows an example of a construction of a data selecting portion of the port shown in FIG. 54.

FIG. 55 shows an example of a construction of a circuit that converts a data bit width between the data required by the operational processing circuit and the instruction/data of the cache block size.

FIG. 55 shows a construction of instruction port (RAM port) 615, and numerals in parentheses indicate components of port 616.

In FIG. 55, ROM port 615 (or instruction port 616) includes a decoder 631 for decoding the in-block address, and a selector 630 for selecting instruction I (or data D) transferred via one port bus 632 according to the output signal of decoder 631. In the operation of transferring the instruction block (or data block) of one cache block size via internal data bus 605*d* (or 606*d*), selector 630 can accurately select the corresponding address position in the instruction block (or data block), and can transfer externally applied instruction I (or data D) between external port bus 632 and internal data bus 605*d* (or 606*d*).

Therefore, even when the cache block size is made as large as possible for reducing the penalty upon the cache miss, the bus width conversion is performed in ports 615 and 616, and internal data buses 605*d* and 606*d* can reliably transfers the access-requested data or instruction between the caches 611 and 612 and the operational processing circuit.

[Modification]

When DRAM 602*a* is used as data memory 602, it is necessary to refresh the stored data in DRAM 602*a* at predetermined cycles.

The data cache controller 625 controls this refreshing of DRAM 602*a* so that the refreshing operation of the DRAM may not affect the cache system.

Figure 56:
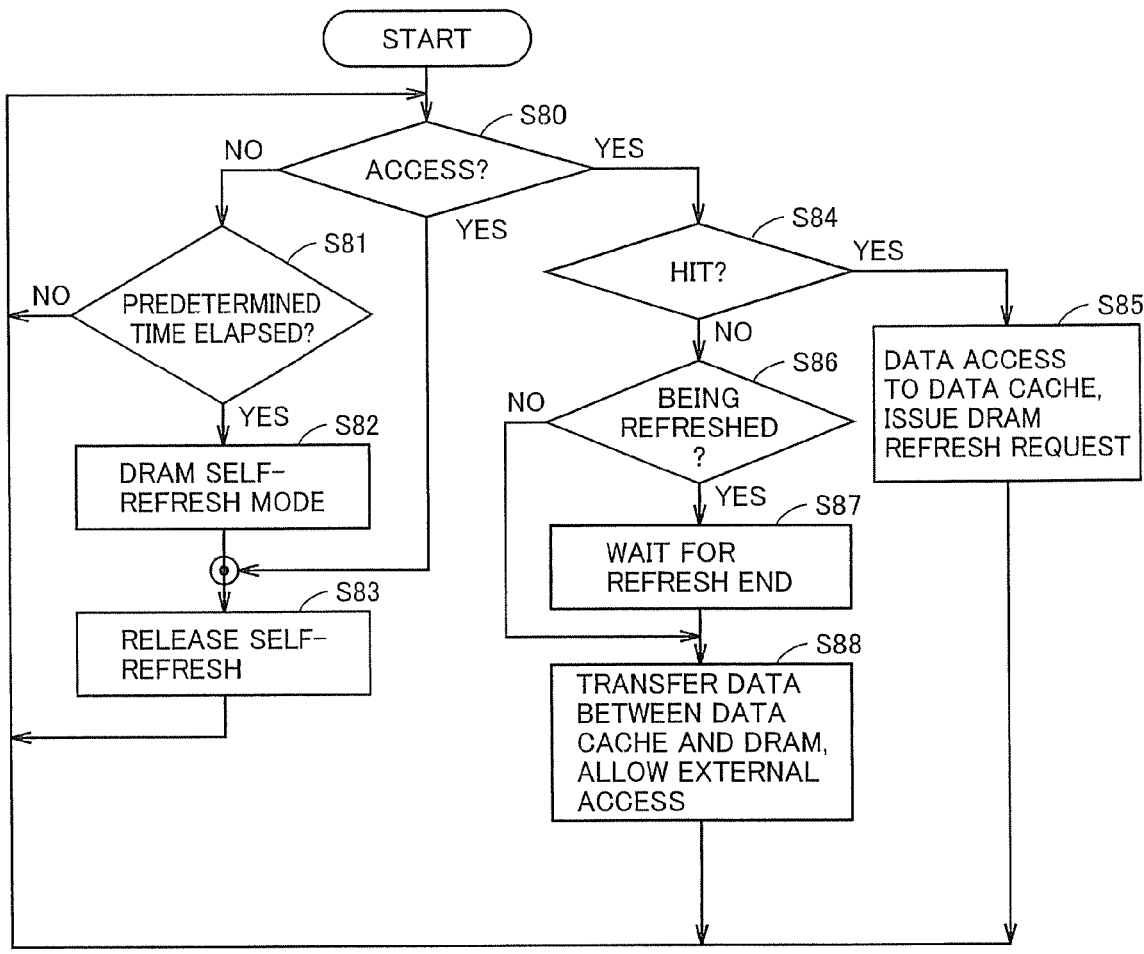
FIG. 56 is a flowchart representing an operation of a modification of the memory system shown in FIG. 54.

FIG. 56 is a flowchart representing an example of a DRAM refresh control sequence of the modification of the eleventh embodiment according to the invention. Referring to FIGS. 54 and 56, description will now be given on the control operation of the data cache controller in refreshing of the DRAM in the modification of the eleventh embodiment according to the invention.

First, data cache controller 625 determines whether the access request is supplied via data port 616 or not (step S80). When the access request is not supplied via port 616, it is determined whether a predetermined time period elapsed in the access standby state or not (step S81). When the predetermined time period elapsed, data cache controller 625 sets DRAM 602*a* to the self-refresh mode (step S82). In this self-refresh mode, the DRAM executes the refreshing by internally rewriting the storage data at predetermined time intervals. DRAMs include traditionally the construction for executing the refreshing, and such construction for refreshing is utilized for the refresh execution control of DRAM in the present embodiment.

When it is determined in step S80 that the access request is issued and DRAM 602*a* is set to the self-refresh mode in step S82, the self-refresh mode is released (step S83).

When this access request is issued, the data cache controller determines, according to the received tag address and set address, whether the cache hit occurs or not (step S84). When the cache hit occurs, the access target data in data cache 612 is accessed. When the cache hit occurs, the refresh request is issued to the DRAM as the DRAM exits the self-refresh mode. DRAM 602*a* internally executes the refresh according to this issued refresh request. This refresh is known as a CBR refresh, and the refresh address is internally produced according to the refresh request, and the refresh is executed once.

When it is determined in step S84 that the cache miss occurs, it is determined whether DRAM 602*a* is being refreshed or not (step S86). When the self-refresh mode is released and the DRAM is performing the self-refresh mode releasing operation, or when the refresh is being performed in response to the refresh request issued in step S85, access to the DRAM is inhibited for preventing destruction of the refresh data.

When it is determined that DRAM 602*a* is under refreshing (including the period under self-refresh exiting), the access is delayed until the refresh is fully completed, and then the access to DRAM 602*a* is allowed (step S87). When DRAM 602*a* is not under refreshing and is in the access standby state, data cache controller 625 accesses DRAM 602*a*, reads the access-requested data from DRAM 602*a*, transfers the target data to data cache 612 and externally issues access allowance.

For transferring data to the data cache from the DRAM, similar operations are performed for both the access requests of the read access for data reading and the write access for data writing.

The refreshing is performed in the DRAM when the DRAM is not being accessed. Accordingly, even when the refreshing temporarily stops in the DRAM due to a cache miss, the refreshing of the storage data of DRAM memory cells can be sufficiently executed within the predetermined refresh period, and the reliability of the DRAM data is maintained.

The returning of the data block from the data cache back to the DRAM can be performed in different manners for the write-through scheme and for the copy-back scheme, respectively. In the copy-back scheme, after the copy-back operation is performed by returning the old data block selected according to, e.g., the LRU logic back to the DRAM in step S88, the access-requested data is transferred from the DRAM to the data cache. In the write-through scheme, when the cache write hit occurs in the operation of writing the cache data, the DRAM 602*a* has completed the refresh operation according to the write access request, and the externally applied write data is written in data cache 612, and is also written at the corresponding location of the DRAM. When the cache miss occurs, the refresh is completed according to the access request in any of the write and read requests, and the access-requested data block is transferred from DRAM 602 to the data cache.

When controlling the data transfer of DRAM 602*a* in the write-through scheme, the cache block size is different from the bit width of the data bits. In this case, the valid bit widths of the write address and read address are changed in DRAM 602*a*. Also, for writing the data in the DRAM, the address designation is performed with all address bits made valid. For transferring the data of the data cache block size when a cache miss occurs, the address signal for the data of this cache block size is set valid. According to the cache block size, the predetermined number of low-order bits of the address signal is set to the degenerated state (both address bits Ai and /Ai are in the selected state of "1") in the data read operation, to made data bit width different between the data reading and the data writing.

As described above, even if DRAM 602a is used as the data main memory, the refresh operation of the DRAM is executed in parallel with the accessing to the data cache. Therefore, the DRAM refresh operation does not exert any adverse influence on the access via data port 616, and the data transfer can be performed efficiently by effectively using the cache system.

By employing flash memory 601a for instruction cache 611, the data and instruction can be accessed and read fast.

Even in the construction using the MRAM as instruction cache 611, the number of the allowed number of times of rewriting of the MRAM is much larger than that of the flash memory, and it is possible to reduce the probability that an error occurs in the cache data. Flash memory 601a stores the boot program or boot information, and transfers the storage information to instruction cache 611, whereby the boot operation can be fast.

In a normal data processing system, program instructions such as basic software (OS) stored in a hard disk are transferred to a data memory for booting up the system. Also, application programs have been installed in the hard disk, and is transferred to the RAM region when processing is to be executed. When the program instructions stored in the hard disk are all written in a data memory, a part of such instructions can be transferred to data cache 612, so that the system can be booted up fast, and the application programs can be executed fast.

Particularly, when the processing system finishes its operations according to an instruction after completion of the operational processing, predetermined initial information and data can be transferred from memory 601a and DRAM 602a to instruction cache 611 and data cache 612, whereby the system can be booted up upon power-up, and required processing can be executed. It is not necessary to wait for completion of transfer of all the required data in the hard disk to the data memory. An instant-on computer can be achieved.

The instructions stored in this instruction memory 601 also includes the boot programs. It is merely required that, according to the boot information, the operational processing circuit, instruction cache controller 620 and data cache controller 625 are initialized, memory 610 is initialized (when initial data and initial program are not transferred at the shut down or the end power up of the power supply system) and the data memory is initialized.

According to the eleventh embodiment of the invention, the flash memory or the MRAM is used for the instruction memory, the discrete memory such as a DRAM is used for the data memory, the caches for the respective memories are formed of the MRAM having the cache size variable.

Thereby, it is possible to configure the cache system having optimum cache sizes corresponding to the system architecture and construction. Further, the fast MRAM is used as the cache memory so that the fast access can be achieved.

In the constructions described so far, the number of ports of the nonvolatile RAM is two, and the number of the ports of the cache system is two. The number of the ports is not restricted to two, and may be three or more. For each of such ports, the same construction as those provided for each of the two-port constructions already described is employed. Thereby, the increase in number of the ports can be easily accommodated for.

The nonvolatile RAM is not restricted to the MRAM or FeRAM, and may be another nonvolatile RAM faster than the flash memory and the DRAM.

The semiconductor integrated circuit device according to the invention can be applied as a memory that is generally used for operational processing circuits, and can also be applied to a system LSI with the memory system and an operational processing circuit integrated together on the same chip. Also, it can be applied as a discrete memory device of a chip separate from a CPU (Central Processing Unit).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first memory,
    a second memory arranged separately from said first memory, and storing information different in attribute from storage information of said first memory,
    a third memory including first and second memory regions each having a plurality of memory cells each nonvolatilely storing information by using characteristics other than a threshold voltage, and arranged corresponding to the first and second memories, each memory region for caching the storage information of a corresponding memory, said first and second memory regions having storage capacities being variable within a storage capacity of said third memory,
    a transfer control circuit for controlling data transfer between said first and second memories and said first and second memory regions, and
    an operational processing circuit executing using the storage information.

2. The semiconductor device according to claim 1, wherein each memory cell includes a magneto-resistive element for storing information.

* * * * *